United States Patent
Yamaguchi et al.

(10) Patent No.: US 9,034,558 B2
(45) Date of Patent: May 19, 2015

(54) ACTINIC-RAY- OR RADIATION-SENSITIVE RESIN COMPOSITION, ACTINIC-RAY- OR RADIATION-SENSITIVE FILM AND METHOD OF FORMING PATTERN

(75) Inventors: Shuhei Yamaguchi, Shizuoka (JP); Akinori Shibuya, Shizuoka (JP); Yusuke Iizuka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 73 days.

(21) Appl. No.: 13/808,489

(22) PCT Filed: Sep. 28, 2011

(86) PCT No.: PCT/JP2011/072905
§ 371 (c)(1),
(2), (4) Date: Jan. 4, 2013

(87) PCT Pub. No.: WO2012/043866
PCT Pub. Date: Apr. 5, 2012

(65) Prior Publication Data
US 2013/0115557 A1    May 9, 2013

(30) Foreign Application Priority Data
Sep. 29, 2010   (JP) .................................. 2010-219515

(51) Int. Cl.
| | | |
|---|---|---|
| G03F 7/004 | (2006.01) | |
| G03F 7/039 | (2006.01) | |
| G03F 7/20 | (2006.01) | |
| C08F 12/20 | (2006.01) | |
| C08F 12/22 | (2006.01) | |
| C08F 12/26 | (2006.01) | |
| C08F 12/30 | (2006.01) | |
| C08F 212/12 | (2006.01) | |
| G03F 7/11 | (2006.01) | |
| C08F 212/14 | (2006.01) | |
| C08F 220/42 | (2006.01) | |
| C08F 220/28 | (2006.01) | |

(52) U.S. Cl.
CPC .............. *G03F 7/004* (2013.01); *G03F 7/0392* (2013.01); *C08F 12/20* (2013.01); *C08F 12/22* (2013.01); *C08F 12/26* (2013.01); *C08F 12/30* (2013.01); *C08F 212/12* (2013.01); *C08F 212/14* (2013.01); *C08F 220/42* (2013.01); *C08F 2220/281* (2013.01); *G03F 7/0045* (2013.01); *G03F 7/0046* (2013.01); *G03F 7/0397* (2013.01); *G03F 7/11* (2013.01); *G03F 7/2041* (2013.01); *Y10S 430/108* (2013.01)

(58) Field of Classification Search
CPC ........ G03F 7/004; G03F 7/039; G03F 7/0392
USPC ..................... 430/270.1, 326, 907
See application file for complete search history.

(56) References Cited

U.S. PATENT DOCUMENTS

| | | |
|---|---|---|
| 2005/0058935 A1 | 3/2005 | Kishimura et al. |
| 2005/0153232 A1 | 7/2005 | Li et al. |
| 2006/0246373 A1 | 11/2006 | Wang |
| 2007/0128555 A1 | 6/2007 | Harada et al. |
| 2007/0160929 A1 | 7/2007 | Hasegawa et al. |
| 2007/0178405 A1 | 8/2007 | Kanda et al. |
| 2008/0305433 A1 | 12/2008 | Kanda et al. |
| 2009/0029290 A1* | 1/2009 | Fukumoto et al. ......... 430/285.1 |
| 2009/0123869 A1 | 5/2009 | Wang |
| 2009/0130592 A1 | 5/2009 | Wang |
| 2009/0186300 A1 | 7/2009 | Furuya et al. |
| 2010/0173245 A1 | 7/2010 | Wang et al. |
| 2010/0297550 A1 | 11/2010 | Wang et al. |
| 2010/0304290 A1 | 12/2010 | Wang et al. |
| 2011/0255069 A1 | 10/2011 | Wang |
| 2012/0115085 A1 | 5/2012 | Kanda et al. |
| 2014/0178818 A1* | 6/2014 | Hatakeyama ............. 430/285.1 |

FOREIGN PATENT DOCUMENTS

| | | | |
|---|---|---|---|
| JP | 2003-241382 | * | 8/2003 |
| JP | 2005-097595 A | | 4/2005 |
| JP | 2005-196209 A | | 7/2005 |
| JP | 2006-309245 A | | 11/2006 |
| JP | 2007-153982 A | | 6/2007 |
| JP | 2007-182488 A | | 7/2007 |
| JP | 2007-304537 A | | 11/2007 |

(Continued)

OTHER PUBLICATIONS

Machine translation of JP 2003-241382, published in Aug. 27, 2003.*

(Continued)

*Primary Examiner* — Anca Eoff
(74) *Attorney, Agent, or Firm* — Sughrue Mion, PLLC

(57) ABSTRACT

Provided is an actinic-ray- or radiation-sensitive resin composition including (A) a compound that when exposed to actinic rays or radiation, generates an acid, (B) a resin that when acted on by an acid, increases its rate of dissolution in an alkali developer, and (C) a hydrophobic resin, wherein the hydrophobic resin (C) contains a repeating unit derived from any of monomers of general formula (1) below.

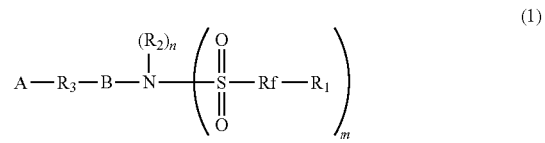

(1)

13 Claims, 1 Drawing Sheet

(56) References Cited

FOREIGN PATENT DOCUMENTS

| | | |
|---|---|---|
| JP | 2008-058878 A | 3/2008 |
| JP | 2008-111103 A | 5/2008 |
| JP | 2009-080482 A | 4/2009 |
| JP | 2009-175363 A | 8/2009 |
| JP | 2010-152343 A | 7/2010 |
| JP | 2010-152344 A | 7/2010 |
| JP | 2010-156958 A | 7/2010 |
| TW | 200903166 A | 1/2009 |
| WO | 2008/099727 A1 | 8/2008 |
| WO | 2009/067354 A1 | 5/2009 |

OTHER PUBLICATIONS

M. Switkes, M. Rotschild-Resolution enhancement of 157 nm lithography by liquid immersion, J. Microlith., Microfab., microsyst, vol. 1, No. 3, Oct. 2002, pp. 1-4.*

Taiwanese Office Action dated Jan. 29, 2015 issued in corresponding application No. 100135283.

\* cited by examiner

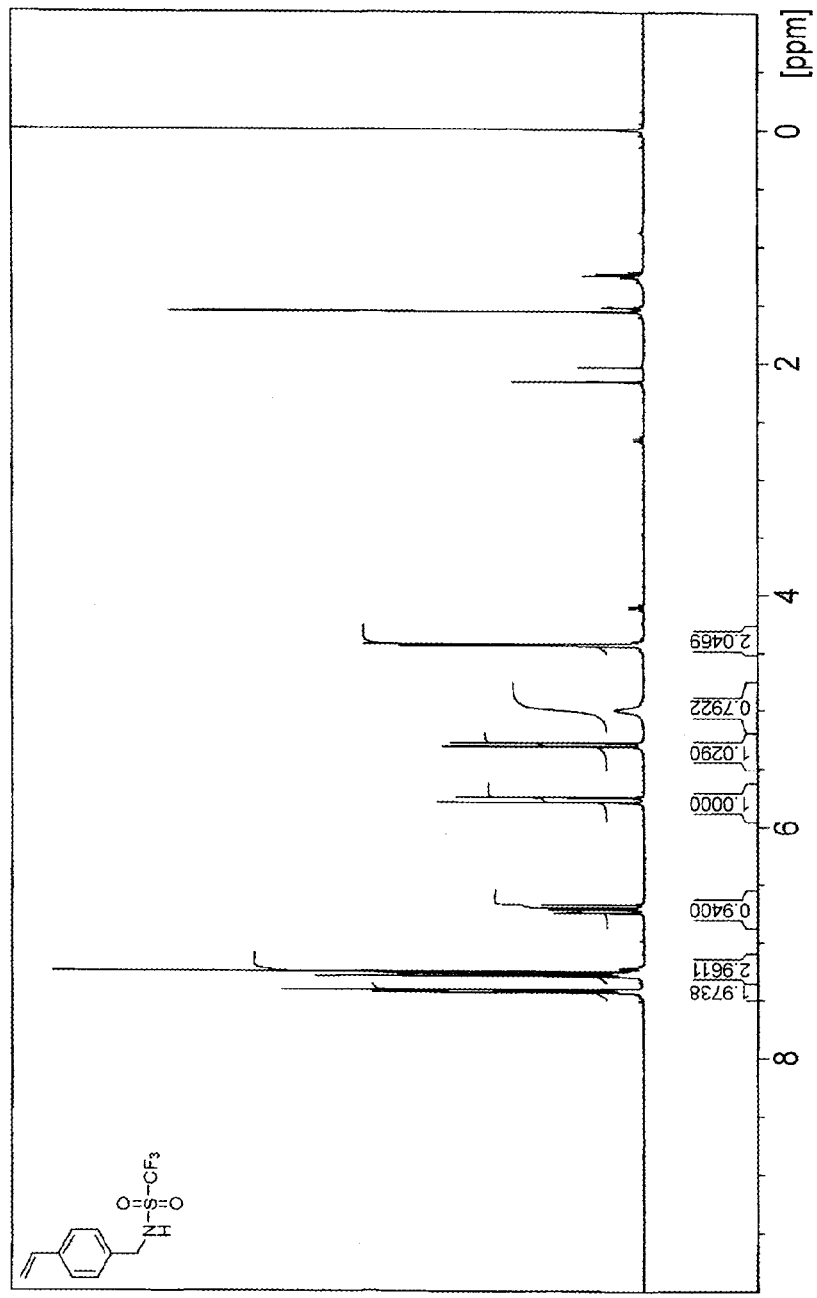

ACTINIC-RAY- OR RADIATION-SENSITIVE RESIN COMPOSITION, ACTINIC-RAY- OR RADIATION-SENSITIVE FILM AND METHOD OF FORMING PATTERN

CROSS REFERENCE TO RELATED APPLICATIONS

This application is a National Stage of International Application No. PCT/JP2011/072905 filed Sep. 28, 2011, claiming priority based on Japanese Patent Application No. 2010-219515, filed Sep. 29, 2010, the contents of all of which are incorporated herein by reference in their entirety.

TECHNICAL FIELD

The present invention relates to an actinic-ray- or radiation-sensitive resin composition, in particular, an actinic-ray- or radiation-sensitive resin composition for use in a lithography operation employed in a semiconductor production process for an IC or the like, production of a circuit board for a liquid crystal, a thermal head or the like and other photofabrication. The present invention also relates to an actinic-ray- or radiation-sensitive film formed from the composition and a method of forming a pattern using the composition. More particularly, the present invention is concerned with an actinic-ray- or radiation-sensitive resin composition that is suitable for exposure using a liquid-immersion projection exposure apparatus in which a far ultraviolet light of wavelength 300 nm or shorter is employed as a light source, and is concerned with an actinic-ray- or radiation-sensitive film formed from the composition and a method of forming a pattern using the composition.

Herein, the term "actinic rays" or "radiation" means, for example, brightline spectra from a mercury lamp, far ultraviolet represented by an excimer laser, extreme ultraviolet (EUV), X-rays and electron beams (EB). Herein, the term "light" means actinic rays or radiation.

Further, herein, the term "exposure to light" unless otherwise specified means not only irradiation with light, such as light from a mercury lamp, far ultraviolet, X-rays or EUV light, but also lithography using particle beams, such as electron beams and ion beams.

BACKGROUND ART

In accordance with the miniaturization of semiconductor elements, the shortening of the wavelength of an exposure light source and the realization of high numerical apertures (high NA) for projector lenses have been promoted. For achieving the enhancement of resolving power by further wavelength shortening, it is heretofore known to employ a method in which the space between a projector lens and a sample is filled with a liquid of high refractive index (hereinafter also referred to as an "immersion liquid"), generally called a liquid-immersion method. The liquid-immersion method is effective in all pattern shapes. Further, this method can be combined with a super-resolution technology, such as a phase shift method or a modified illumination method, now under study.

Since the emergence of the resist for a KrF excimer laser (248 nm), it has been of common practice to, in order to compensate for any sensitivity deterioration caused by light absorption, employ an image forming method through chemical amplification as a resist image forming method. Brief description of a positive image forming method through chemical amplification is given below by way of example.

Upon exposure, an acid generator is decomposed in exposed areas to thereby generate an acid. At the bake after the exposure (Post-Exposure Bake: PEB), the generated acid is used as a reaction catalyst so that an alkali-insoluble group is converted to an alkali-soluble group. Thereafter, alkali development is carried out to thereby remove the exposed areas. Thus, the relevant image forming method is provided.

The resist for an ArF excimer laser (193 nm) utilizing this chemical amplification mechanism is now becoming mainstream. However, in the application of liquid-immersion exposure, the resist has been unsatisfactory in not only the problem of pattern collapse such that a formed line pattern collapses to thereby cause a defect in device production but also the line edge roughness involving roughening of pattern side walls.

Moreover, it is pointed out that when such a chemically amplified resist is applied to liquid-immersion exposure, as the resist layer is brought into contact with the immersion liquid during the exposure, not only would the resist layer suffer a property alteration but also components having an unfavorable influence on the immersion liquid would leach from the resist layer. In this connection, patent references 1 to 4 describe examples of inhibiting the leaching by the addition of a resin containing a silicon atom or a fluorine atom.

Patent reference 5 discloses a resist loaded with a specified polymeric compound containing a fluorine atom and a lactone structure as a resist material being less in a shape change between dry exposure and liquid-immersion exposure to thereby excel in process applicability.

Further, patent references 6 and 7 disclose photoresist compositions each comprising a block copolymer containing a specified repeating unit as a photoresist composition appropriately used in liquid-immersion exposure.

Furthermore in the liquid-immersion exposure process, in the event of exposure using a scan type liquid-immersion exposure machine, the exposure speed is decreased when the immersion liquid fails to move while tracking a moving lens. This would negatively affect productivity. When the immersion liquid is water, it is preferred for the resist film to be hydrophobic from the viewpoint of superiority in water tracking property.

However, even when the liquid-immersion exposure is carried out using the above-mentioned technologies, it is still required to further reduce the occurrence of development defects and scum.

PRIOR ART LITERATURE

Patent Reference

[Patent reference 1] Jpn. Pat. Appln. KOKAI Publication No. (hereinafter referred to as JP-A-) 2006-309245,
[Patent reference 2] JP-A-2007-304537,
[Patent reference 3] JP-A-2007-182488,
[Patent reference 4] JP-A-2007-153982,
[Patent reference 5] JP-A-2008-111103,
[Patent reference 6] JP-A-2010-156958, and
[Patent reference 7] JP-A-2010-152343.

DISCLOSURE OF INVENTION

It is an object of the present invention to provide an actinic-ray- or radiation-sensitive resin composition capable of forming a pattern that is improved in the suppression of development defects and scum and that exhibits favorable immersion-liquid tracking properties in the stage of liquid-immersion exposure. It is another object of the present invention to provide an actinic-ray- or radiation-sensitive film formed from the composition. It is a further object of the present invention to provide a method of forming a pattern using the composition.

The inventors have found that the above objects can be attained by using a hydrophobic resin with a specified structure. The following present invention has been completed on the basis of the finding.

The present invention in its one aspect is as follows.

[1] An actinic-ray- or radiation-sensitive resin composition containing (A) a compound that when exposed to actinic rays or radiation, generates an acid, (B) a resin that when acted on by an acid, increases its rate of dissolution in an alkali developer, and (C) a hydrophobic resin, characterized in that the hydrophobic resin (C) contains a repeating unit derived from any of monomers of general formula (1) below,

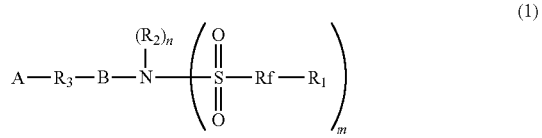

in which $R_1$, when m=2 each independently, represents a hydrogen atom, a fluorine atom or an organic functional group, $R_2$, when n=2 each independently, represents a hydrogen atom, an optionally fluorinated alkyl group, an optionally fluorinated cycloalkyl group or an optionally fluorinated aryl group, $R_3$ represents an oxygen atom or a single bond, Rf, when m=2 each independently, represents an optionally fluorinated alkylene group, an optionally fluorinated cycloalkylene group or an optionally fluorinated arylene group, A represents an organic functional group with a styrene double bond, B represents a single bond, an optionally fluorinated alkylene group, an optionally fluorinated cycloalkylene group or a sulfonyl group, provided that the alkylene group has carbon atoms optionally partially replaced by an oxygen atom, m is 1 or 2 when B is a single bond or an alkylene group, and is an integer of 0 to 2 when B is a sulfonyl group, and n is an integer of 0 to 2, satisfying the relationship n=2-m.

[2] The composition according to item [1] above, characterized in that the hydrophobic resin (C) is contained in the composition in an amount of 0.01 to 20 mass % based on total solids of the composition.

[3] The composition according to item [1] or [2] above, characterized in that the hydrophobic resin (C) further contains a repeating unit containing a group that when acted on by an alkali developer, is decomposed to thereby increase its solubility in the alkali developer.

[4] The composition according to any of items [1] to [3] above, characterized in that the hydrophobic resin (C) further contains any of repeating units of general formula (I) below,

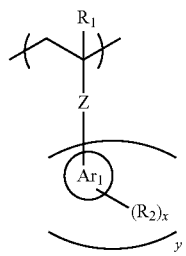

in which $R_1$ represents a hydrogen atom, an alkyl group or a halogen atom, $Ar^1$ represents an aromatic ring, $R_2$, when x≥2 each independently, represents a substituent, Z represents a single bond or a bivalent connecting group, x is an integer of 0 or greater, and y is an integer of 1 or greater.

[5] An actinic-ray- or radiation-sensitive film formed from the composition according to any of items [1] to [4] above.

[6] A method of forming a pattern, comprising forming the composition according to any of items [1] to [4] into a film, exposing the film to light, and developing the exposed film.

[7] The method according to item [6] above, wherein the exposure is performed through an immersion liquid.

[8] A process for manufacturing an electronic device, comprising the pattern forming method according to item [6] or [7] above.

[9] An electronic device manufactured by the process according to item [8] above.

The present invention has made it feasible to provide an actinic-ray- or radiation-sensitive resin composition capable of forming a pattern that is improved in the suppression of development defects and scum and that exhibits favorable immersion-liquid tracking properties in the stage of liquid-immersion exposure, and further to provide an actinic-ray- or radiation-sensitive film formed from the composition and a method of forming a pattern using the composition.

BRIEF DESCRIPTION OF DRAWINGS

FIG. 1 is the NMR chart of a member of the monomers of general formula (1), synthesized in an Example.

BEST MODE FOR CARRYING OUT THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

[(C) Hydrophobic Resin]

The composition of the present invention comprises a hydrophobic resin (C). This brings about an uneven distribution of the hydrophobic resin (C) in a surface layer portion of a resist film. When the immersion medium is water, upon the formation of a resist film, the receding contact angle of the surface of the resist film with water is increased with the result that the immersion water tracking property can be enhanced.

The hydrophobic resin (C) is preferably a resin whose addition increases the receding contact angle of the film surface. The resin is preferably one containing at least either a fluorine atom or a silicon atom. The receding contact angle of the film after the exposure but before the development is preferably in the range of 60° to 90°, more preferably 70° or greater. The amount of resin added can be appropriately regulated so that the receding contact angle of the film falls within the above range. Although the hydrophobic resin (C) is unevenly distributed on the interface as mentioned above, differing from a surfactant, the resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the immersion liquid to move on a wafer while tracking the movement of an exposure head involving high-speed scanning on the wafer and thus forming an exposure pattern. Therefore, the contact angle of the immersion liquid with the resist film in a dynamic condition is important, and it is required for the resist to be capable of tracking the high-speed scanning of the exposure head without leaving any droplets.

In the hydrophobic resin (C), the fluorine atom or silicon atom may be introduced in the principal chain of the resin or in a side chain of the resin as a substituent.

The hydrophobic resin (C) is characterized by containing a repeating unit derived from any of monomers of general formula (1) below.

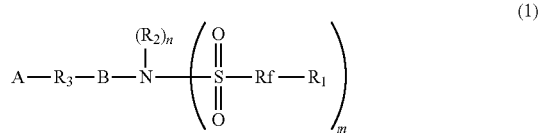

(1)

In the formula (1), $R_1$, when m=2 each independently, represents a hydrogen atom, a fluorine atom or an organic functional group. $R_2$, when n=2 each independently, represents a hydrogen atom, an optionally fluorinated alkyl group, an optionally fluorinated cycloalkyl group or an optionally fluorinated aryl group. $R_3$ represents an oxygen atom or a single bond. Rf, when m=2 each independently, represents an optionally fluorinated alkylene group, an optionally fluorinated cycloalkylene group or an optionally fluorinated arylene group. A represents an organic functional group with a styrene double bond. B represents a single bond, an optionally fluorinated alkylene group, an optionally fluorinated cycloalkylene group or a sulfonyl group, provided that the alkylene group has carbon atoms optionally partially replaced by an oxygen atom. In the formula, m is 1 or 2 when B is a single bond or an alkylene group, and is an integer of 0 to 2 when B is a sulfonyl group, and n is an integer of 0 to 2, satisfying the relationship n=2-m.

General formula (1) will be described in detail below.

The organic functional group represented by $R_1$ is an alkyl group, an aryl group, an alkoxy group, a carboxyl group, an ester group, a sulfon group or the like. For example, there can be mentioned a fluorine atom, a methyl group, an ethyl group, a propyl group, a methoxy group, an ethoxy group, a propyloxy group, an isopropyloxy group, a butoxy group, a tert-butoxy group, —COOR, —OCOR, —SO$_2$—R (in these, R represents an alkyl group or an aryl group) or the like. $R_1$ is preferably a fluorine atom.

The alkyl group represented by $R_2$ is, for example, an alkyl group having 1 to 20 carbon atoms, and may be substituted with a fluorine atom. As particular examples thereof, there can be mentioned a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, an isoamyl group and the like, all of these having hydrogen atoms optionally replaced by a fluorine atom.

The cycloalkyl group represented by $R_2$ may be monocyclic or polycyclic. For example, there can be mentioned a cycloalkyl group having 3 to 20 carbon atoms, optionally substituted with a fluorine atom. As particular examples thereof, there can be mentioned monocyclic hydrocarbon groups, such as cyclopropyl, cyclobutyl, cyclopentyl, cyclohexyl, cycloheptyl, cyclooctyl, cyclododecanyl, cyclopentenyl, cyclohexenyl and cyclooctadienyl, and polycyclic hydrocarbon groups, such as bicyclo[4.3.0]nonanyl, decahydronaphthalenyl, tricyclo[5.2.1.0(2,6)]decanyl, bornyl, isobornyl, norbornyl, adamantyl, noradamantyl, 1,7,7-trimethyltricyclo[2.2.1.0$^{2,6}$]heptanyl, and 3,7,7-trimethyl-bicyclo[4.1.0]heptanyl, all of these optionally substituted with a fluorine atom. Cyclopropyl, cyclopentyl, cyclohexyl, cyclooctyl, norbornyl, adamantyl, noradamantyl and the like are especially preferred.

The aryl group represented by $R_2$ is, for example, an aryl group having 6 to 20 carbon atoms, optionally substituted with a fluorine atom. As particular examples thereof, there can be mentioned a phenyl group, a naphthyl group and an anthracyl group, each optionally substituted with a fluorine atom. Among these, a perfluorophenyl group and a 4-tert-butylphenyl group are preferred.

The alkylene group represented by Rf may be substituted with a fluorine atom, and is preferably a perfluoroalkylene group. For example, there can be mentioned perfluoromethylene, perfluoroethylene, perfluoropropylene, perfluorobutylene, perfluoropentylene, perfluorohexylene, perfluoroheptylene, perfluorooctylene or the like. Among these, perfluoromethylene is preferred.

The arylene group represented by Rf is, for example, an arylene group having 6 to 20 carbon atoms, optionally substituted with a fluorine atom. A perfluoroarylene group is preferred. As particular examples thereof, there can be mentioned a perfluorophenylene group and a perfluoronaphthylene group. A perfluorophenylene group is especially preferred.

A represents an organic functional group with a styrene double bond, preferably a functional group with a styryl group.

A in its one form is expressed by the following general formula.

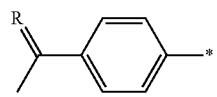
R: Hydrogen atom or a methyl group
Specific examples of the repeating units derived from the monomers of general formula (1) are shown below, which in no way limit the scope of the present invention.
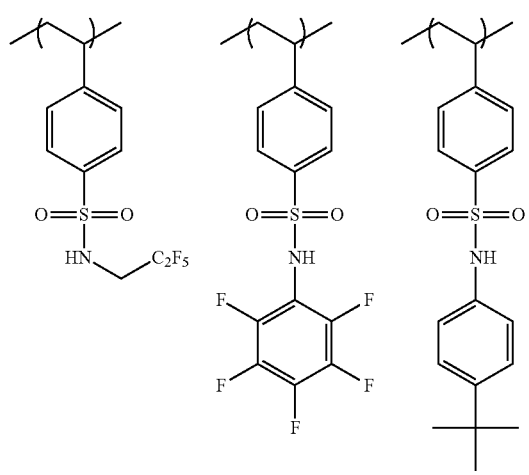
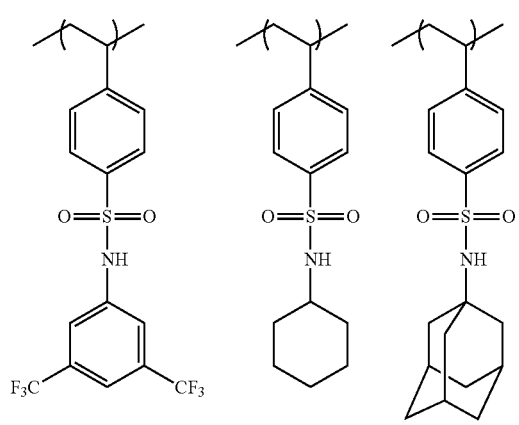
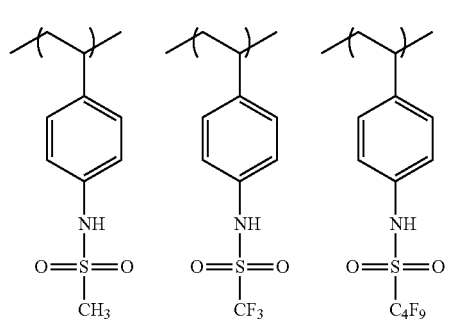
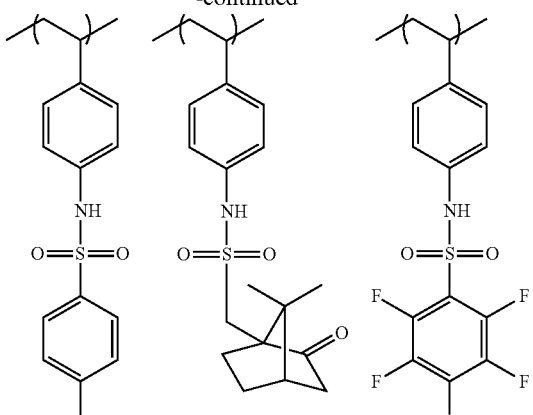
-continued
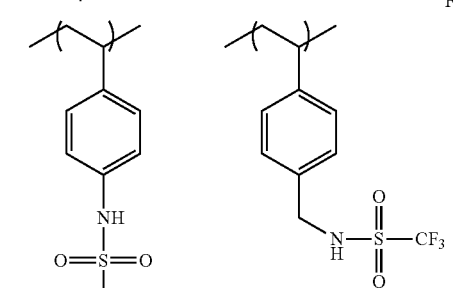
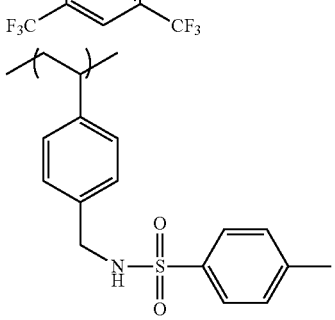
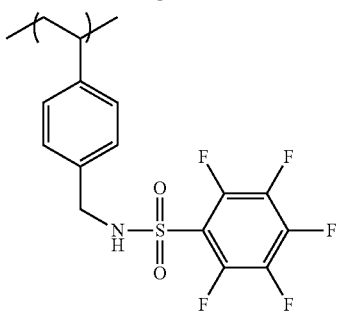
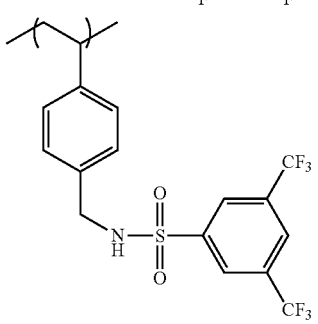

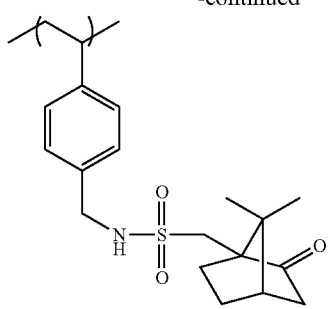
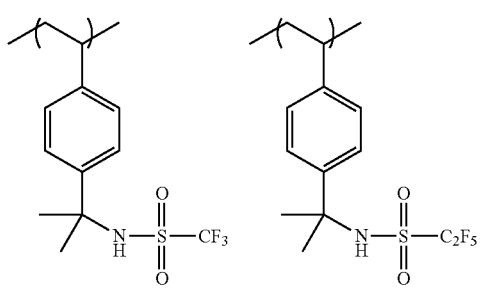
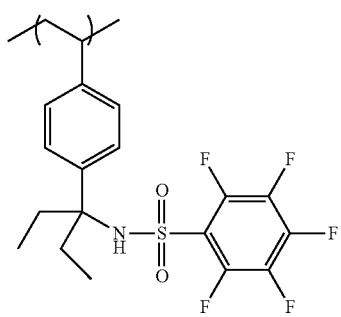
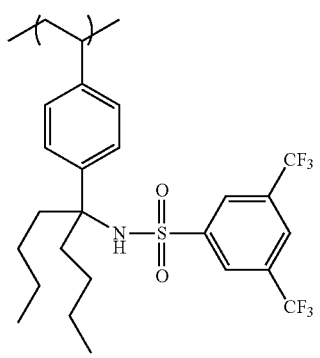
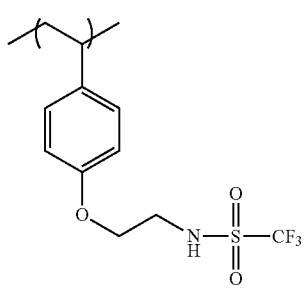
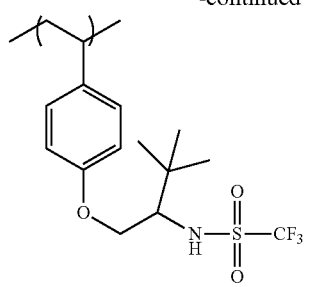
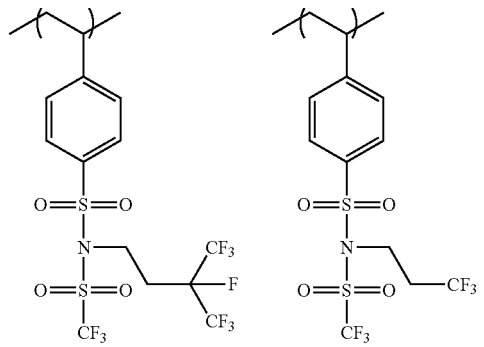
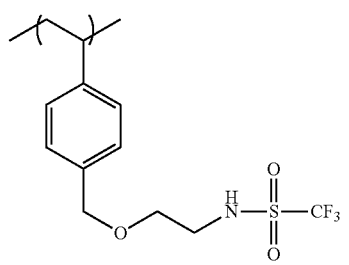
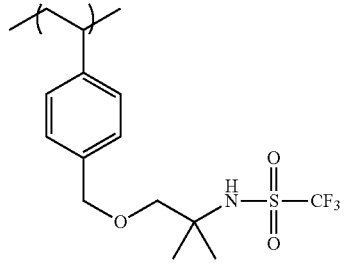
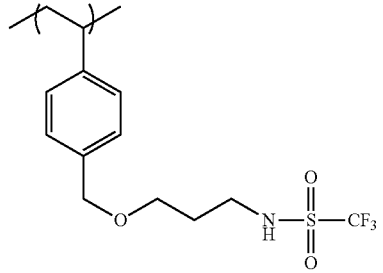
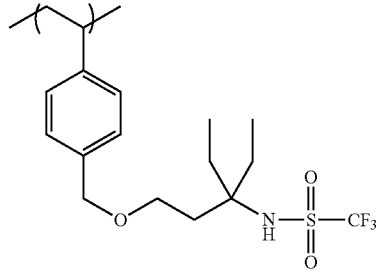

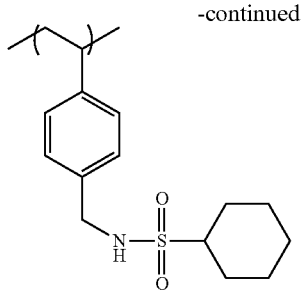

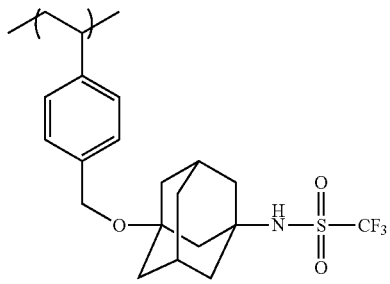

The monomers of general formula (1) can be synthesized by various methods comprising a reaction between a corresponding amine and a sulfonating agent, such as sulfonic acid chloride or sulfonic acid anhydride, or a nucleophilic substitution reaction of sulfonamide to a corresponding alkyl halide, or the like.

The content of repeating unit derived from the monomers of general formula (1), based on all the repeating units of the resin (C), is preferably in the range of 5 to 100 mol %, more preferably 10 to 90 mol %.

It is preferred for the hydrophobic resin (C) according to the present invention to further contain a repeating unit (c) containing a polarity conversion group.

Herein, the polarity conversion group refers to a group that is decomposed by the action of an alkali developer to thereby increase its solubility in the alkali developer. As the polarity conversion group, there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—), a sulfonic ester group (—SO$_2$O—) or the like.

The ester group directly bonded to the principal chain of a repeating unit, such as one contained in an acrylate or the like, is not included in the polarity conversion groups according to the present invention, because the ester group is poor in the capability of being decomposed by the action of an alkali developer to thereby increase its solubility in the alkali developer.

The repeating unit (c) is preferably any of repeating units derived from the monomers of general formula (2) below.

$$A_2\text{-}R_4\text{—}Rk_2 \tag{2}$$

In the formula, $A_2$ represents an organic functional group with a polymerizable double bond. $R_4$ represents a single bond, an alkylene group optionally partially replaced by an oxygen atom, or an arylene group. $Rk_2$ represents an organic group containing a hydrolyzable group.

As the repeating unit (c), there can be mentioned, for example, any of the repeating units of formula (K0) below.

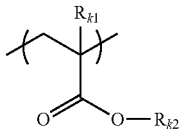

(K0)

In the formula, $R_{k1}$ represents a hydrogen atom, a halogen atom, a hydroxyl group, an alkyl group, a cycloalkyl group, an aryl group or a group containing a polarity conversion group.

$R_{k2}$ represents an alkyl group, a cycloalkyl group, an aryl group or a group containing a polarity conversion group.

Here, at least one of $R_{k1}$ and $R_{k2}$ is a group containing a polarity conversion group.

The ester group directly bonded to the principal chain of the repeating unit of general formula (K0), as mentioned above, is not included in the polarity conversion groups according to the present invention.

It is preferred for the polarity conversion group to be a group represented by X in the partial structures of general formulae (KA-1) and (KB-1) below.

Namely, preferably, the repeating unit (c) contains at least one of the partial structures of general formulae (KA-1) and (KB-1), and the polarity conversion group is represented by X of the partial structure of general formulae (KA-1) or (KB-1).

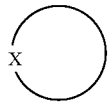

(KA-1)

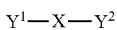

(KB-1)

In general formulae (KA-1) and (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—) or a sulfonic ester group (—SO$_2$O—).

$Y^1$ and $Y^2$ may be identical to or different from each other, and each thereof represents an electron withdrawing group.

The repeating unit (c) contains a preferred polarity conversion group by containing a group with the partial structure of general formula (KA-1) or (KB-1). When the partial structure has no bonding hand as in the case of the partial structure of general formula (KA-1) or the partial structure of general formula (KB-1) in which $Y^1$ and $Y^2$ are monovalent, the above group with the partial structure refers to a group containing a monovalent or higher-valent group resulting from the deletion of at least one arbitrary hydrogen atom from the partial structure.

The partial structure of general formula (KA-1) or (KB-1) is linked at its arbitrary position to the principal chain of the resin (C) via a substituent.

The partial structure of general formula (KA-1) is a structure in which a ring structure is formed in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in the ring structure of general formula (KA-1). For example, when $Z_{ka1}$ is a substituent, nka substituents may be introduced.

$Z_{ka1}$, or each of a plurality of $Z_{ka1}$s independently, represents an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. A typical example of $Y^1$ and $Y^2$ is a halogen atom.

These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing groups are the same as those represented by $Y^1$ and $Y^2$ to be described hereinafter.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl (t-decanoyl) group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. Further, the cycloalkyl group may be a bridged one. Namely, in that case, the cycloalkyl group may have a bridged structure. The monocycloalkyl group is preferably a cycloalkyl group having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably a cycloalkyl group having 6 to 20 carbon atoms. As such, there can be mentioned, for example, an adamantyl group, a norbornyl group, an isobornyl group, a camphonyl group, a bicyclopentyl group, an α-pinanyl group, a tricyclodecanyl group, a tetracyclododecyl group, an androstanyl group, any of the following structures or the like. The carbon atoms of each of the cycloalkyl groups may be partially replaced with a heteroatom, such as an oxygen atom.

(1)

(2)

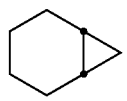

(3)

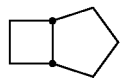

(4)

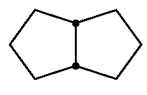

(5)

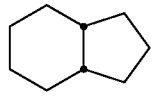

(6)

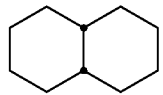

(7)

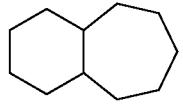

(8)

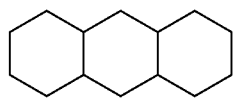

(9)

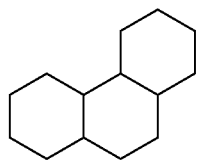

(10)

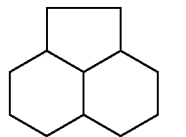

(11)

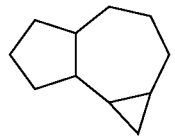

(12)

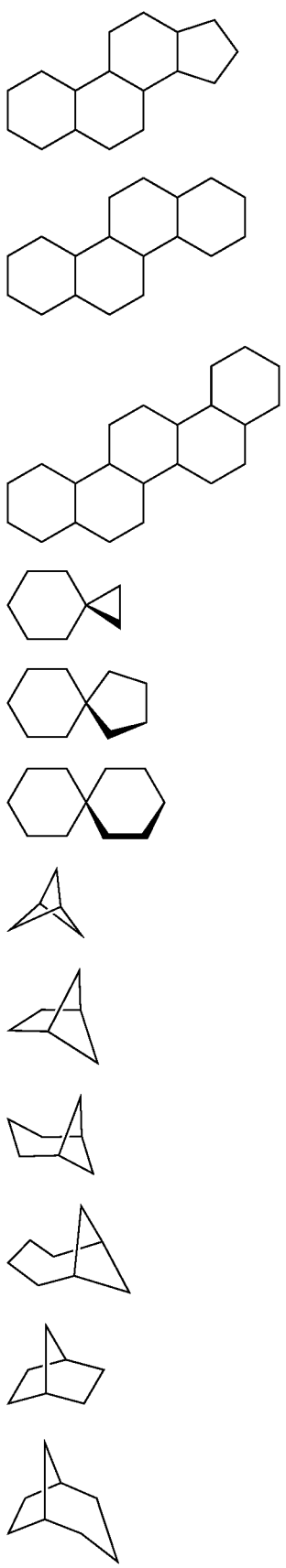
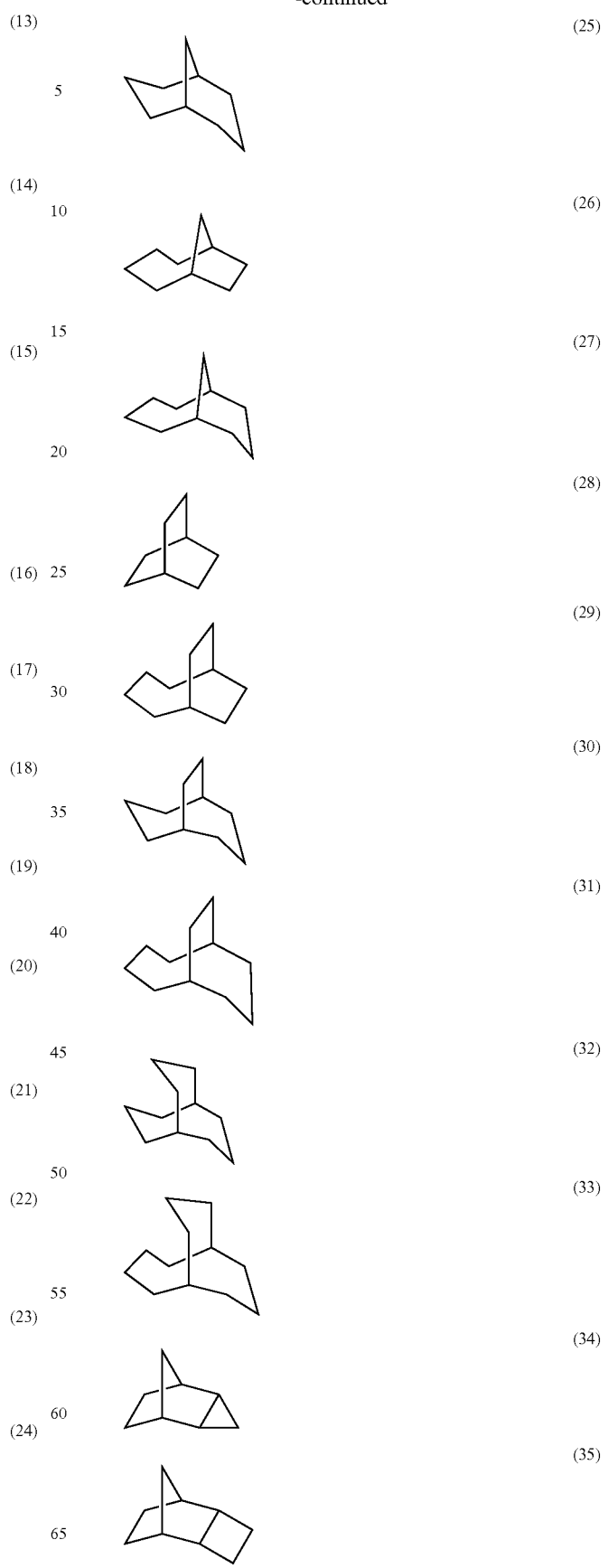

-continued

(36) 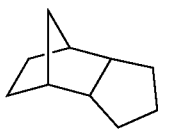

(37) 

(38) 

(39) 

(40) 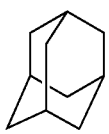

(41) 

(42) 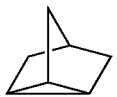

(43) 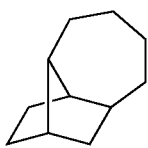

(44) 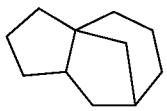

(45) 

(46) 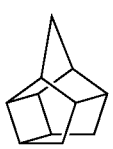

(47) 

(48) 

-continued

(49) 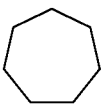

(50) 

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

As the lactone ring group represented by $Z_{ka1}$, there can be mentioned the group resulting from the removal of a hydrogen atom from any of formulae (KA-1-1) to (KA-1-17) to be described herein after.

As the aryl group represented by $Z_{ka1}$, there can be mentioned, for example, a phenyl group and a naphthyl group.

Further substituents may be introduced in the alkyl group, cycloalkyl group and aryl group represented by $Z_{ka1}$. As further substituents, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cyanamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structure of general formula (KA-1) is a lactone ring. A 5- to 7-membered lactone ring is preferred.

Further, as shown in formulae (KA-1-1) to (KA-1-17) below, the 5- to 7-membered lactone ring as the partial structure of general formula (KA-1) is preferably condensed with another ring structure in such a fashion that a bicyclo structure or a spiro structure is formed.

The peripheral ring structures to which the ring structure of general formula (KA-1) may be bonded can be, for example, those shown in formulae (KA-1-1) to (KA-1-17) below, or those similar to the same.

It is preferred for the structure containing the lactone ring structure of general formula (KA-1) to be the structure of any of formulae (KA-1-1) to (KA-1-17) below. The lactone structure may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

KA-1-1
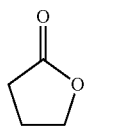

KA-1-2
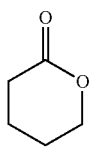

KA-1-3
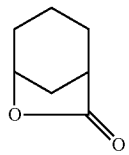

KA-1-4
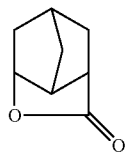

KA-1-5
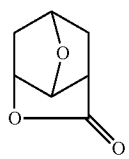

KA-1-6

KA-1-7
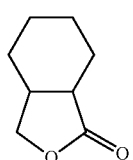

KA-1-8
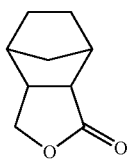

KA-1-9

KA-1-10

KA-1-11
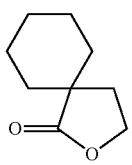

KA-1-12
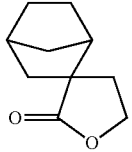

KA-1-13
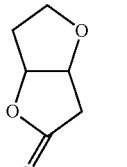

KA-1-14
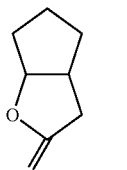

KA-1-15
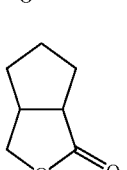

KA-1-16
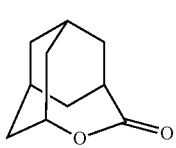

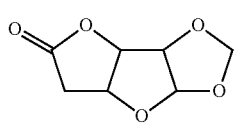

KA-1-17

A substituent may or may not be introduced in the above structures containing the lactone ring structure. As preferred substituents, there can be mentioned the same as the substituents that may be introduced in the ring structure of general formula (KA-1) above.

The lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher and most preferably 98% ee or higher.

In general formula (KB-1), X is preferably a carboxylic ester group (—COO—).

In general formula (KB-1), each of $Y^1$ and $Y^2$ independently represents an electron withdrawing group.

Preferably, the electron withdrawing group has the partial structure of formula (EW) below. In formula (EW), * represents either a bonding hand directly bonded to the structure of general formula (KA-1) or a bonding hand directly bonded to X of general formula (KB-1).

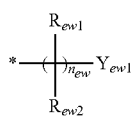

(EW)

In formula (EW), $n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$ to be described hereinafter, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. In the following structural formulae, each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

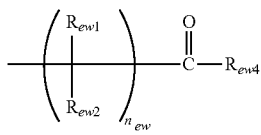

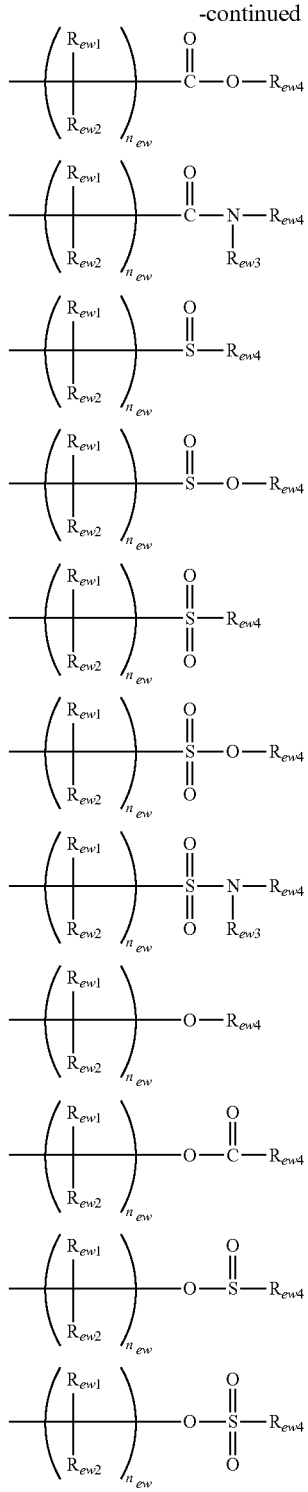

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the resin (C).

$Y_{ew1}$ is preferably a halogen atom or any of the halo(cyclo) alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. These groups may be substituted with a halogen atom (preferably a fluorine atom). Each of $R_{f2}$ and $R_{f3}$ is more preferably a (halo) alkyl group. It is preferred for $R_{f2}$ to represent the same groups as $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups mentioned above as being represented by $Z_{ka1}$, preferably fluorocycloalkyl groups of the formula $—C(n)F_{(2n-2)}H$ and perfluoroaryl groups of the formula $—C_{(n)}F_{(n-1)}$. The number of carbon atoms, n, is not particularly limited. Preferably, however, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (c) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester group, the carboxylic ester group can function as the electron withdrawing group represented by $Y^1$ or $Y^2$ of general formula (KB-1).

The repeating unit (c) may be a repeating unit (c') containing at least either a fluorine atom or a silicon atom and a polarity conversion group simultaneously introduced in the same side chain thereof, or a repeating unit (c*) containing a polarity conversion group but containing neither a fluorine atom nor a silicon atom, or a repeating unit (c") in which a polarity conversion group is introduced in its one side chain while at least either a fluorine atom or a silicon atom is introduced in a side chain other than the above side chain within the same repeating unit. However, it is preferred for the resin (C) to contain the repeating unit (c') as the repeating unit (c). Namely, it is preferred for the repeating unit (c) containing at least one polarity conversion group to contain at least either a fluorine atom or a silicon atom.

When the resin (C) contains the repeating unit (c*), it is preferred for the resin (C) to be a copolymer with a repeating unit (repeating unit (c1) to be described hereinafter) containing at least either a fluorine atom or a silicon atom. In the repeating unit (c"), it is preferred for the side chain containing a polarity conversion group and the side chain containing at least either a fluorine atom or a silicon atom to be bonded to the same carbon atom of the principal chain, namely to be in a positional relationship shown in formula (K1) below.

In the formula, B1 represents a partial structure containing a polarity conversion group, and B2 represents a partial structure containing at least either a fluorine atom or a silicon atom.

(K1)

In the repeating unit (c*) and repeating unit (c"), it is highly preferred for the polarity conversion group to be a partial structure expressed by —COO— in the structures of general formula (KA-1).

The receding contact angle with water of the resin composition film after alkali development can be decreased by the polarity conversion achieved by the decomposition of the polarity conversion group by the action of an alkali developer.

The receding contact angle with water of the resin composition film after alkali development is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The rate of hydrolysis of the resin (C) in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the resin (C) in an alkali developer refers to the rate of decrease of the thickness of a resin film formed from only the resin (C) in 23° C. TMAH (aqueous solution of tetramethylammonium hydroxide) (2.38 mass %).

The resin (C) is preferably the resin (C1) which contains a repeating unit (c) containing at least two polarity conversion groups and contains at least either a fluorine atom or a silicon atom.

When the repeating unit (c) contains at least two polarity conversion groups, it is preferred for the repeating unit (c) to contain a group with any of the partial structures having two polarity conversion groups of general formula (KY-1) below. When the structure of general formula (KY-1) has no bonding hand, a group with a mono- or higher-valent group resulting from the removal of at least any arbitrary one of the hydrogen atoms contained in the structure is referred to.

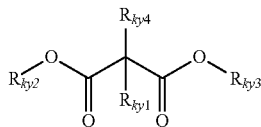
(KY-1)

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —$C(R_{f1})(R_{f2})$—$R_{f3}$ above. Preferably, $R_{ky3}$ is a halogen atom, or any of the halo(cyclo)alkyl groups or haloaryl groups of the formula —$C(R_{f1})(R_{f2})$—$R_{f3}$ above, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those set forth above as being represented by $Y^1$ and $Y^2$ of general formula (KB-1) above.

It is preferred for the structure of general formula (KY-1) to be the structure of general formula (KY-2) below. The structure of general formula (KY-2) refers to a group with a mono- or higher-valent group resulting from the removal of at least any arbitrary one of the hydrogen atoms contained in the structure.

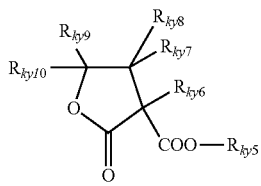
(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic structure.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —$C(R_{f1})(R_{f2})$—$R_{f3}$ above.

As $R_{ky5}$ to $R_{ky10}$, there can be mentioned, for example, the same groups as set forth above with respect to $Z_{ka1}$ of formula (KA-1).

It is more preferred for the structure of formula (KY-2) to be the partial structure of general formula (KY-3) below.

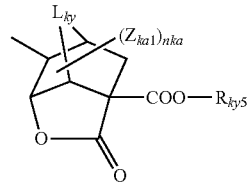
(KY-3)

In formula (KY-3), $Z_{ka1}$ and nka are as defined above in connection with general formula (KA-1). $R_{ky5}$ is as defined above in connection with formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (c) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

As further particular structures of the repeating units (c), the repeating units with the following partial structures are preferred.

The repeating unit (c) may be a repeating unit with the following partial structure.

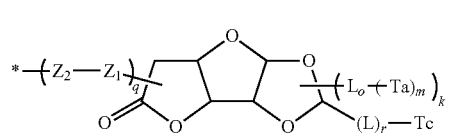
(cc)

In general formula (cc), $Z_1$, or each of $Z_1$s independently, represents a single bond, an ether bond, an ester bond, an amido bond, a urethane bond or a urea bond, preferably an ester bond.

$Z_2$, or each of $Z_2$s independently, represents a chain- or cycloalkylene group, preferably an alkylene group having 1 or 2 carbon atoms or a cycloalkylene group having 5 to 10 carbon atoms.

Ta, or each of Ta's independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1) above). An alkyl group, a cycloalkyl group and an electron withdrawing group are preferred. An electron withdrawing group is more preferred. Two or more Ta's may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m−1 hydrogen atoms from an alkylene group, a cycloalkylene group, a phenylene group or a combination thereof.

L, or each of L's independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents a bonding hand to the principal chain or a side chain of the resin. Specifically, the partial structure of formula (cc) may be directly bonded to the principal chain, or may be bonded to a side chain of the resin. In this connection, the bonding hand to the principal chain refers to a bonding hand to an atom being present in bonds constructing the principal chain, while the bonding hand to a side chain refers to a bonding hand to an atom being present in a portion other than the bonds constructing the principal chain.

In the formula, m is an integer of 1 to 28, preferably an integer of 1 to 3, more preferably 1;

k is an integer of 0 to 2, preferably 1;

q represents the number of repetitions of the group ($Z_2$-$Z_1$), being an integer of 0 to 5, preferably 0 to 2; and r is an integer of 0 to 5.

The moiety -(L)$_r$-Tc may be replaced with -$L_0$-(Ta)$_m$.

It is also preferred to contain a fluorine atom at an end of a sugar lactone and further contain a fluorine atom on a side chain different from the side chain on the side of the sugar lactone within the same repeating unit (repeating unit (c")).

The alkylene group represented by $Z_2$ when it is linear preferably has 1 to 30 carbon atoms, more preferably 1 to 20 carbon atoms. The alkylene group represented by $Z_2$ when it is branched preferably has 3 to 30 carbon atoms, more preferably 3 to 20 carbon atoms. As particular examples of the alkylene groups represented by $Z_2$, there can be mentioned the groups resulting from the removal of one arbitrary hydrogen atom from each of the particular examples of alkyl groups mentioned above as being represented $Z_{ka1}$.

The cycloalkylene group represented by $Z_2$ preferably has 3 to 8 carbon atoms. As particular examples thereof, there can be mentioned the groups resulting from the removal of one arbitrary hydrogen atom from each of the cycloalkyl groups mentioned above as being represented $Z_{ka1}$.

With respect to the alkyl groups and cycloalkyl groups represented by Ta and Tc, the preferred number of carbon atoms and particular examples are as mentioned above in connection with the alkyl groups and cycloalkyl groups represented by $Z_{ka1}$.

The alkoxy group represented by Ta preferably has 1 to 8 carbon atoms. As such, there can be mentioned a methoxy group, an ethoxy group, a propoxy group, a butoxy group or the like.

Each of the aryl groups represented by Ta and Tc preferably has 6 to 12 carbon atoms. As such, there can be mentioned, for example, a phenyl group and a naphthyl group.

With respect to the alkylene group and cycloalkylene group represented by $L_0$, the preferred number of carbon atoms and particular examples are as mentioned above in connection with the alkylene group and cycloalkylene group represented by $Z_2$.

As further particular structures of the repeating units (c), the repeating units with the following partial structures are preferred.

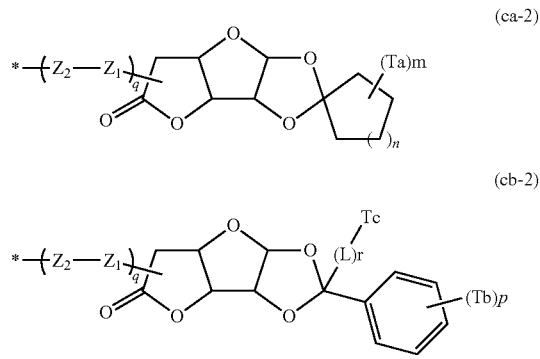

In general formulae (ca-2) and (cb-2), n is an integer of 0 to 11, preferably an integer of 0 to 5, more preferably 1 or 2; and p is an integer of 0 to 5, preferably an integer of 0 to 3, more preferably 1 or 2.

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. When there are a plurality of Tbs, they may be bonded to each other to thereby form a ring.

In the formulae, * represents a bonding hand to the principal chain or a side chain of the resin. Specifically, any of the partial structures of general formulae (ca-2) and (cb-2) may be directly bonded to the principal chain, or may be bonded to a side chain of the resin.

$Z_1$, $Z_2$, Ta, Tc, L, *, m, q and r are as defined above in connection with general formula (cc). Preferred examples thereof are also the same as above.

The repeating unit (c) may be a repeating unit with the partial structure of general formula (KY-4) below.

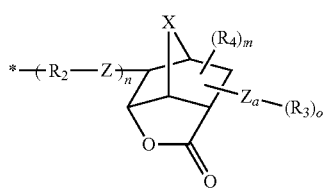
(KY-4)

In general formula (KY-4), $R_2$ represents a chain or cyclic alkylene group, provided that when there are a plurality of $R_2$s, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group. When there are a plurality of $R_4$s, they may be identical to or different from each other. Two or more $R_4$s may be bonded to each other to thereby form a ring.

X represents an alkylene group, an oxygen atom or a sulfur atom.

Each of Z and Za represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin;

o is the number of substituents, being an integer of 1 to 7;
m is the number of substituents, being an integer of 0 to 7; and
n is the number of repetitions, being an integer of 0 to 5.

The structure —$R_2$—Z— is preferably the structure of formula —(CH2)l-COO— in which l is an integer of 1 to 5.

With respect to the alkylene group and cycloalkylene group represented by $R_2$, the preferred number of carbon atoms and particular examples are as mentioned above in connection with the alkylene group and cycloalkylene group represented by $Z_2$ of general formula (cc).

The number of carbon atoms of the linear, branched or cyclic hydrocarbon group represented by $R_3$ is preferably in the range of 1 to 30, more preferably 1 to 20 when the hydrocarbon group is linear; is preferably in the range of 3 to 30, more preferably 3 to 20 when the hydrocarbon group is branched; and is in the range of 6 to 20 when the hydrocarbon group is cyclic. As particular examples of the $R_3$ groups, there can be mentioned the above particular examples of the alkyl and cycloalkyl groups represented by $Z_{ka1}$.

With respect to the alkyl groups and cycloalkyl groups represented by $R_4$ or R, the preferred number of carbon atoms and particular examples are as mentioned above in connection with the alkyl groups and cycloalkyl groups represented by $Z_{ka1}$.

The acyl group represented by $R_4$ preferably has 1 to 6 carbon atoms. As such, there can be mentioned, for example, a formyl group, an acetyl group, a propionyl group, a butyryl group, an isobutyryl group, a valeryl group, a pivaloyl group or the like.

As the alkyl moiety of the alkoxy group and alkoxycarbonyl group represented by $R_4$, there can be mentioned a linear, branched or cyclic alkyl moiety. With respect to the alkyl moiety, the preferred number of carbon atoms and particular examples are as mentioned above in connection with the alkyl groups and cycloalkyl groups represented by $Z_{ka1}$.

With respect to the alkylene group and cycloalkylene group represented by X, the preferred number of carbon atoms and particular examples are as mentioned above in connection with the alkylene group and cycloalkylene group represented by $R_2$.

The repeating unit (c) is more preferably a repeating unit with the partial structure of general formula (KY-5) below.

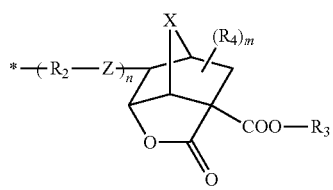
(KY-5)

In general formula (KY-5), $R_2$ represents a chain or cyclic alkylene group, provided that when there are a plurality of $R_2$s, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group. When there are a plurality of $R_4$s, they may be identical to or different from each other. Two or more $R_4$s may be bonded to each other to thereby form a ring.

X represents an alkylene group, an oxygen atom or a sulfur atom.

Z represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin;

n is the number of repetitions, being an integer of 0 to 5; and
m is the number of substituents, being an integer of 0 to 7.

With respect to $R_2$, $R_3$, $R_4$ and X, the preferred number of carbon atoms and particular examples are as mentioned above in connection with $R_2$, $R_3$, $R_4$ and X of general formula (KY-4).

The structure —$R_2$—Z— is preferably the structure of formula —(CH$_2$)l-COO— in which l is an integer of 1 to 5.

Moreover, as particular structures of the repeating units (c), there can be mentioned the repeating units with the following partial structures.

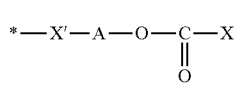
(rf-1)

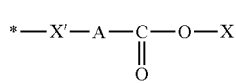
(rf-2)

In general formulae (rf-1) and (rf-2),

X' represents an electron withdrawing substituent, preferably a carbonyloxy group, an oxycarbonyl group, an alkylene group substituted with a fluorine atom or a cycloalkylene group substituted with a fluorine atom.

A represents a single bond or a bivalent connecting group of the formula —C(Rx)(Ry)-. In the formula, each of Rx and Ry independently represents a hydrogen atom, a fluorine atom, an alkyl group (preferably having 1 to 6 carbon atoms, optionally substituted with a fluorine atom) or a cycloalkyl group (preferably having 5 to 12 carbon atoms, optionally substituted with a fluorine atom). Each of Rx and Ry is preferably a hydrogen atom, an alkyl group or an alkyl group substituted with a fluorine atom.

X represents an electron withdrawing group, preferably a fluoroalkyl group, a fluorocycloalkyl group, an aryl group substituted with fluorine or a fluoroalkyl group, or an aralkyl group substituted with fluorine or a fluoroalkyl group.

represents a bonding hand to the principal chain or a side chain of the resin, namely, a bonding hand bonded to the principal chain of the resin through a single bond or a connecting group.

When X' is a carbonyloxy group or an oxycarbonyl group, A is not a single bond.

The alkylene group contained in the alkylene group substituted with a fluorine atom, represented by X' preferably has 1 to 30 carbon atoms, more preferably 1 to 20 carbon atoms, when the alkylene group is in the form of a linear chain, and preferably has 3 to 30 carbon atoms, more preferably 3 to 20 carbon atoms, when the alkylene group is in the form of a branched chain. As particular examples of the alkylene groups, there can be mentioned groups resulting from the removal of any arbitrary one hydrogen atom from each of the above particular examples of the alkyl groups represented by $Z_{ka1}$. It is preferred for the alkylene group substituted with a fluorine atom to be a perfluoroalkylene group.

The cycloalkylene group contained in the cycloalkylene group substituted with a fluorine atom, represented by X' preferably has 3 to 8 carbon atoms. As particular examples thereof, there can be mentioned groups resulting from the removal of any arbitrary one hydrogen atom from each of the above particular examples of the cycloalkyl groups represented by $Z_{ka1}$. It is preferred for the cycloalkylene group substituted with a fluorine atom to be a perfluorocycloalkylene group.

The alkyl group contained in the fluoroalkyl group represented by X preferably has 1 to 30 carbon atoms, more preferably 1 to 20 carbon atoms, when the alkyl group is in the form of a linear chain, and preferably has 3 to 30 carbon atoms, more preferably 3 to 20 carbon atoms, when the alkyl group is in the form of a branched chain. As particular examples of the alkyl groups, there can be mentioned those set forth above in connection with the alkyl groups represented by $Z_{ka1}$. It is preferred for the fluoroalkyl group to be a perfluoroalkyl group.

The cycloalkyl group contained in the fluorocycloalkyl group represented by X preferably has 3 to 8 carbon atoms. As particular examples thereof, there can be mentioned those set forth above in connection with the cycloalkyl groups represented by $Z_{ka1}$. It is preferred for the fluorocycloalkyl group to be a perfluorocycloalkyl group.

The aryl group contained in the aryl group substituted with fluorine or a fluoroalkyl group, represented by X is preferably an aryl group having 6 to 12 carbon atoms, for example, a phenyl group or a naphthyl group. Particular examples of the fluoroalkyl groups each contained in the aryl group substituted with a fluoroalkyl group are the same as set forth above in connection with the fluoroalkyl group represented by X.

The aralkyl group contained in the aralkyl group substituted with fluorine or a fluoroalkyl group, represented by X is preferably an aralkyl group having 6 to 12 carbon atoms, for example, a benzyl group, a phenethyl group, a naphthylmethyl group, a naphthylethyl group, a naphthylbutyl group or the like. Particular examples of the fluoroalkyl groups each contained in the aralkyl group substituted with a fluoroalkyl group are the same as set forth above in connection with the fluoroalkyl group represented by X.

As particular examples of the repeating units (c) each with a polarity conversion group, there can be mentioned the structures shown by way of example on pages 83 to 85 of International Publication No. 2010/067905, the structures shown by way of example on pages 81 to 87 of International Publication No. 2010/067898, etc.

The resin (C) may contain any of the repeating units of general formula (1) below (hereinafter also referred to as a repeating unit (R)).

(I)

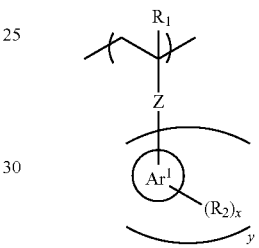

In the formula, $R_1$ represents a hydrogen atom, an alkyl group or a halogen atom; $Ar^1$ represents an aromatic ring; $R_2$, when x≥2 each independently, represents a substituent; Z represents a single bond or a bivalent connecting group; x is an integer of 0 or greater; and y is an integer of 1 or greater.

The use of the resin (C) containing the repeating unit (R) makes it feasible to simultaneously satisfy the developability and immersion-liquid tracking properties. In particular, when the resin with this structure is employed, not only can the number of development defects be decreased but also the receding contact angle can be increased.

The alkyl group represented by R, preferably has 1 to 5 carbon atoms, being most preferably a methyl group. A substituent may further be introduced in the alkyl group represented by $R_1$. As the substituent, there can be mentioned, for example, a halogen atom, a hydroxyl group, or an alkoxy group, such as a methoxy group, an ethoxy group, an isopropoxy group, a t-butoxy or a benzyloxy group. $R_1$ is preferably a hydrogen atom or an alkyl group, more preferably a hydrogen atom, a methyl group, a hydroxymethyl group or a trifluoromethyl group.

The aromatic ring represented by $Ar^1$ may be monocyclic or polycyclic. This aromatic ring may be a heterocycle containing a heteroatom, such as a nitrogen atom, an oxygen atom or a sulfur atom.

The aromatic ring represented by $Ar^1$ preferably has 6 to 30 carbon atoms. As such an aromatic ring, there can be mentioned, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an iodolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring or the like. Of these, a benzene ring, a naphthalene ring and an anthracene ring are preferred. A benzene ring is more preferred.

It is preferred for at least a part of the substituents represented by $R_2$ to be a hydrophobic group. As the hydrophobic group, there can be mentioned, for example, a fluorine atom, a silicon atom, an alkyl group or a cycloalkyl group.

The alkyl group represented by $R_2$ may be in the form of a linear chain or branched chain. The alkyl group preferably has 1 to 30 carbon atoms, more preferably 1 to 15 carbon atoms. As such an alkyl group, there can be mentioned, for example, a linear alkyl group, such as a methyl group, an ethyl group, an n-propyl group, an n-butyl group, an n-pentyl group, an n-hexyl group, an n-octyl group, an n-dodecyl group, an n-tetradecyl group or an n-octadecyl group, or a branched alkyl group, such as an isopropyl group, an isobutyl group, a t-butyl group, a neopentyl group or a 2-ethylhexyl group.

The cycloalkyl group represented by $R_2$ may be monocyclic or polycyclic. This cycloalkyl group may contain in its ring a heteroatom, such as an oxygen atom. The cycloalkyl group preferably has 3 to 20 carbon atom. As the cycloalkyl group, there can be mentioned, for example, a cyclopropyl group, a cyclopentyl group, a cyclohexyl group, a norbornyl group or an adamantyl group.

$R_2$ is preferably a fluorine atom, an alkyl group or a cycloalkyl group, more preferably a fluorine atom or an alkyl group and most preferably a branched alkyl group.

A substituent may further be introduced in the groups represented by $R_2$. As the substituent, there can be mentioned, for example, a halogen atom, such as a fluorine atom, or a hydroxyl group.

The alkyl group and cycloalkyl group represented by $R_2$ in particular forms thereof are an unsubstituted alkyl group and cycloalkyl group. When use is made of an unsubstituted alkyl group and cycloalkyl group, the effect of increasing the receding contact angle after the bake but before the exposure is highly conspicuous, thereby enhancing the immersion-liquid tracking properties.

The alkyl group and cycloalkyl group represented by $R_2$ in other forms thereof are a substituted alkyl group and cycloalkyl group. The substituent is preferably a fluorine atom. When the substitution is effected with a fluorine atom, while maintaining the immersion-liquid tracking properties, the content of repeating unit (R) in all the repeating units can be relatively low. Therefore, the content of other repeating units can be relatively high, so that an enhancement of performance, such as developability, attributed thereto can be expected.

$R_2$ may be a group that is stable in an acid and an alkali. Also, $R_2$ may be at least one group selected from the group consisting of (x) an alkali-soluble group, (y) a group that when acted on by an alkali developer, is decomposed to thereby increase its solubility in the alkali developer and (z) a group that when acted on by an acid, is decomposed to thereby increase its solubility in an alkali developer to be described hereinafter.

The expression "stable in an acid" used herein means that substantially no decomposition reaction under the action of an acid generated by a photoacid generator to be described hereinafter occurs. The expression "stable in an alkali" used herein means that substantially no decomposition reaction under the action of an alkali developer to be described hereinafter occurs.

As mentioned above, x is an integer of 0 or greater. The upper limit value of x is equal to the number of sites of $Ar^1$ where a substitution is feasible. Preferably, x is in the range of 0 to 5. More preferably, x is in the range of 0 to 3.

Z represents a single bond or a bivalent connecting group. The bivalent connecting group is, for example, a group selected from the group consisting of an arylene group, an alkylene group, a cycloalkylene group, —O—, —$SO_2$—, —CO—, —NH—, —NR—, —$NHSO_2$— and combinations of two or more of these. In the formula —NR—, R represents an alkyl group, preferably having 1 to 3 carbon atoms.

The bivalent connecting group represented by Z preferably comprises an arylene group, an alkylene group, —O— or —COO—. In particular, connecting groups composed of a combination of at least two connecting groups selected from among an arylene group, an alkylene group, —O— and —COO— are preferred. A substituent may further be introduced in each of these groups.

As mentioned above, y is an integer of 1 or greater. The upper limit value of y is equal to the number of sites of Z where a substitution is feasible. Preferably, y is in the range of 1 to 3. More preferably, y is 1.

The repeating unit (R) is preferably expressed by general formula (II) below.

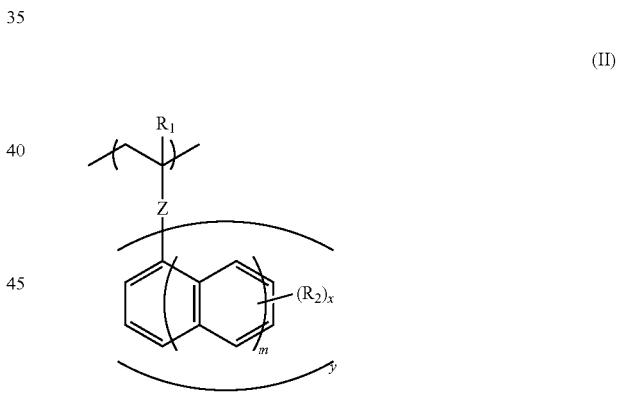

(II)

In the formula, $R_1$, Z, $R_2$, x and y are as defined above in connection with general formula (1). In the formula, m is an integer of 0 or greater, preferably in the range of 0 to 3, more preferably 0 to 2, especially preferably 0 or 1 and most preferably 0.

When x≤1, it is preferred for at least one of the substituents represented by $R_2$ to be bonded to a p-position to the connecting group represented by Z. If so, the resin (C) tends to be unevenly distributed in the surface portion of the film with the result that a higher receding contact angle can be attained.

Preferably, the repeating unit (R) is expressed by general formula (I-A) below. If so, a higher receding contact angle can be attained.

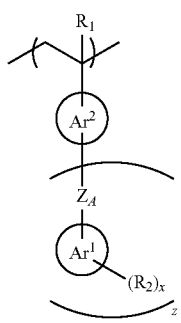

(I-A)

In the formula, $R_1$, $Ar^1$, $R_2$, and x are as defined above in connection with general formula (1).

$Ar^2$ represents an aromatic ring. $Z_A$ represents a single bond or a connecting group, and z is an integer of 1 or greater.

As the aromatic ring represented by $Ar^2$, there can be mentioned, for example, any of those mentioned above as being represented by $Ar^1$. $Ar^2$ is preferably a benzene ring or a naphthalene ring, more preferably a benzene ring. A substituent may further be introduced in the aromatic ring represented by $Ar^2$.

As the connecting group represented by $Z_A$, there can be mentioned, for example, any of those mentioned above as being represented by Z. $Z_A$ is preferably a single bond, or an alkylene group, an ether bond, an ester bond, an amido bond, a urethane bond, a urea bond or a connecting group composed of a combination of two or more of these. More preferably, $Z_A$ is a single bond, an alkylene group, an ether bond, an ester bond or a connecting group composed of a combination of two or more of these. A substituent may further be introduced in the alkylene group.

In the formula, z is an integer of 1 or greater. The upper limit value of z is equal to the number of sites of $Ar^2$ where a substitution is feasible.

Preferably, z is in the range of 1 to 3. More preferably, z is 1.

When the aromatic ring represented by $Ar^2$ comprises a benzene ring directly bonded to the principal chain of the polymer, it is preferred for at least one of the connecting groups represented by $Z_A$ to be bonded to a p-position thereof. If so, the resin (C) further tends to be unevenly distributed in the surface portion of the film with the result that a higher receding contact angle can be attained.

More preferably, the repeating unit (R) is expressed by general formula (II-A) below.

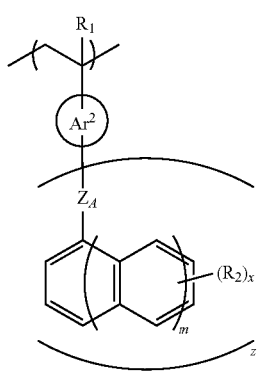

(II-A)

The characters used in the formula are as defined above in connection with general formulae (II) and (1-A).

Also, the repeating unit (R) is preferably expressed by general formula (I-B) below. If so, the coatability and developability can further be enhanced.

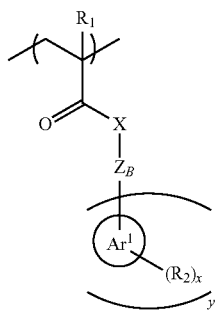

(I-B)

In the formula, $R_1$, $Ar^1$, $R_2$, x and y are as defined above in connection with general formula (I).

$Z_B$ represents a connecting group. X represents O, NH or NR. R represents an alkyl group.

As the connecting group represented by $Z_B$, there can be mentioned, for example, any of those mentioned above as being represented by Z. $Z_B$ is preferably an alkylene group, an ether bond, an ester bond, an amido bond, a urethane bond, a urea bond or a connecting group composed of a combination of two or more of these. More preferably, $Z_B$ is an alkylene group, an ether bond, an ester bond or a connecting group composed of a combination of two or more of these. A substituent may further be introduced in the alkylene group.

As mentioned above, X represents O, NH or NR. The alkyl group represented by R preferably has 1 to 3 carbon atoms. When X is O, the coatability can further be enhanced. When X is NH or NR, the developability can further be enhanced.

Further, the repeating unit (R) is more preferably expressed by general formula (II-B) below.

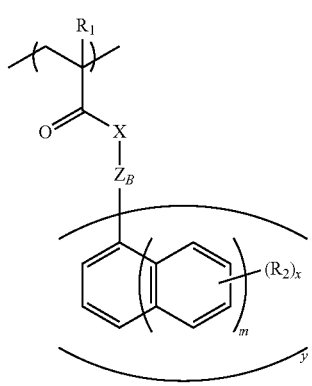

(II-B)

The characters used in the formula are as defined above in connection with general formulae (II) and (I-B).

Particular examples of the repeating units (R) are shown below. In the formulae, Ra has the same meaning as that of $R_1$ of general formula (I), and n is an integer of 2 or greater, preferably in the range of 2 to 10.

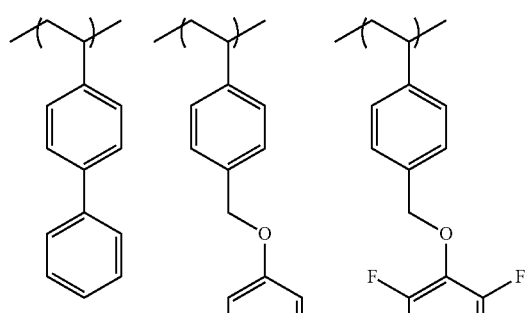
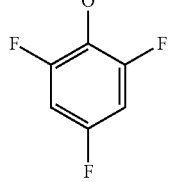
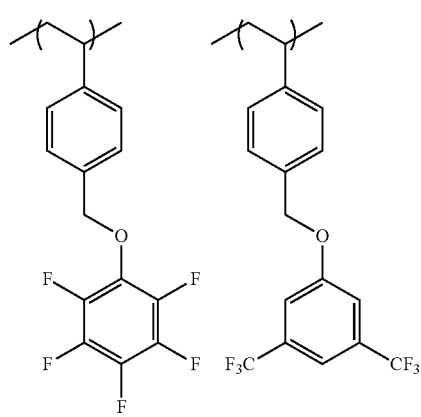
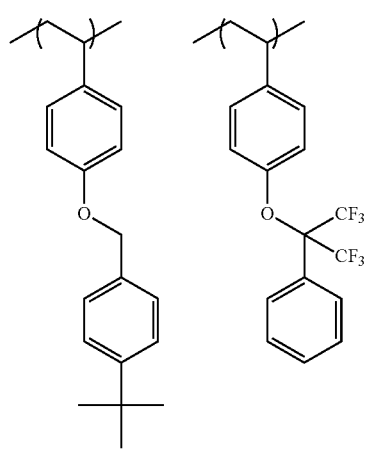
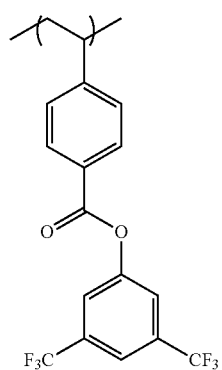
-continued
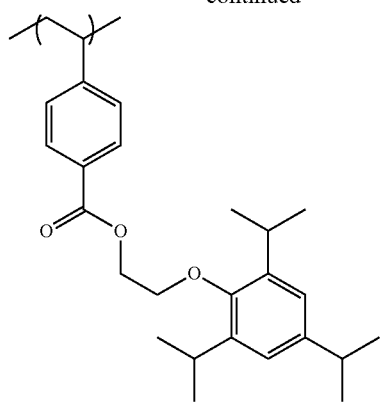
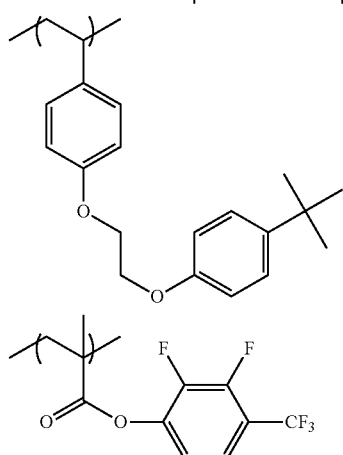
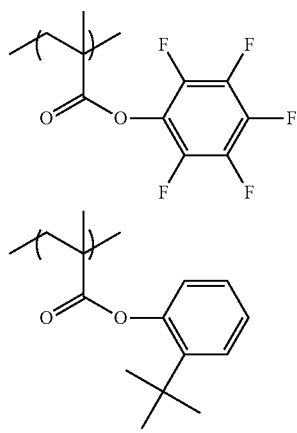
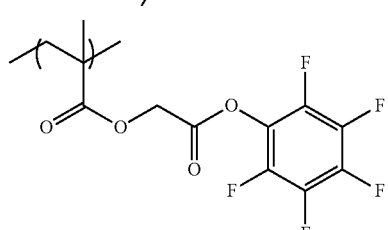
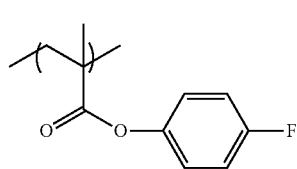

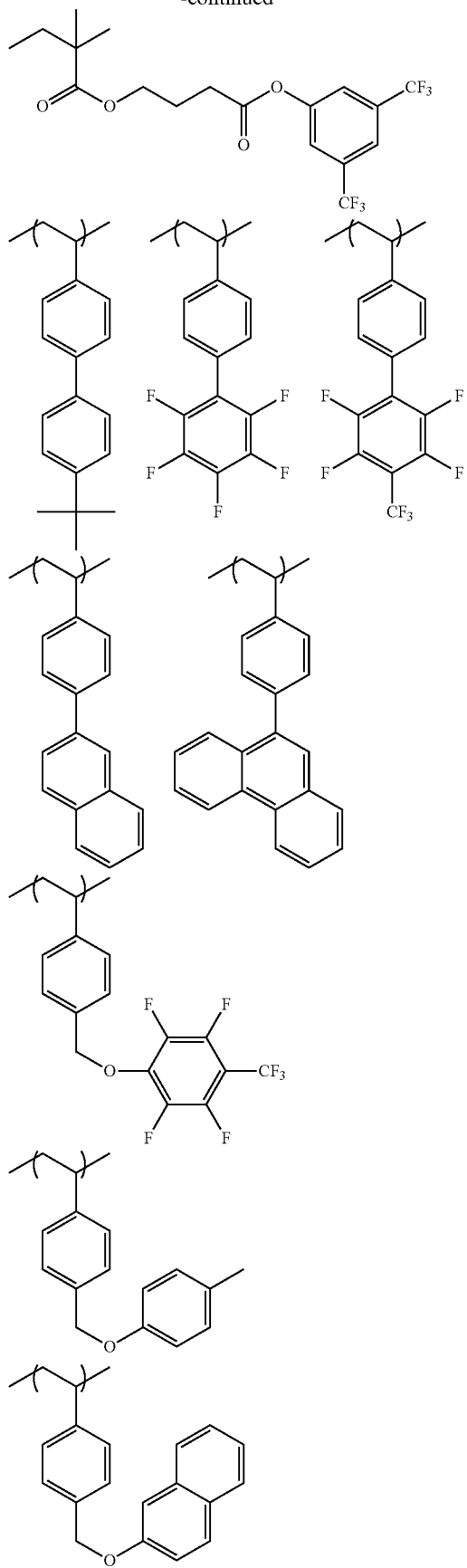
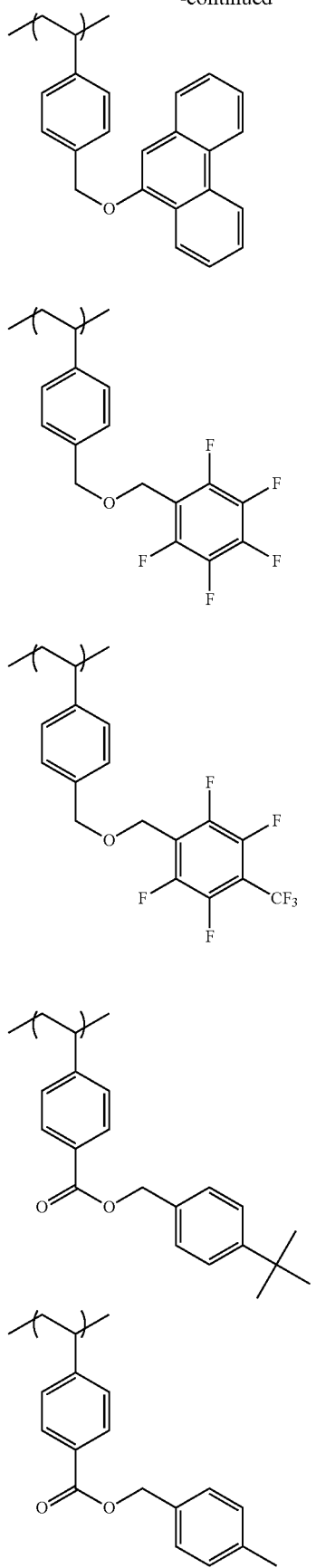

41
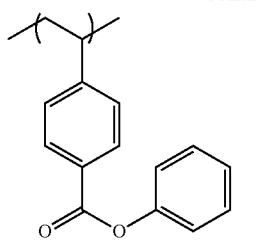
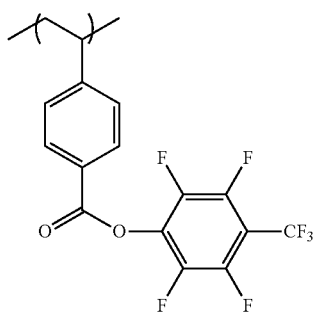
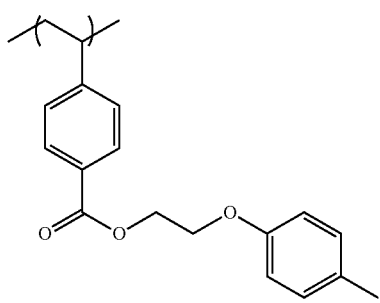
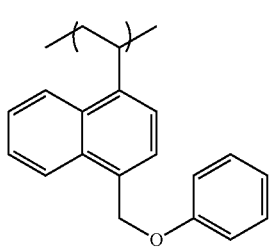
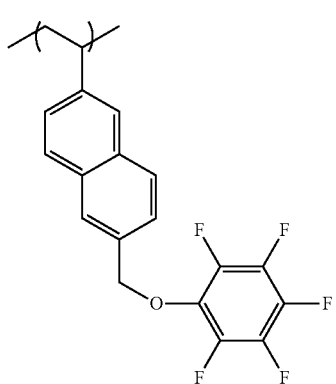
42
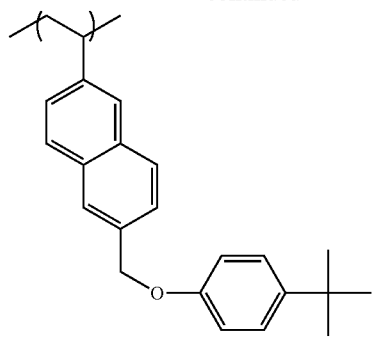
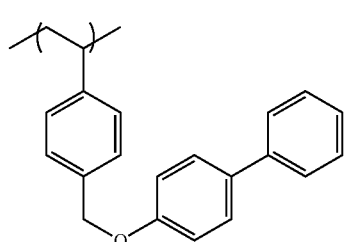
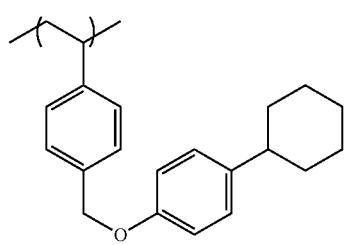
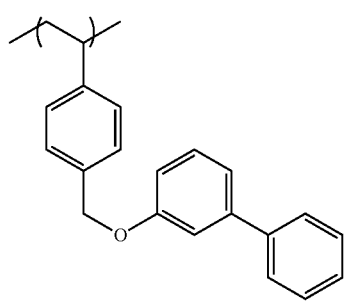
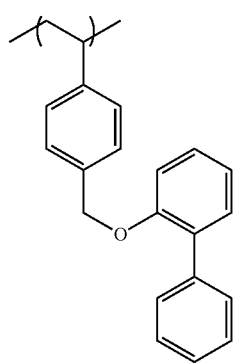

43
-continued
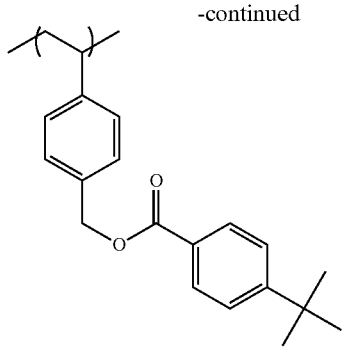
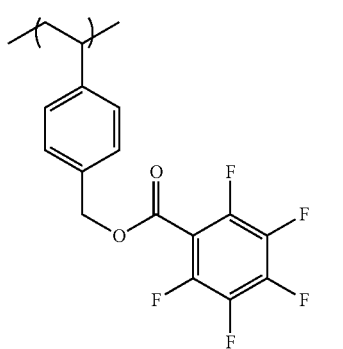
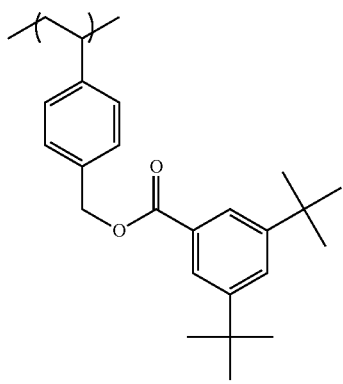
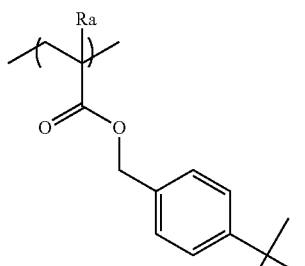
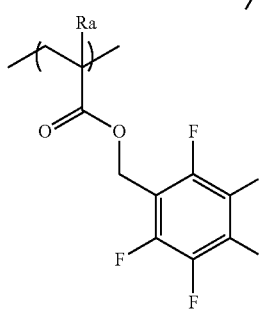
44
-continued
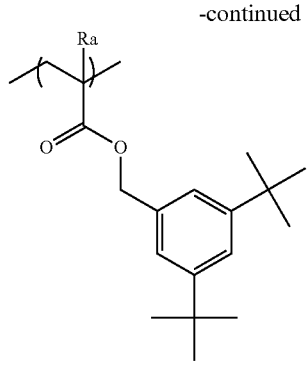
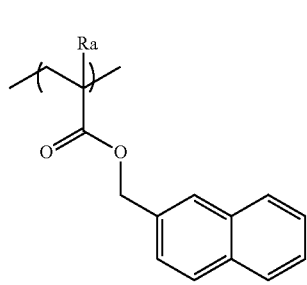
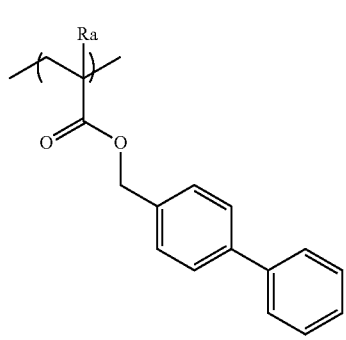
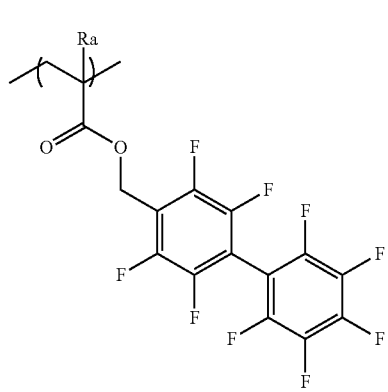
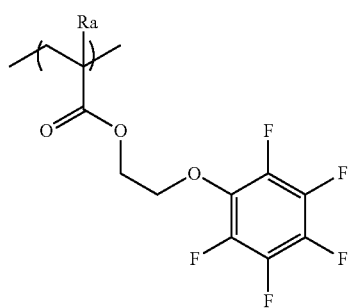

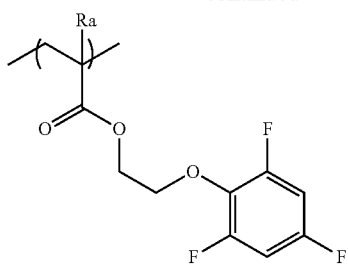
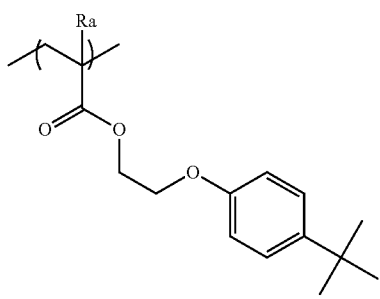
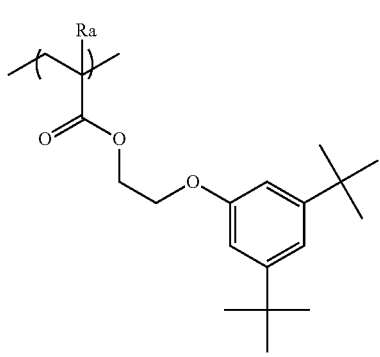
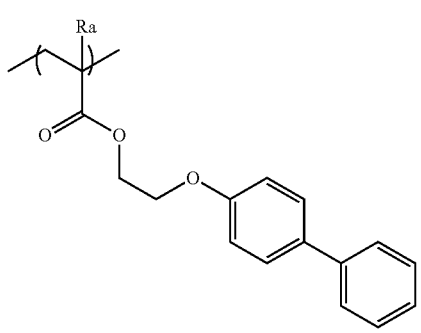
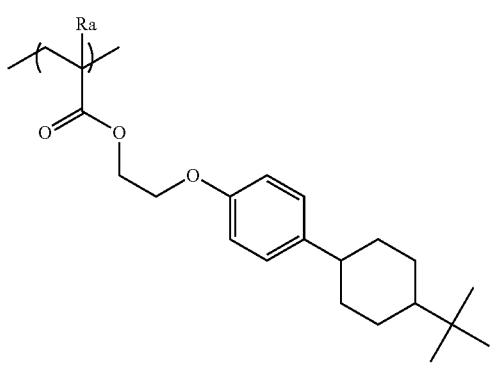
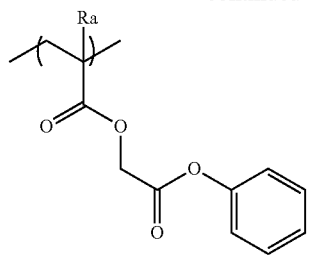
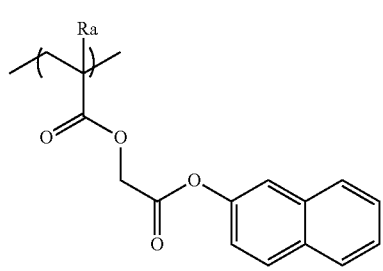
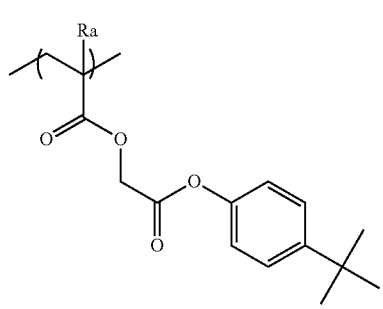
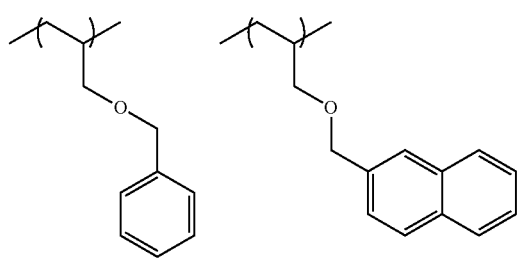
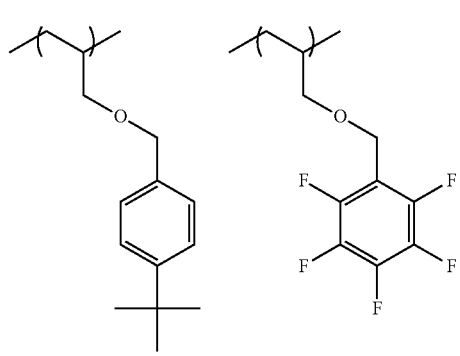

-continued
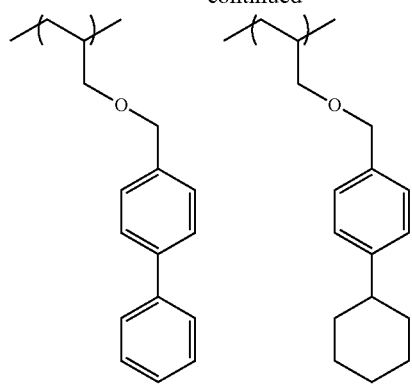
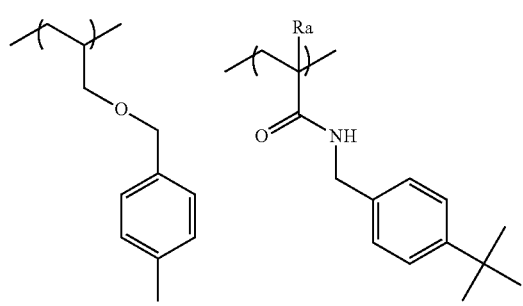
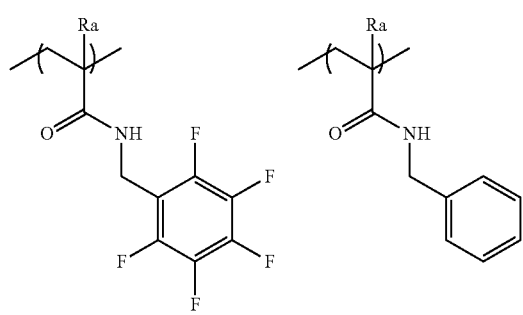
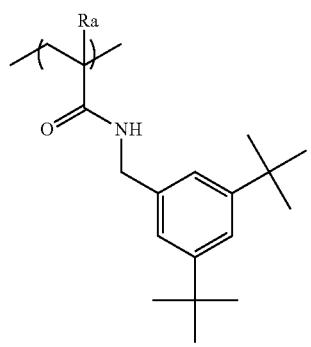
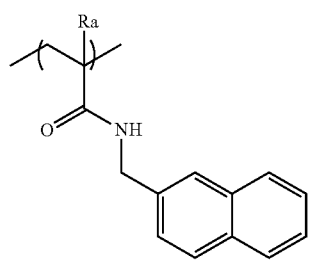
-continued
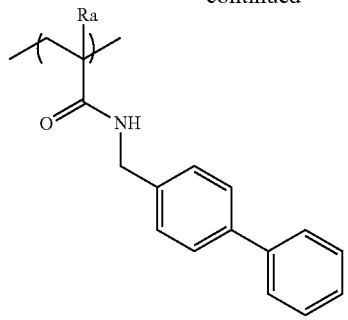
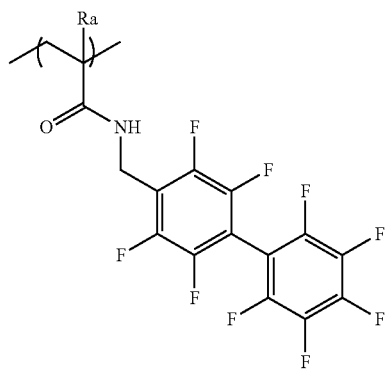
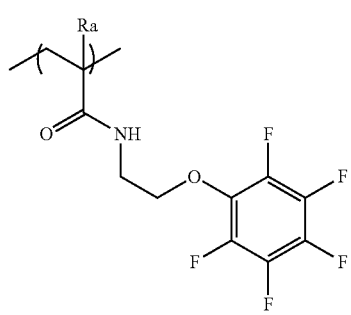
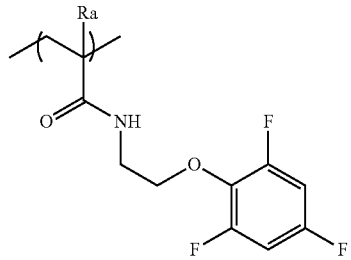
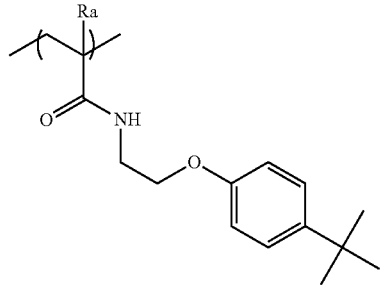

49
-continued
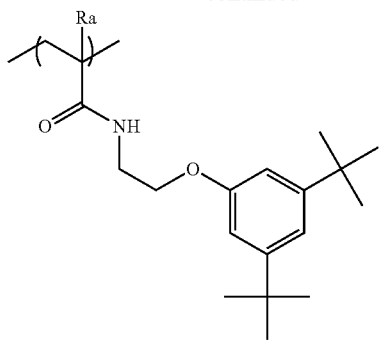
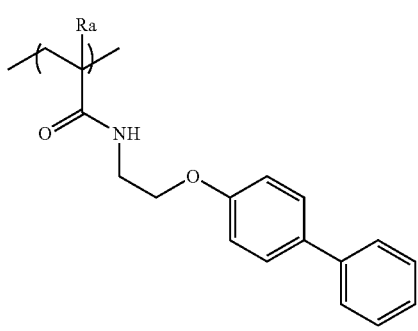
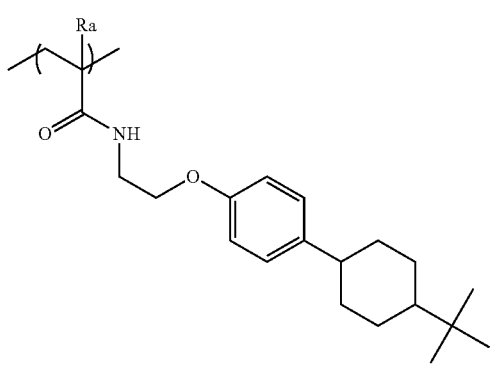
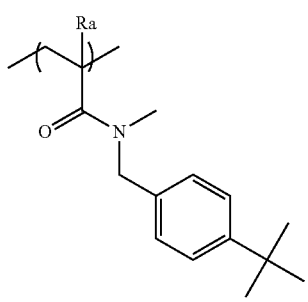
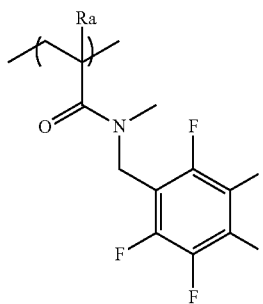
50
-continued
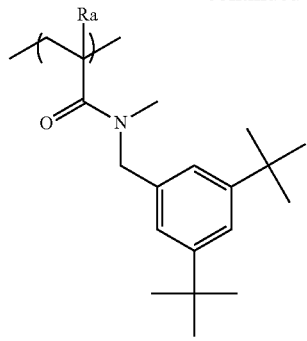
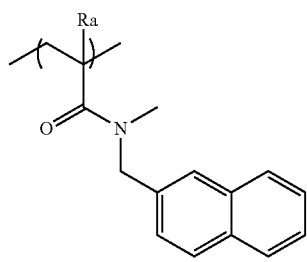
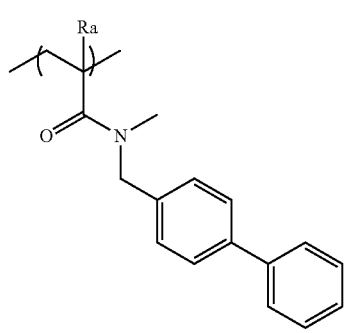
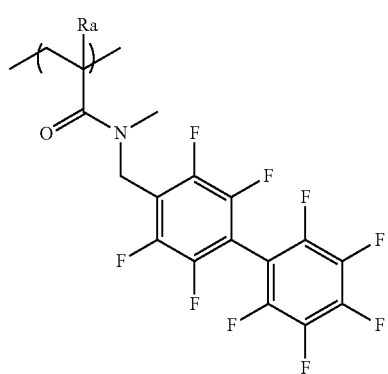
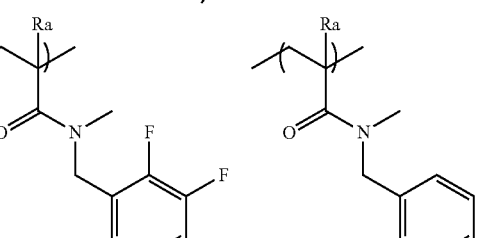
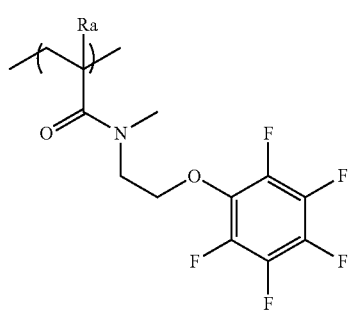

51
-continued
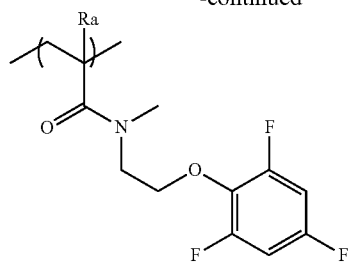
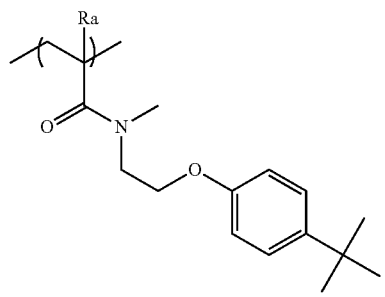
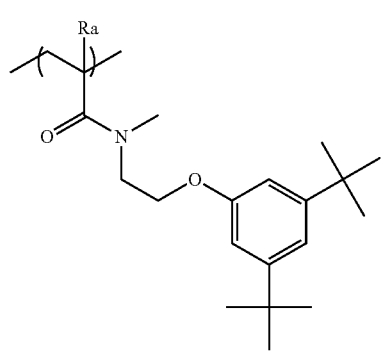
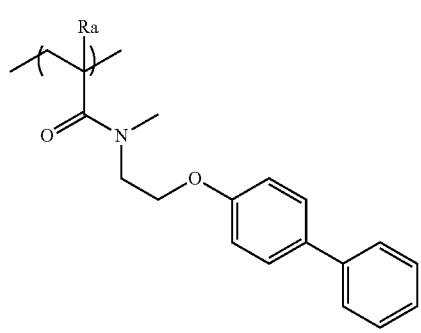
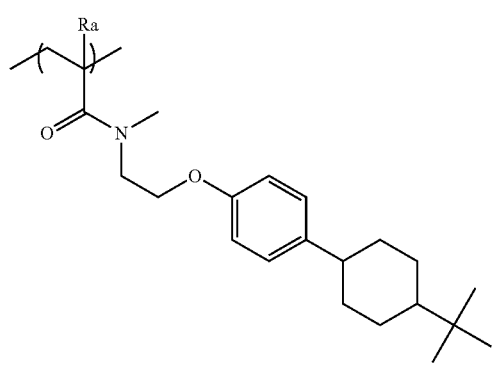
52
-continued
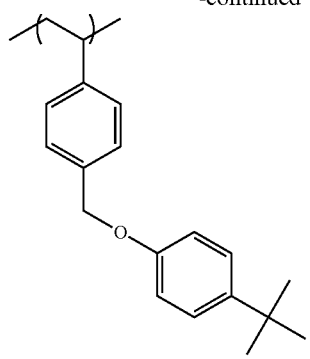
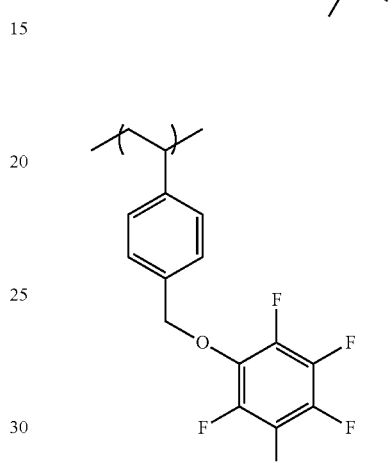
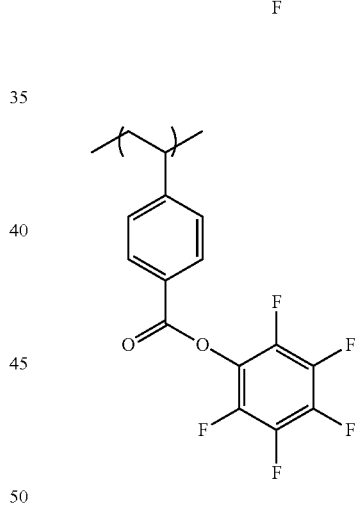
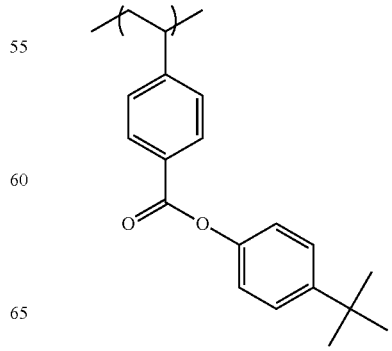

-continued
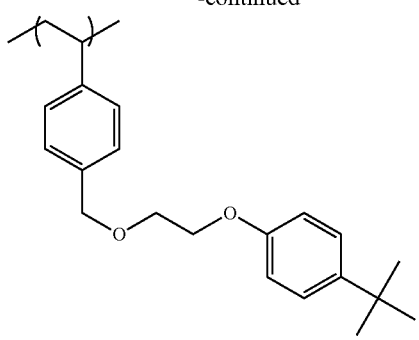
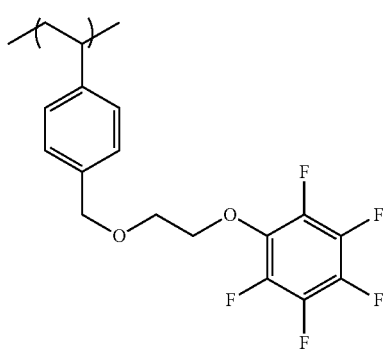
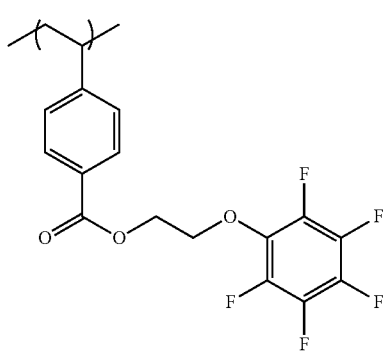
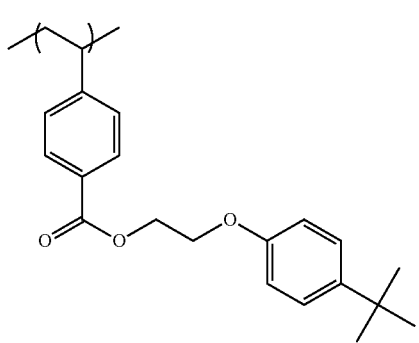
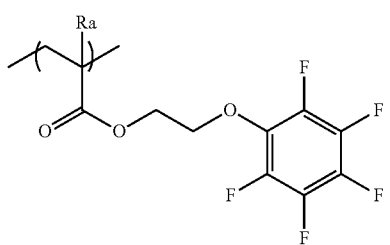
-continued
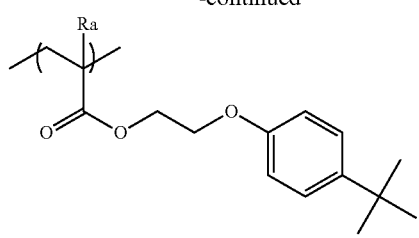
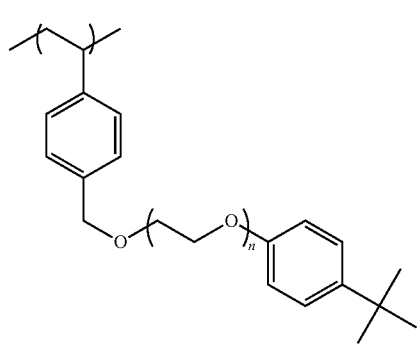
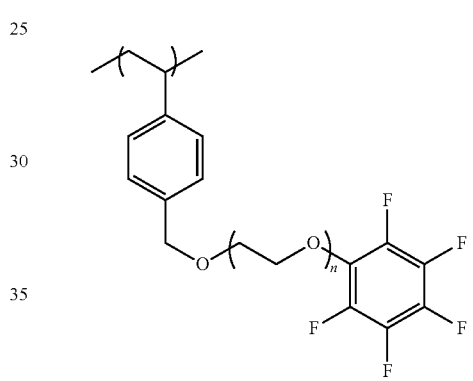
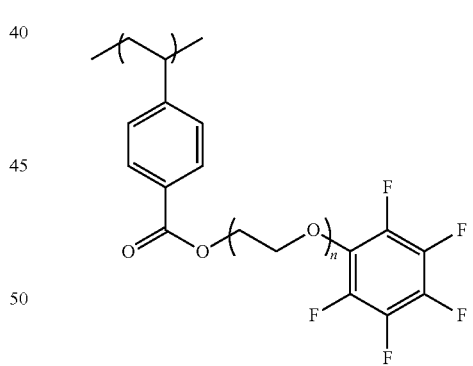
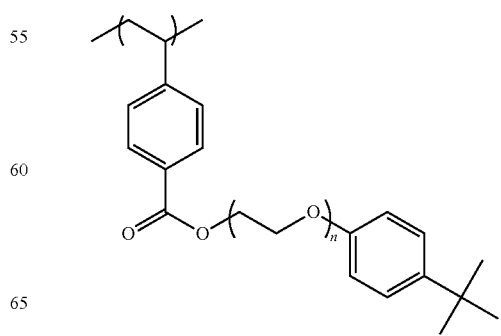

-continued

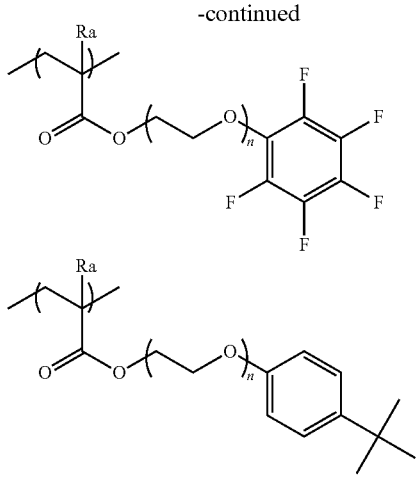

The monomers corresponding to the repeating units (R) can be synthesized by heretofore known methods. Some of the methods are described in detail in Examples to be given hereinafter.

One type of repeating unit (R) may be used alone, or two or more types thereof may be used in combination. The content of repeating unit (R) is preferably in the range of 0 to 99 mol %, more preferably 5 to 90 mol % and further more preferably 5 to 70 mol % based on all the repeating units of the resin (C).

It is preferred for the hydrophobic resin (C) to contain at least either a fluorine atom or a silicon atom. The manner in which the fluorine atom or silicon atom is introduced in the resin is not particularly limited. The fluorine atom or silicon atom may be contained in any of the above-mentioned repeating units. Alternatively, the fluorine atom or silicon atom may be contained in other repeating units.

This brings about an uneven distribution of the resin (C) in a surface layer portion of the film formed from the actinic-ray- or radiation-sensitive resin composition. When the immersion medium is water, the receding contact angle of the surface of the film with water is increased with the result that the immersion water tracking property can be enhanced.

The receding contact angle of the film is preferably in the range of 60° to 90°, more preferably 65° or greater, further more preferably 70° or greater and most preferably 75° or greater at the exposure temperature, generally room temperature 23±3° C. in a humidity of 45±5%.

Although the resin (C) is unevenly distributed on the interface as mentioned above, differing from a surfactant, the resin does not necessarily have to have a hydrophilic group in its molecule and does not need to contribute toward uniform mixing of polar/nonpolar substances.

In the operation of liquid immersion exposure, it is needed for the immersion liquid to move on a wafer while tracking the movement of an exposure head involving high-speed scanning on the wafer and thus forming an exposure pattern. Therefore, the contact angle of the immersion liquid with respect to the resist film in a dynamic condition is important, and it is required for the resist to be capable of tracking the high-speed scanning of the exposure head without leaving any droplets.

The introduction of at least either a fluorine atom or a silicon atom in the resin (C) increases the hydrophobicity (water tracking property) of the resist surface and reduces the occurrence of development residue (scum).

It is preferred for the repeating unit containing a fluorine atom to be a repeating unit containing as a partial structure an alkyl group having a fluorine atom, a cycloalkyl group having a fluorine atom or an aryl group having a fluorine atom.

The alkyl group having a fluorine atom is a linear or branched alkyl group whose at least one hydrogen atom is replaced by a fluorine atom. The alkyl group preferably has 1 to 10 carbon atoms, more preferably 1 to 4 carbon atoms. A further other substituent may be introduced in the alkyl group.

The cycloalkyl group having a fluorine atom is a mono- or polycycloalkyl group whose at least one hydrogen atom is replaced by a fluorine atom. A further other substituent may be introduced in the cycloalkyl group.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

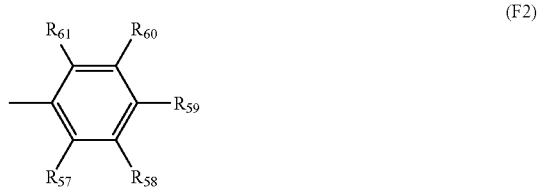

(F2)

(F3)

(F4)

In general formulae (F2) to (F4), each of $R_{57}$ to $R_{68}$ independently represents a hydrogen atom, a fluorine atom or an alkyl group (linear or branched), provided that at least one of each of $R_{57}$-$R_{61}$, at least one of each of $R_{62}$-$R_{64}$ and at least one of each of $R_{65}$-$R_{68}$ represent a fluorine atom or an alkyl group (preferably having 1 to 4 carbon atoms) having at least one hydrogen atom thereof substituted with a fluorine atom.

It is preferred that all of $R_{57}$-$R_{61}$ and $R_{65}$-$R_{67}$ represent fluorine atoms. Each of $R_{62}$, $R_{63}$ and $R_{68}$ preferably represents a fluoroalkyl group (especially having 1 to 4 carbon atoms), more preferably a perfluoroalkyl group having 1 to 4 carbon atoms. When each of $R_{62}$ and $R_{63}$ represents a perfluoroalkyl group, $R_{64}$ preferably represents a hydrogen atom. $R_{62}$ and $R_{63}$ may be bonded with each other to thereby form a ring.

Specific examples of the groups of general formula (F2) include a p-fluorophenyl group, a pentafluorophenyl group, a 3,5-di(trifluoromethyl)phenyl group and the like. Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro (2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include $-C(CF_3)_2OH$, $-C(C_2F_5)_2OH$, $-C(CF_3)(CF_3)OH$, $-CH(CF_3)OH$ and the like. $-C(CF_3)_2OH$ is preferred.

The partial structure containing a fluorine atom may be directly bonded to the principal chain, or may be bonded to the principal chain through a group selected from the group consisting of an alkylene group, a phenylene group, an ether group, a thioether group, a carbonyl group, an ester group, an amido group, a urethane group and a ureylene group, or through a group composed of a combination of two or more of these groups.

As preferred repeating units having a fluorine atom, there can be mentioned the repeating units represented by the general formulae below.

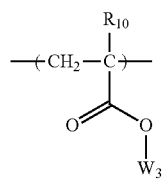

(C-Ia)

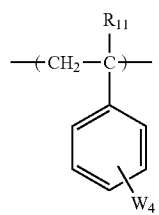

(C-Ib)

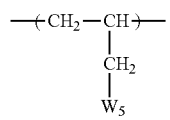

(C-Ic)

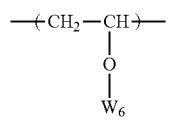

(C-Id)

In the formulae, each of $R_{10}$ and $R_{11}$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group.

Each of $W_3$ to $W_6$ independently represents an organic group containing at least one fluorine atom. As such, for example, there can be mentioned the atomic groups of general formulae (F2) to (F4) above.

Further, besides these, the following units may be introduced as the repeating unit containing a fluorine atom.

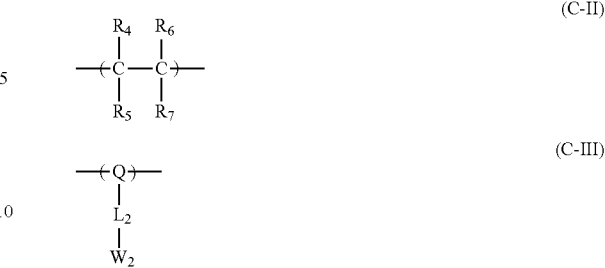

In the formulae, each of $R_4$ to $R_7$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group.

At least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, $-O-$, $-SO_2-$, $-CO-$, $-N(R)-$ (in the formula, R is a hydrogen atom or an alkyl group), $-NHSO_2-$ or a bivalent connecting group consisting of a combination of two or more of these.

Q represents an alicyclic structure. A substituent may be introduced in the alicyclic structure. The alicyclic structure may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom.

Now, the repeating units containing a silicon atom will be described below.

It is preferred for the repeating unit containing a silicon atom to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

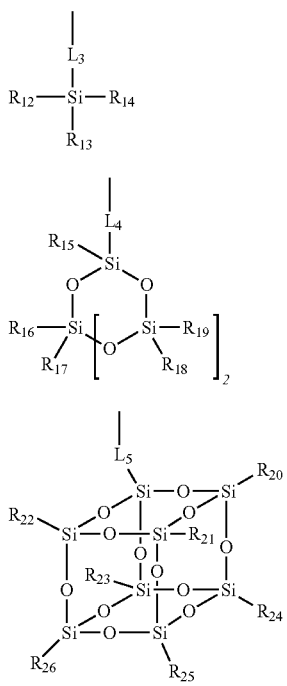

(CS-1)

(CS-2)

(CS-3)

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

In the resin (C), the content of repeating unit (c) is preferably in the range of 0 to 95 mol %, more preferably 20 to 90 mol %, further more preferably 30 to 90 mol % and most preferably 40 to 90 mol %, based on all the repeating units of the resin (C).

The content of repeating unit (c') is preferably in the range of 0 to 90 mol %, more preferably 20 to 90 mol %, further more preferably 30 to 90 mol % and most preferably 40 to 90 mol %, based on all the repeating units of the resin (C).

The content of repeating unit (c*) is preferably in the range of 0 to 70 mol %, more preferably 5 to 60 mol %, further more preferably 10 to 50 mol % and most preferably 10 to 40 mol %, based on all the repeating units of the resin (C). The content of repeating unit containing at least either a fluorine atom or a silicon atom used in combination with the repeating unit (c*) is preferably in the range of 0 to 95 mol %, more preferably 15 to 85 mol %, further more preferably 20 to 80 mol % and most preferably 25 to 75 mol %, based on all the repeating units of the resin (C).

The content of repeating unit (c") is preferably in the range of 0 to 90 mol %, more preferably 20 to 90 mol %, further more preferably 30 to 90 mol % and most preferably 40 to 90 mol %, based on all the repeating units of the resin (C).

In the resin (C), the fluorine atom or silicon atom may be introduced in the principal chain of the resin or, as a substituent, in a side chain of the resin.

The resin (C) may further comprise a repeating unit (c1) containing at least either a fluorine atom or a silicon atom, other than the repeating units (c') and (c").

The partial structure containing a fluorine atom introduced in the repeating unit (c1) can be the same as mentioned above, and as a preferred one, there can be mentioned any of the groups of general formulae (F2) to (F4) above.

The partial structure containing a silicon atom introduced in the repeating unit (c1) can be the same as mentioned above, and as a preferred one, there can be mentioned any of the groups of general formulae (CS-1) to (CS-3) above.

It is preferred for the repeating unit (c1) containing at least either a fluorine atom or a silicon atom to be a (meth)acrylate repeating unit.

Particular examples of the repeating units (c1) are shown below, which in no way limit the scope of the present invention.

In the particular examples, $X_1$ represents a hydrogen atom, —$CH_3$, —F or —$CF_3$, and $X_2$ represents —F or —$CF_3$.

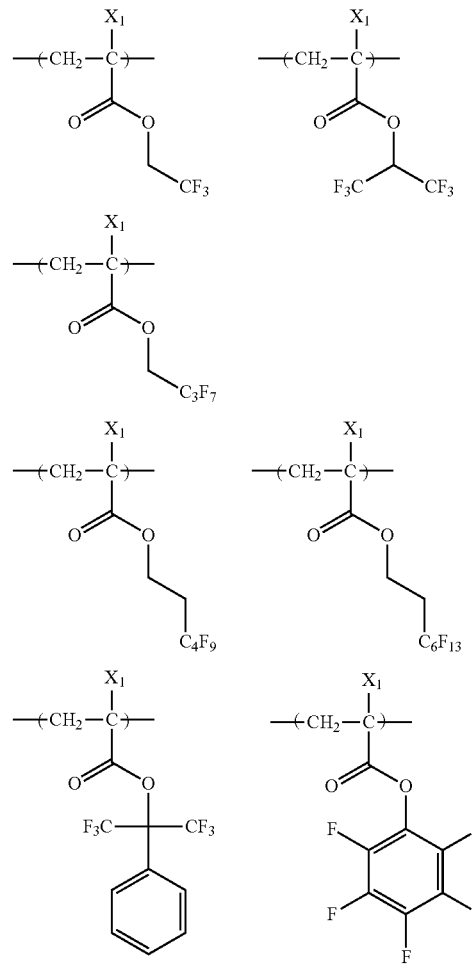

61
-continued
62
-continued
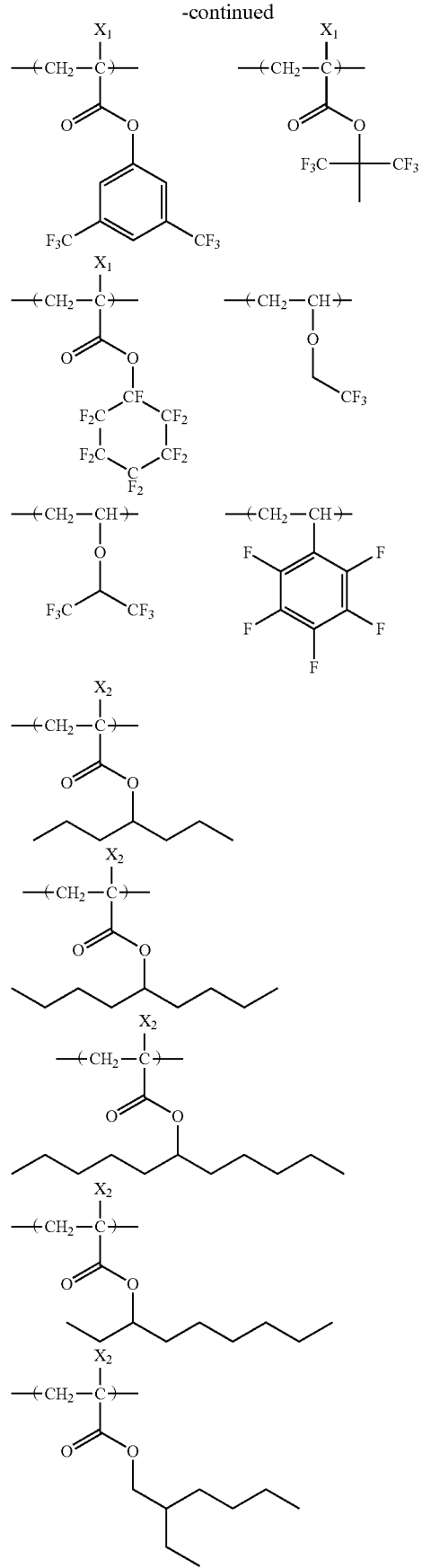
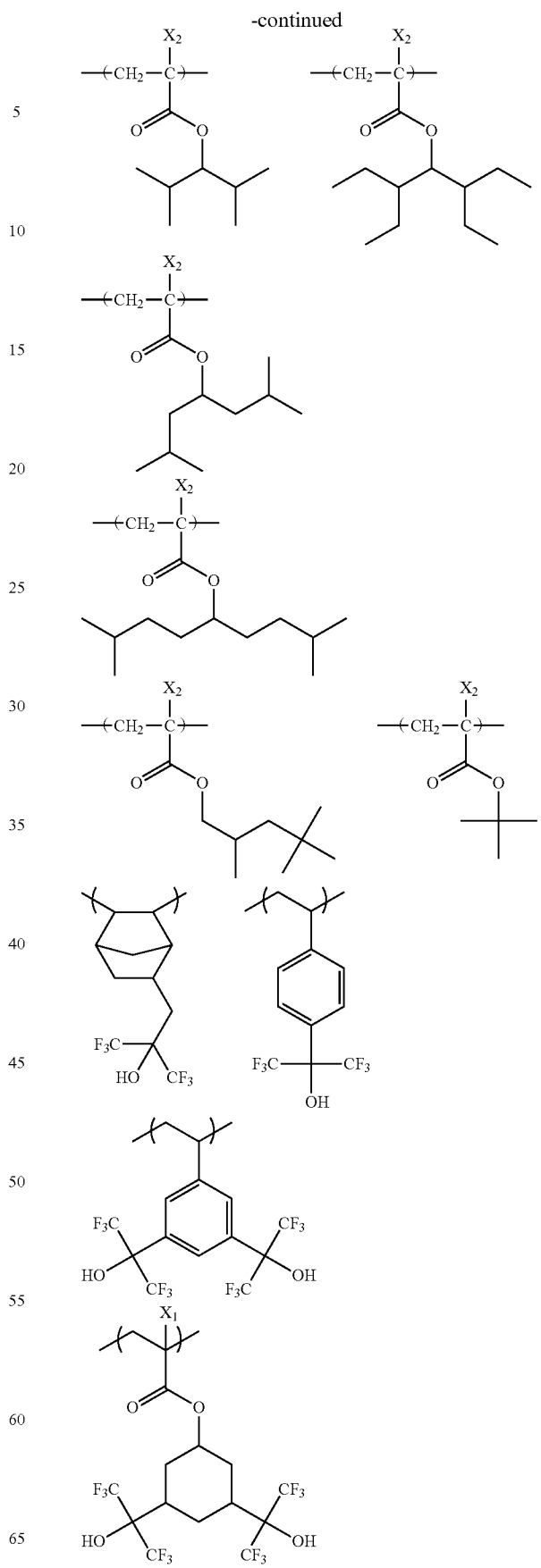

-continued
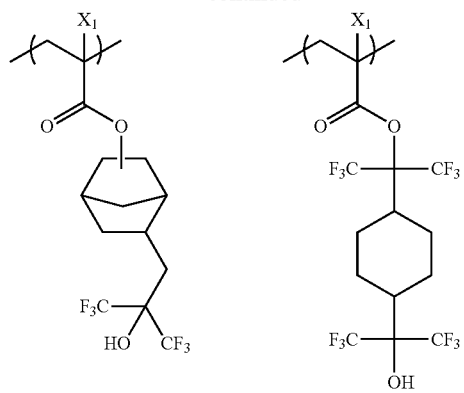
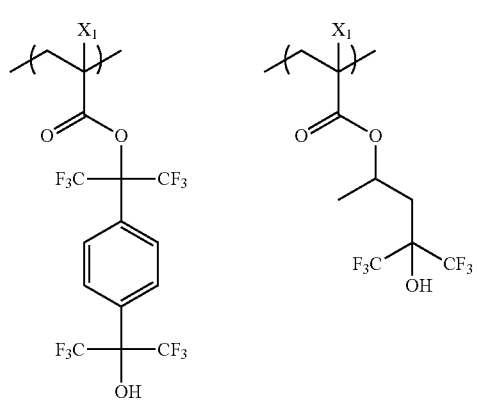
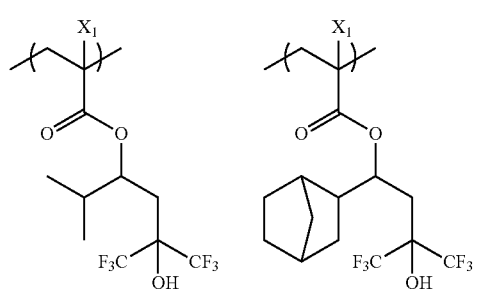
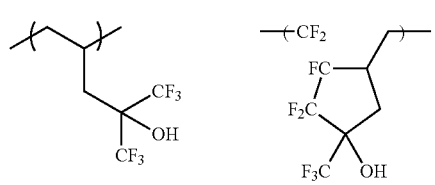
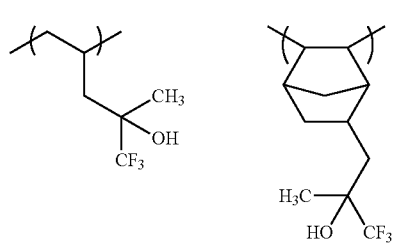
-continued
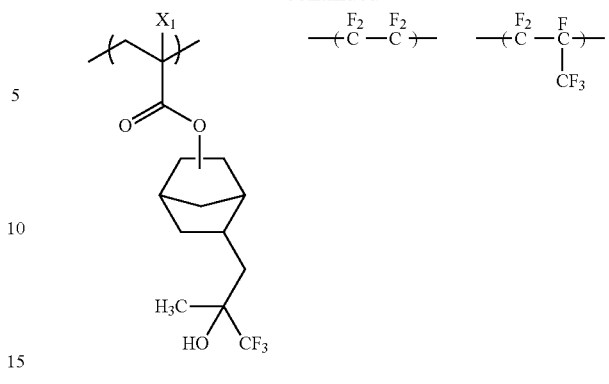
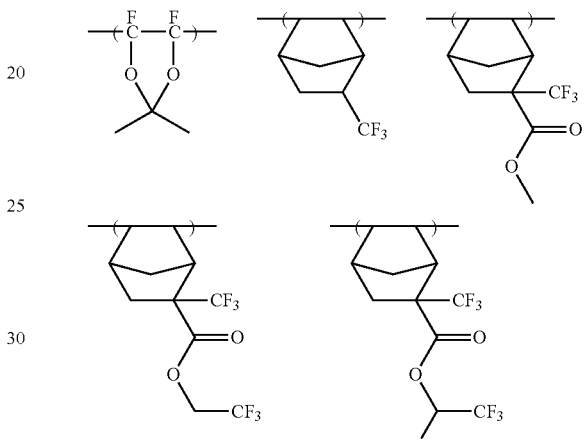
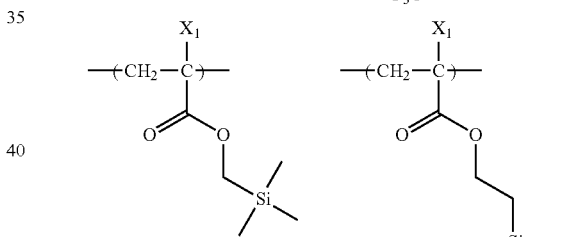
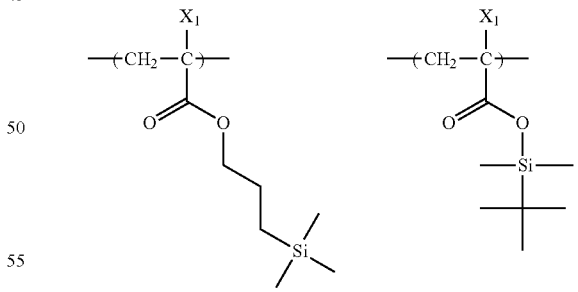
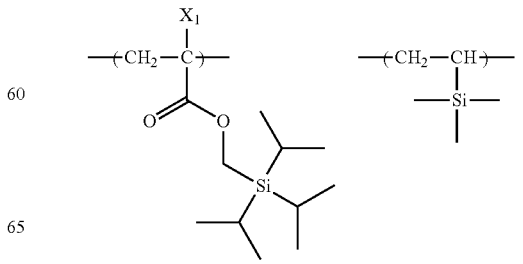

-continued

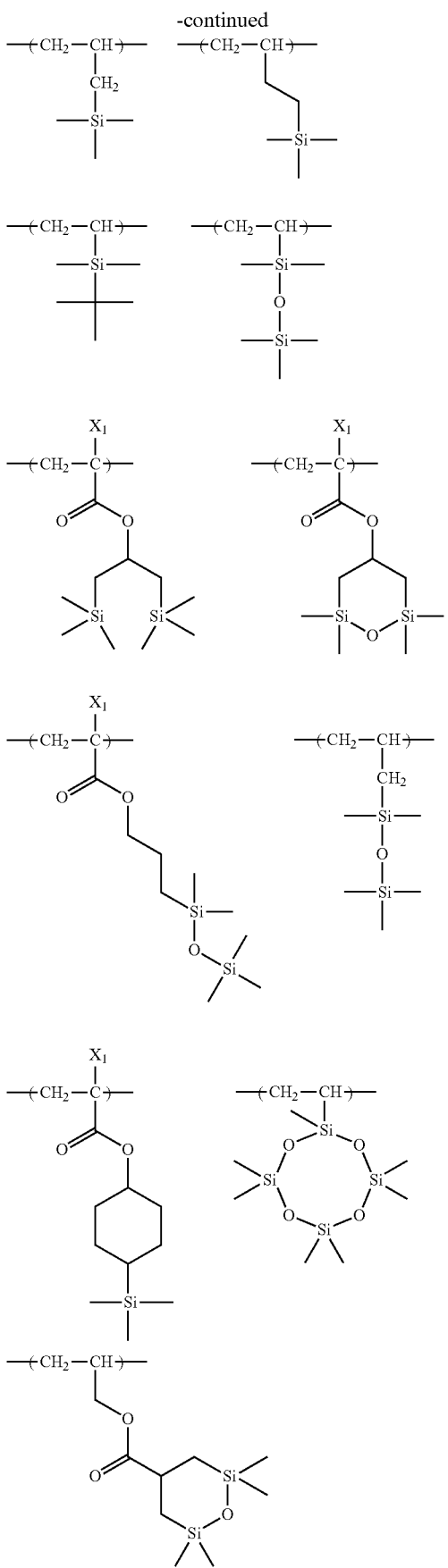

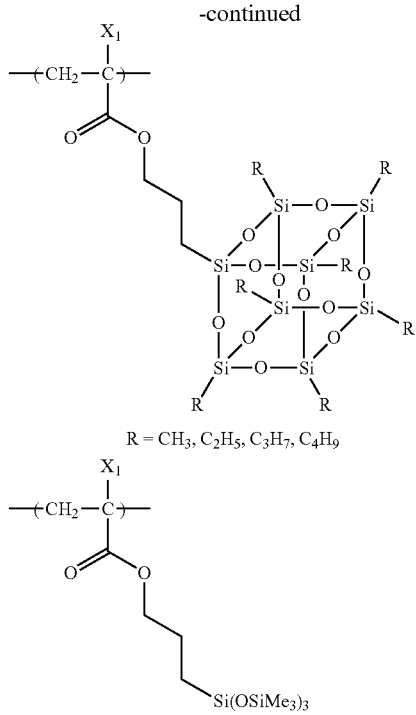

Moreover, the resin (c) may contain at least one group selected from among the following groups (x) and (z):

(x) an alkali-soluble group, and (z) a group that is decomposed by the action of an acid.

As the alkali-soluble group (x), there can be mentioned a phenolic hydroxyl group, a carboxylate group, a fluoroalcohol group, a sulfonate group, a sulfonamido group, a sulfonimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a fluoroalcohol group (preferably hexafluoroisopropanol), a sulfonimido group and a bis(alkylcarbonyl)methylene group.

As the repeating unit having an alkali-soluble group (x), preferred use is made of any of a repeating unit resulting from direct bonding of an alkali-soluble group to the principal chain of a resin like a repeating unit of acrylic acid or methacrylic acid, a repeating unit resulting from bonding, via a connecting group, of an alkali-soluble group to the principal chain of a resin and a repeating unit resulting from polymerization with the use of a chain transfer agent or polymerization initiator having an alkali-soluble group to thereby introduce the same in a polymer chain terminal.

The content of repeating units having an alkali-soluble group (x) is preferably in the range of 0 to 50 mol %, more preferably 3 to 35 mol % and still more preferably 5 to 30 mol % based on all the repeating units of the resin (c).

Specific examples of the repeating units having an alkali-soluble group (x) will be shown below, which however in no way limit the scope of the present invention.

In the formulae, Rx represents H, CH₃, CF₃ or CH₂OH.
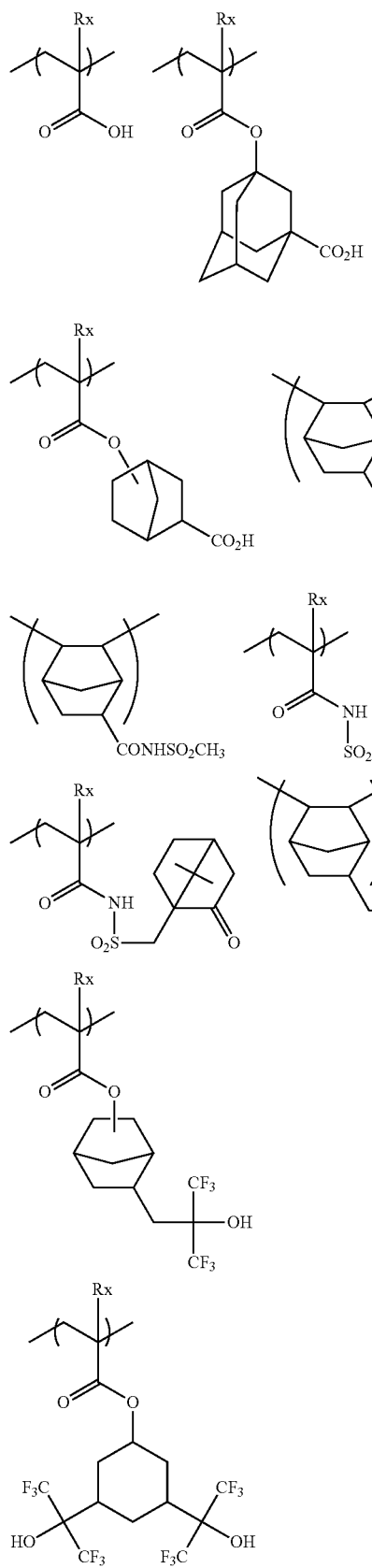
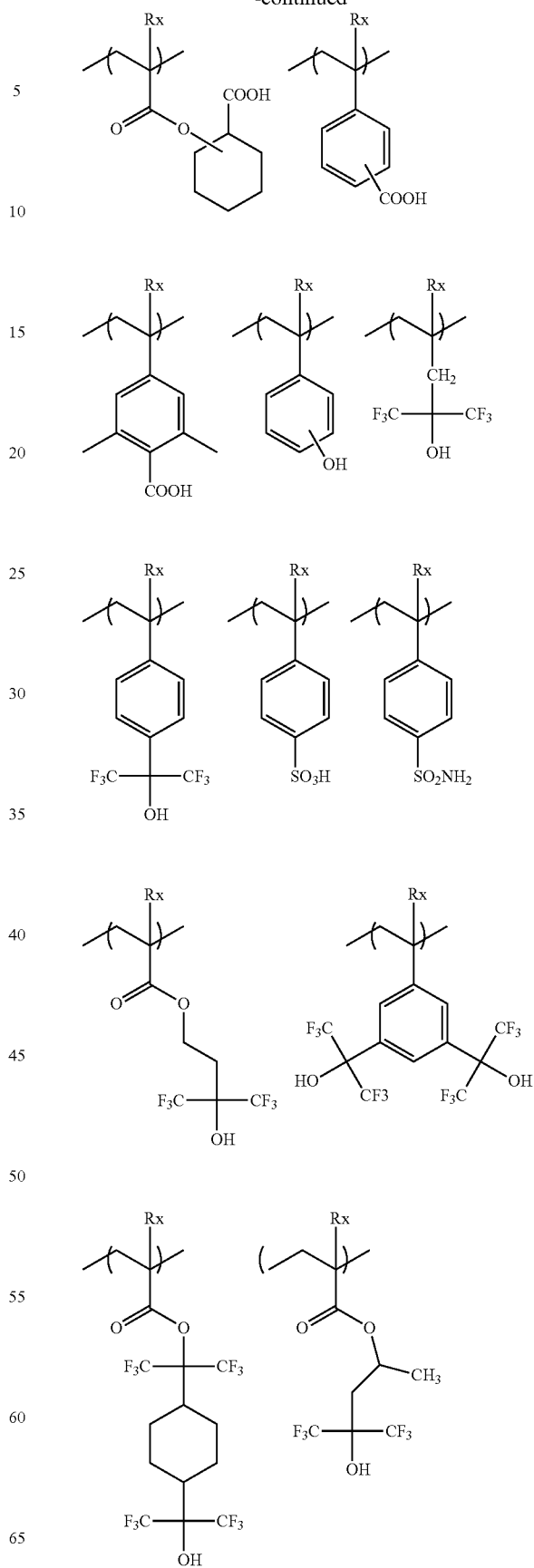

-continued

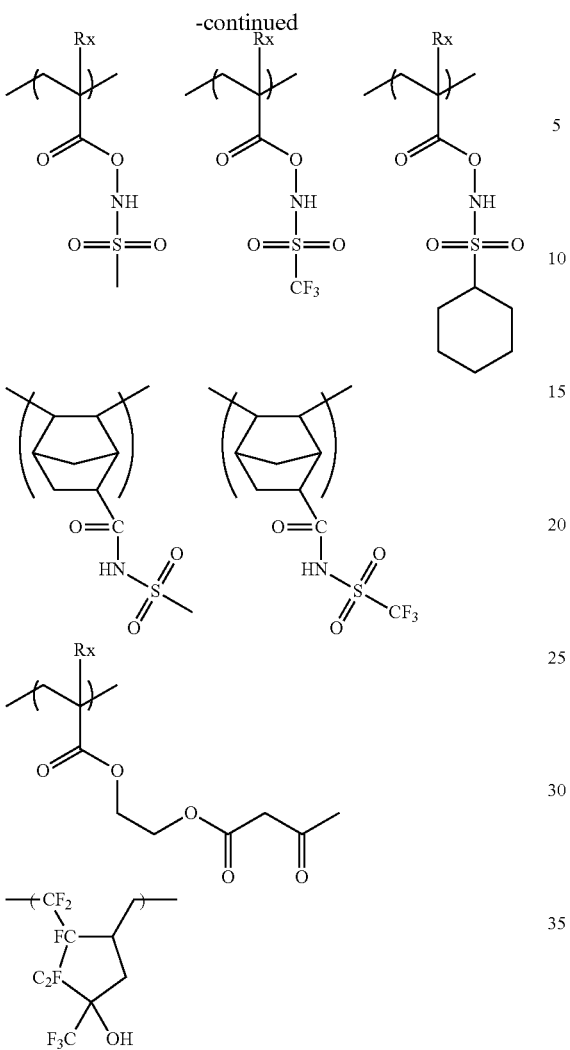

As the repeating unit having a group (z) that is decomposed by the action of an acid in the resins (c), there can be mentioned those similar to the repeating units having an acid decomposable group of the resin (B) to be described hereinafter. Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group is preferably any of those of general formula (CAI) below.

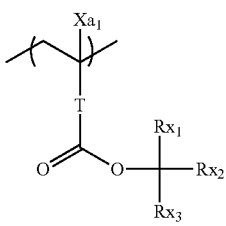

(CAI)

In general formula (CAI), $Xa_1$, T, $Rx_2$, $Rx_2$ and $Rx_3$ are as defined in connection with general formula (AI) for resin (B) to be described hereinafter.

The content ratio of repeating units having a group (z) that is decomposed by the action of an acid in the resin (C) is preferably in the range of 0 to 60 mol %, more preferably 3 to 40 mol % and still more preferably 5 to 30 mol % based on all the repeating units of the resin (C). When the resin (C) contains the group (z) that is decomposed by the action of an acid, LER can be enhanced.

The hydrophobic resin (C) may further have any of the repeating units of general formula (CIII) below.

(CIII)

In general formula (CIII), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a group containing a silicon atom.

$L_{c3}$ represents a single bond or a bivalent connecting group.

In general formula (CIII), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms. As such, there can be mentioned a phenyl group or a naphthyl group. The aryl group may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —OCO—).

The content of the repeating unit of general formula (CIII) based on all the repeating units of the resin (C) is preferably in the range of 5 to 40 mol %, more preferably 5 to 30 mol % and further more preferably 10 to 25 mol %.

Two or more types of repeating units of general formula (CIII) may be contained in the resin (C).

When the resin (C) contains fluorine atoms, the content of the fluorine atoms based on the weight average molecular weight of the resin (C) is preferably in the range of 5 to 80 mass %, and more preferably 10 to 80 mass %. The repeating unit containing fluorine atoms preferably exists in the resin (C) in an amount of 10 to 100 mass %, more preferably 30 to 100 mass %.

When the resin (C) contains silicon atoms, the content of the silicon atoms based on the weight average molecular weight of the resin (C) is preferably in the range of 2 to 50 mass %, more preferably 2 to 30 mass %. The repeating unit containing silicon atoms preferably exists in the resin (C) in an amount of 10 to 90 mass %, more preferably 20 to 80 mass %.

The standard-polystyrene-equivalent weight average molecular weight of the resin (C) is preferably in the range of 1000 to 100,000, more preferably 1000 to 50,000 and further more preferably 2000 to 15,000.

The content of resin (C) in the actinic-ray- or radiation-sensitive resin composition can be appropriately regulated so that the receding contact angle of the actinic-ray- or radiation-sensitive resin film falls within the above range. Based on the total solids of the actinic-ray- or radiation-sensitive resin composition, the content is preferably in the range of 0.01 to 20 mass %, more preferably 0.1 to 10 mass %, further more preferably 0.1 to 9 mass % and most preferably 0.5 to 8 mass %.

The resin (C) can be synthesized and purified in the same manner as to be described hereinafter in connection with resin (B). Impurities, such as metals, should naturally be of low quantity. The content of residual monomers and oligomer components is preferably in the range of 0 to 10 mass %, more preferably 0 to 5 mass % and further more preferably 0 to 1 mass %. If so, there can be obtained a resist being free from a change of in-liquid foreign matter, sensitivity, etc., over time. From the viewpoint of resolution, resist shape, side wall of resist pattern, roughness, etc., the molecular weight distribution (Mw/Mn, also referred to as dispersity) thereof is preferably in the range of 1 to 3, more preferably 1 to 2, further more preferably 1 to 1.8 and most preferably 1 to 1.5.

A variety of commercially available products can be used as the resin (C). Alternatively, the resin (C) can be synthesized in accordance with the same routine methods (for example, radical polymerization) as for resin (B) to be described hereinafter.

One type of resin (C) may be used alone, or two or more types of resins (C) may be used in combination.

Further in the present invention, as hydrophobic resins, a resin (CP) containing at least either a fluorine atom or a silicon atom, different from the resin (C), can be used in combination with the resin (C). The resin (CP) will be described below.

[(CP) Resin Containing at Least Either a Fluorine Atom or a Silicon Atom]

The actinic-ray- or radiation-sensitive resin composition of the present invention may further contain a resin (CP) containing at least either a fluorine atom or a silicon atom, other than the resin (C). When the resin (C) and the resin (CP) are simultaneously contained in the composition, the resin (C) and the resin (CP) are unevenly distributed in a surface layer portion of the film. When water is used as an immersion medium, upon film formation, the receding contact angle of the surface of the resist film with water is increased. Accordingly, the immersion water tracking property of the film can be enhanced.

The content of resin (CP) can be appropriately regulated so that the receding contact angle of the film falls within the above range, namely, preferably 60 to 90° and more preferably 70° or greater. Based on the total solids of the actinic-ray- or radiation-sensitive resin composition, the content is preferably in the range of 0.01 to 10 mass %, more preferably 0.01 to 5 mass %, further more preferably 0.01 to 4 mass % and most preferably 0.01 to 3 mass %.

The resin (CP) is not limited as long as it is a hydrophobic resin containing none of the repeating units of general formula (1) but containing at least either a fluorine atom or a silicon atom. Preferred forms thereof are, for example, as follows.

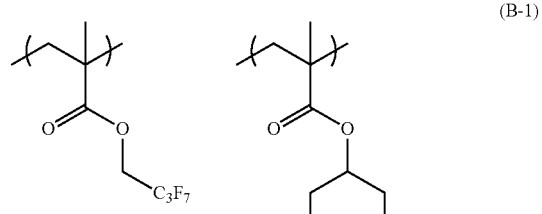

(B-1)

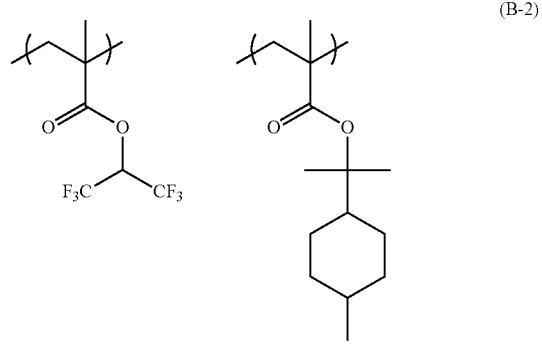

(B-2)

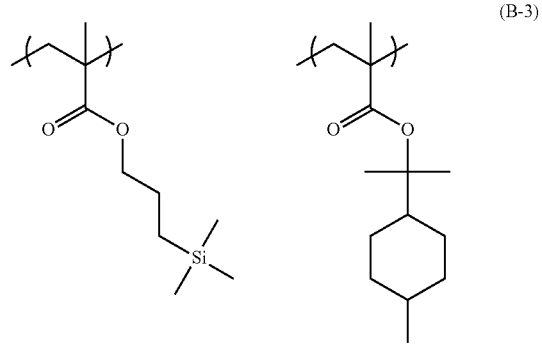

(B-3)

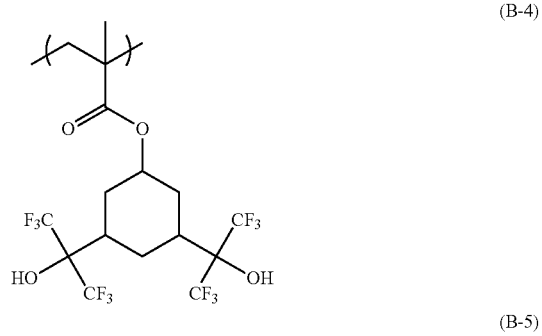

(B-4)

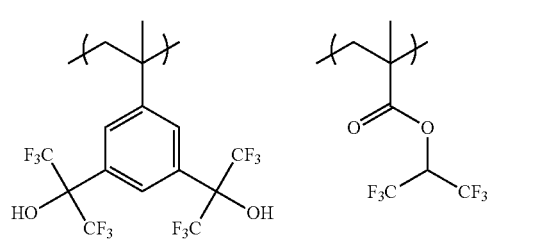

(B-5)

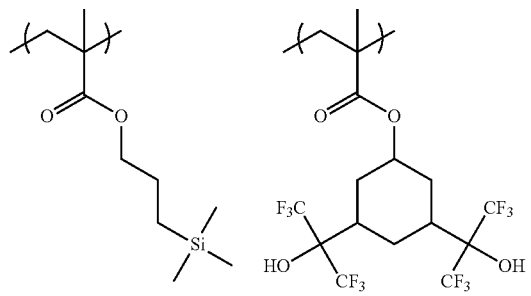
(B-6)
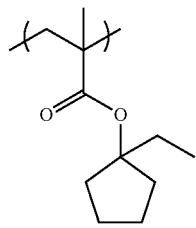
(B-11)
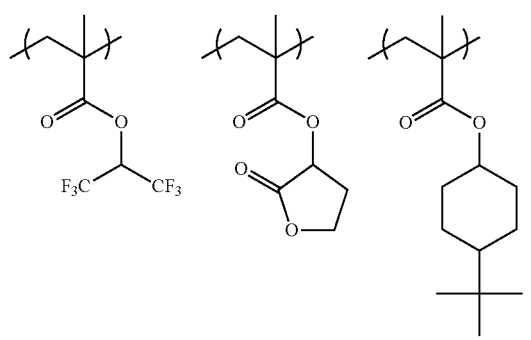
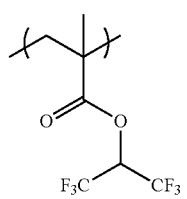
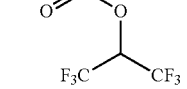
(B-12)
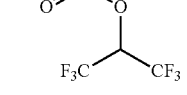
(B-13)

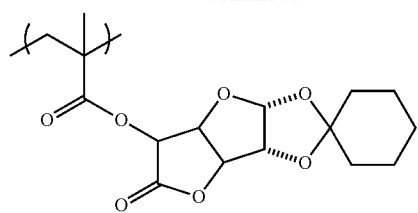
(B-14)
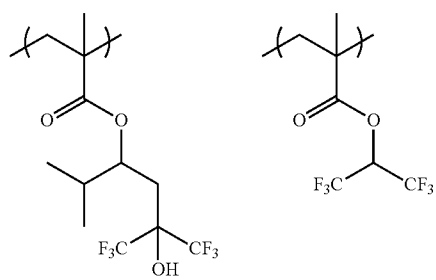
(B-15)
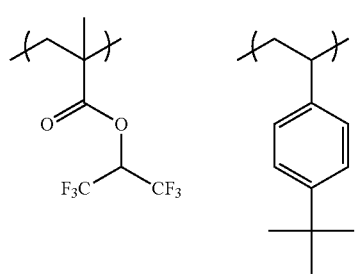
(B-16)
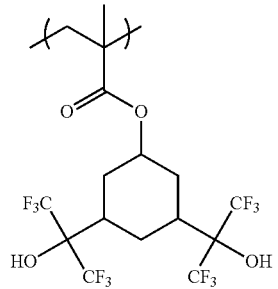
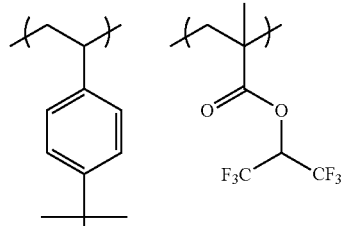
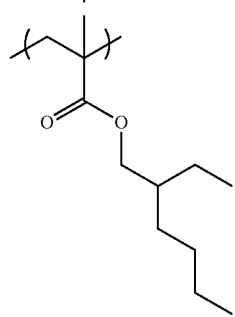
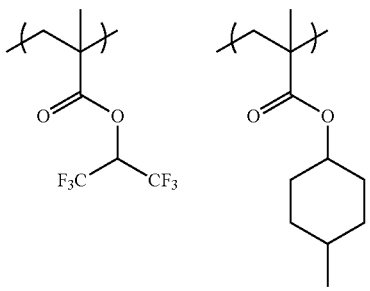
(B-17)
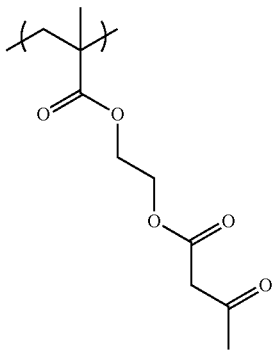
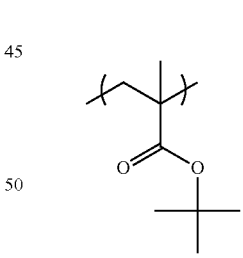
(B-18)
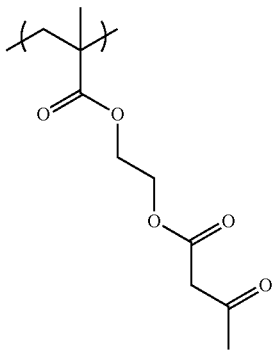
(B-19)

(B-20) 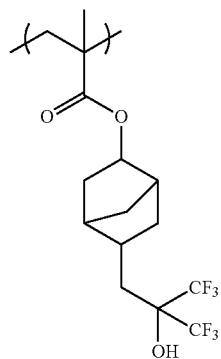
(B-24) 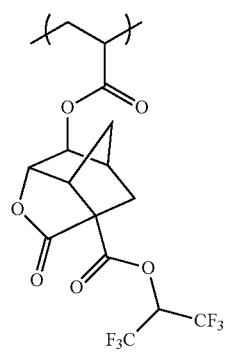
(B-21) 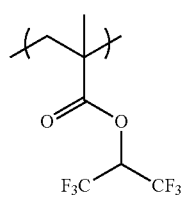 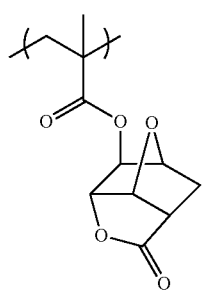
(B-25) 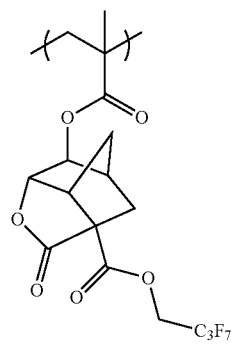
(B-22) 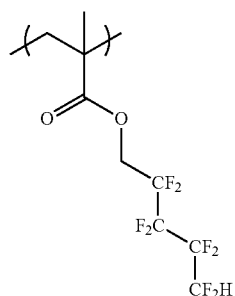 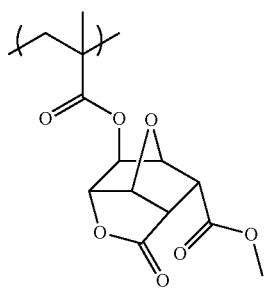
(B-26) 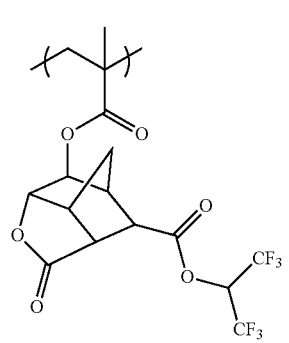
(B-23) 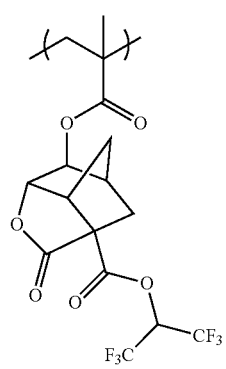
(B-27) 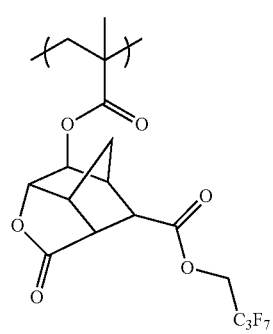

(B-28)
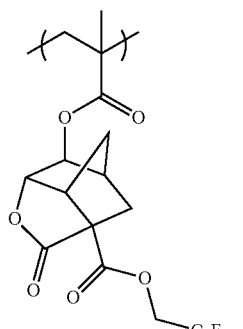 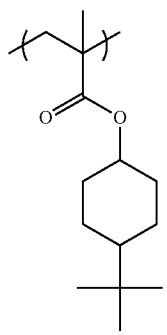
(B-29)
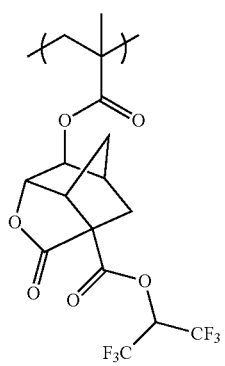 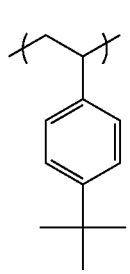
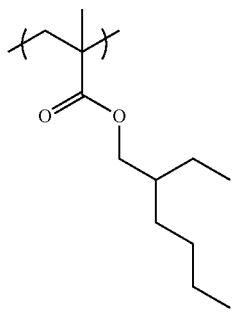
(B-30)
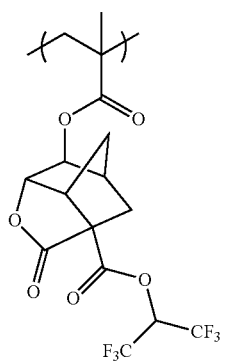 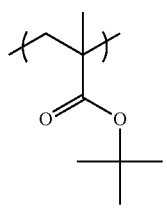
(B-31)
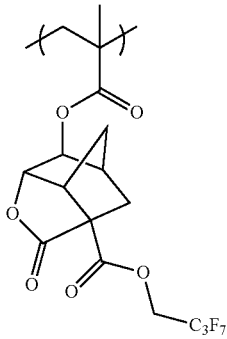 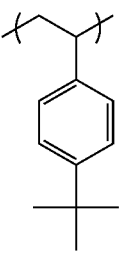
(B-32)
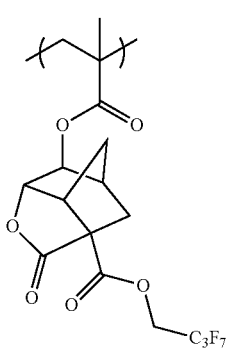 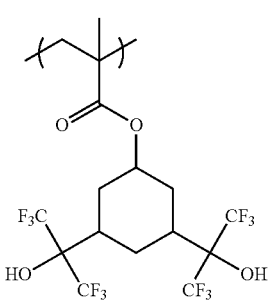
(B-33)
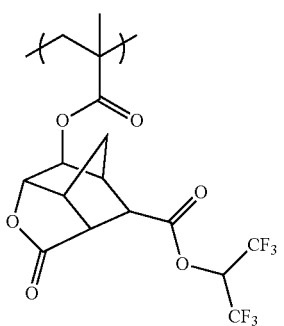 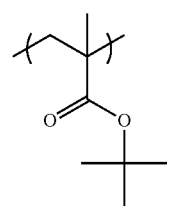
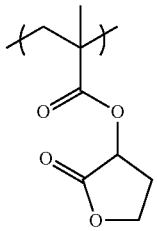
(B-34)
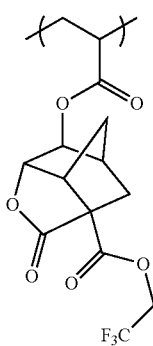 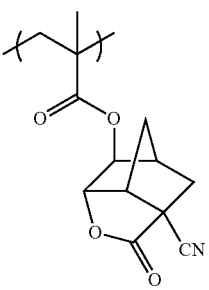

(B-35)
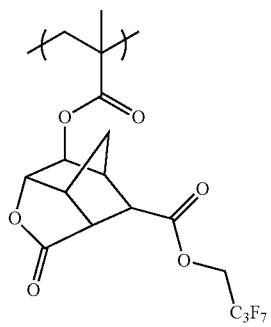
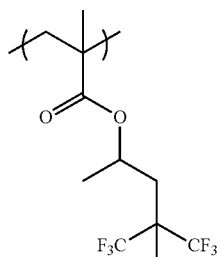
(B-36)
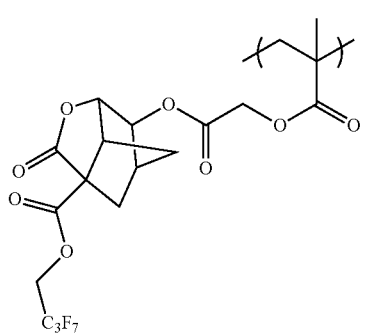
(B-37)
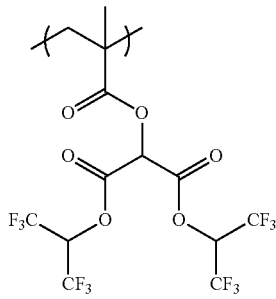
(B-38)
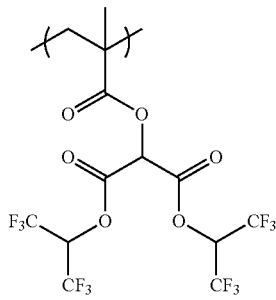
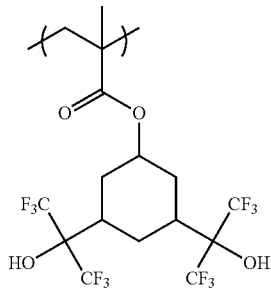
(B-39)
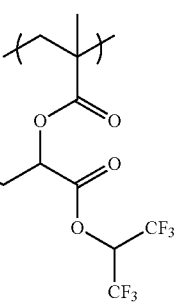
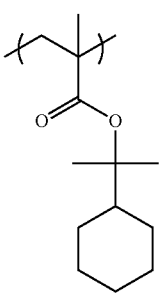
(B-40)
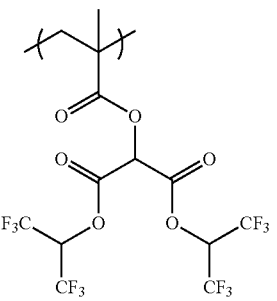
(B-41)
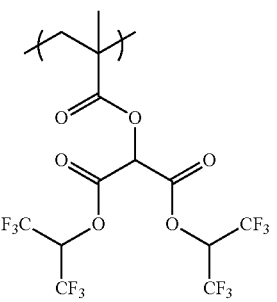
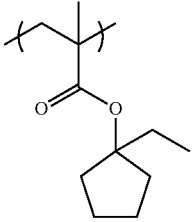
(B-42)
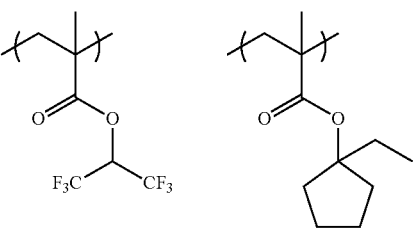

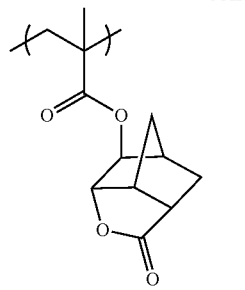
(B-43)
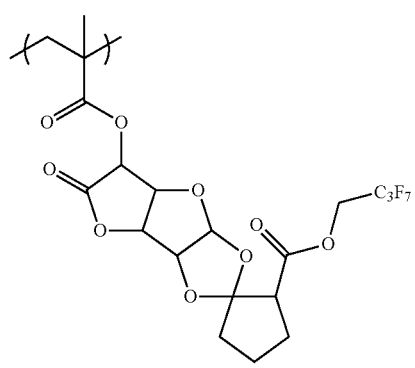
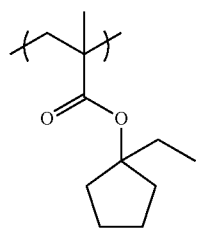 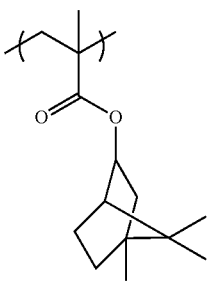
(B-44)
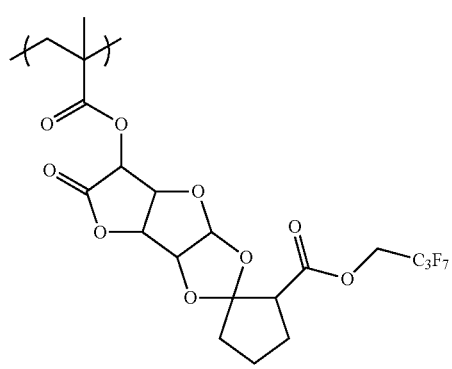
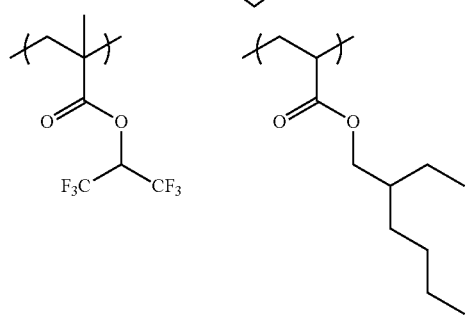
(B-45)
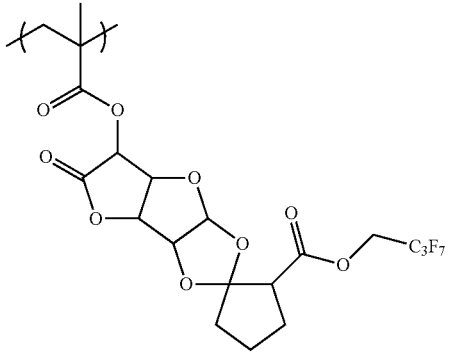
(B-46)
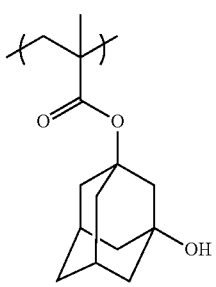
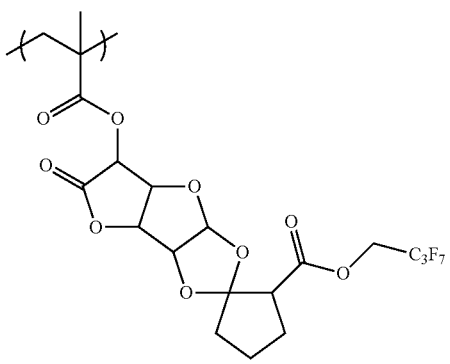
(B-47)
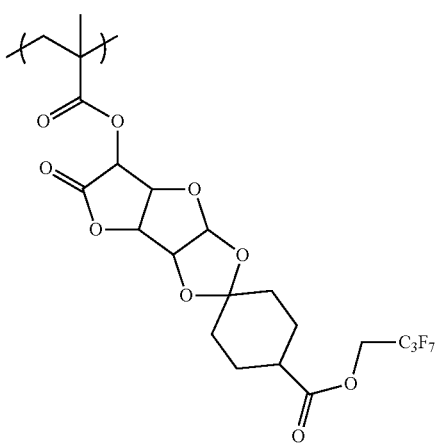
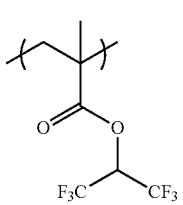

(B-48)
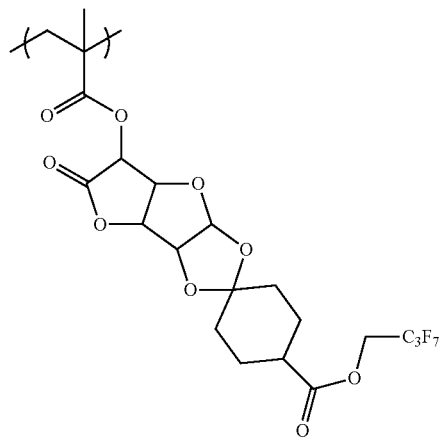
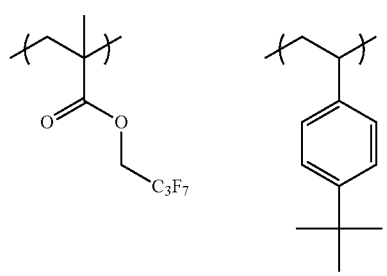
(B-49)
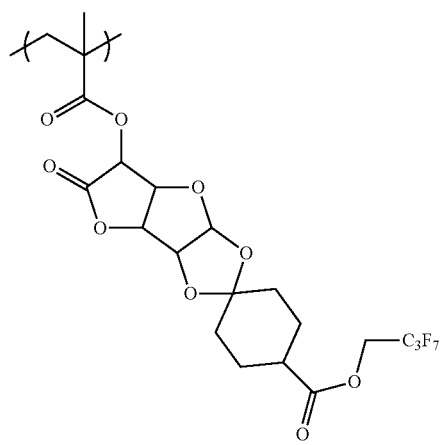
(B-50)
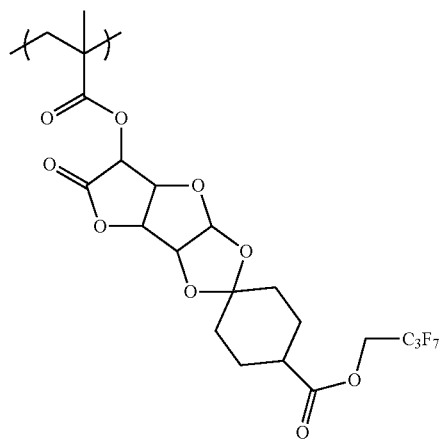
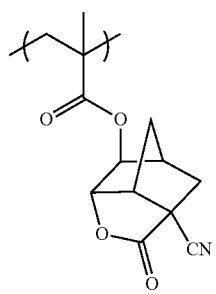
(B-51)
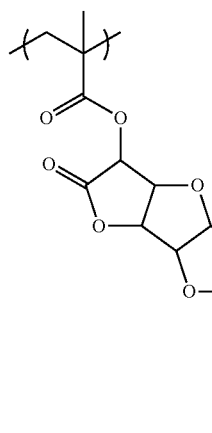
(B-52)
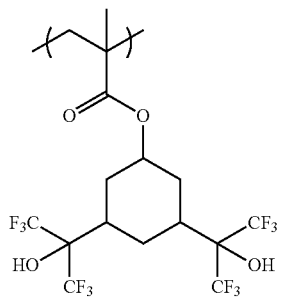

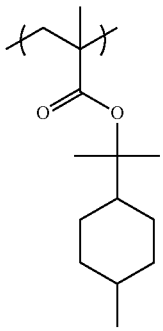

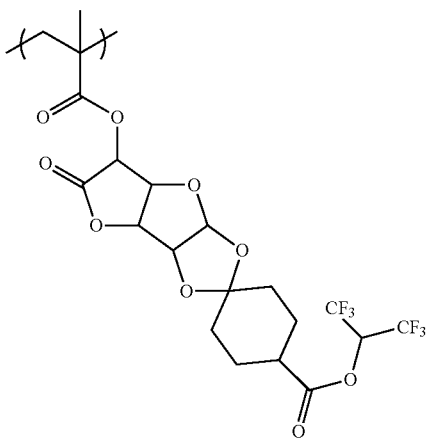
(B-53)

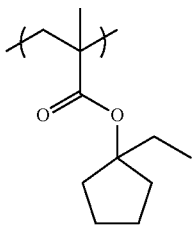

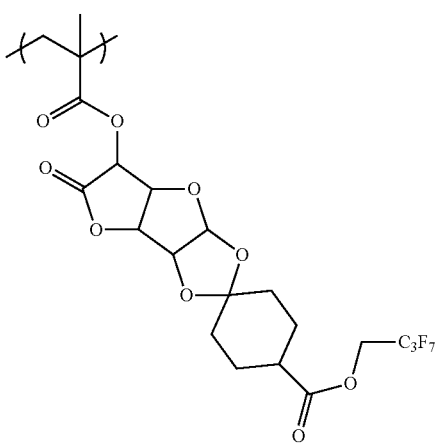
(B-54)

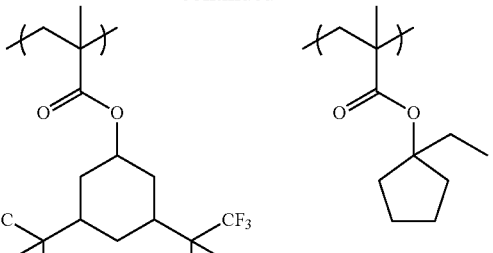
(B-55)

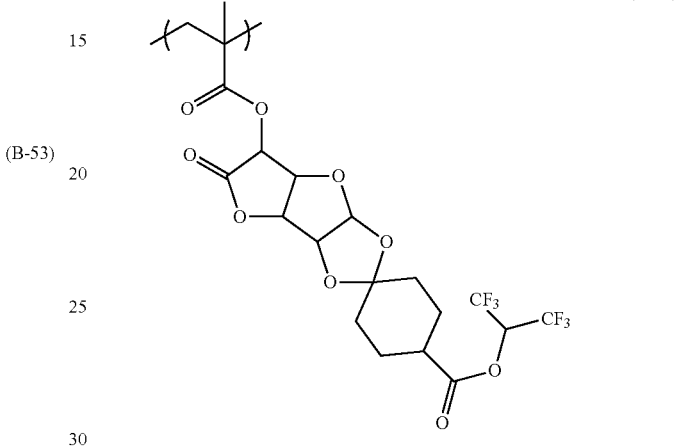

[Resin (B) that when Acted on by an Acid, Increases its Rate of Dissolution in an Alkali Developer]

The actinic-ray- or radiation-sensitive resin composition of the present invention comprises a resin (B) that when acted on by an acid, increases its rate of dissolution in an alkali developer.

In the resin (B) (hereinafter also referred to as "acid-decomposable resin"), a group that is decomposed by the action of an acid to thereby produce an alkali-soluble group (hereinafter also referred to as "acid-decomposable group") is introduced in the principal chain or side chain, or both the principal chain and the side chain, of the resin.

The resin (B) is preferably insoluble or hardly soluble in an alkali developer.

The acid-decomposable group preferably has a structure in which an alkali-soluble group is protected by a group removable by degradation upon the action of acid.

As the alkali-soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali-soluble groups with an acid eliminable group.

As the acid eliminable group, there can be mentioned, for example, $-C(R_{36})(R_{37})(R_{38})$, $-C(R_{36})(R_{37})(OR_{39})$, $-C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group is preferably any of those of the following general formula (AI).

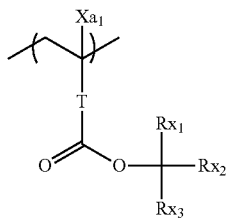

(AI)

In general formula (AI), $Xa_1$ represents a hydrogen atom, an optionally substituted methyl group, or a group represented by —$CH_2$—$R_9$. $R_9$ represents a hydroxyl group or a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a mono- or polycyclic cycloalkyl group.

At least two of $Rx_1$ to $Rx_3$ may be bonded to each other to thereby form a monocyclic or polycyclic cycloalkyl group.

As the bivalent connecting group represented by T, there can be mentioned, for example, an alkylene group, a group of the formula —(COO-Rt)- or a group of the formula —(O-Rt)-. In the formulae, Rt represents an alkylene group or a cycloalkylene group.

T is preferably a single bond or a group of the formula —(COO-Rt)-. Rt is preferably an alkylene group having 1 to 5 carbon atoms, more preferably a —$CH_2$-group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group or an adamantyl group.

The cycloalkyl group formed by at least two of $Rx_1$ to $Rx_3$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group or an adamantyl group. Monocyclic cycloalkyl groups having 5 or 6 carbon atoms are especially preferred.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

The content of the repeating unit containing a acid-decomposable group based on all the repeating units of the resin is preferably in the range of 20 to 70 mol %, and more preferably 30 to 50 mol %.

Preferred examples of the repeating unit containing a acid-decomposable group will be shown below, which however in no way limit the scope of the present invention.

In the specific examples, Rx and Xa1 each represents a hydrogen atom, $CH_3$, $CF_3$, or $CH_2OH$. Each of Rxa and Rxb represents an alkyl group having 1 to 4 carbon atoms. Z or each of Zs independently represents a substituent containing a polar group. P represents 0 or positive integer.

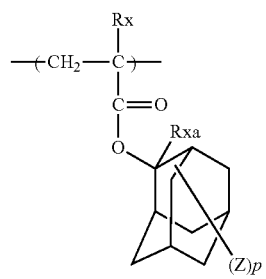

1

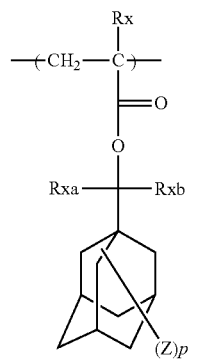

2

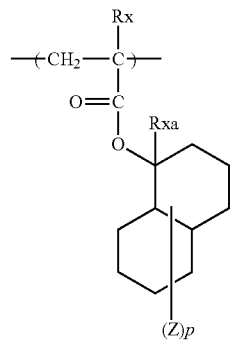

3

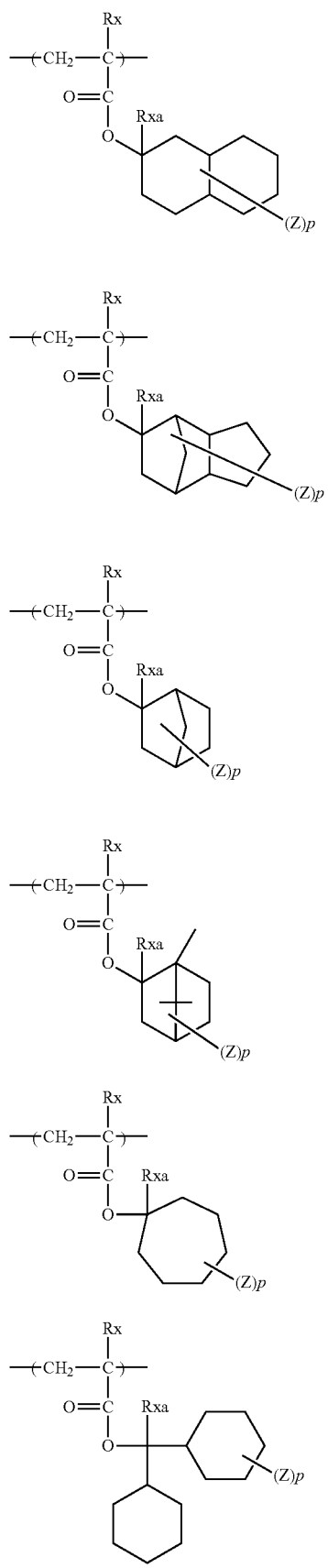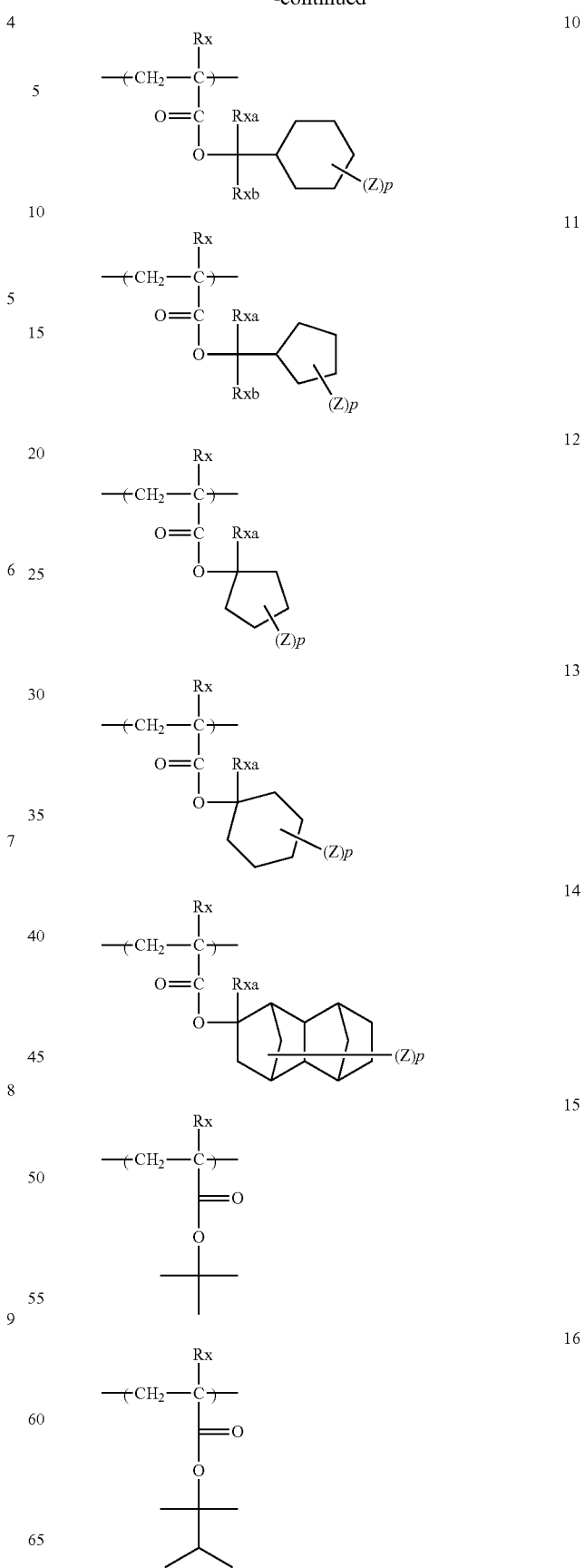

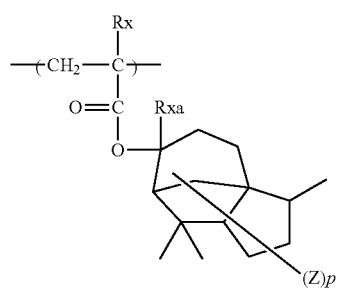
17
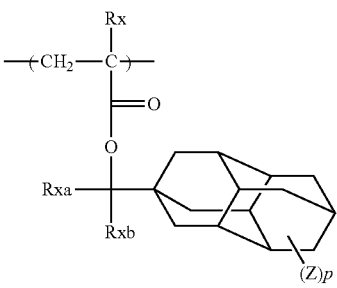
23
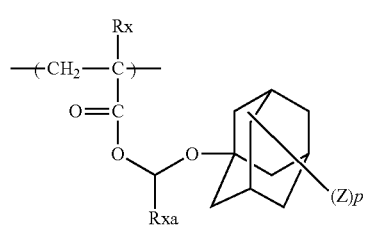
18
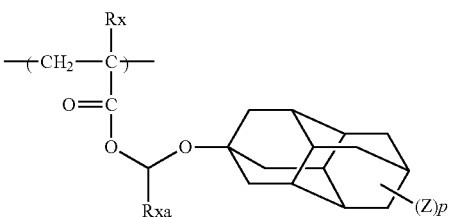
24
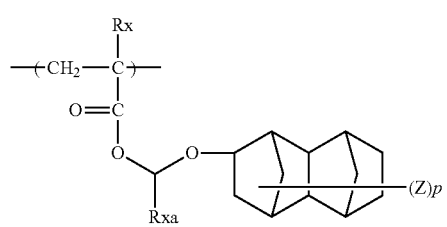
19
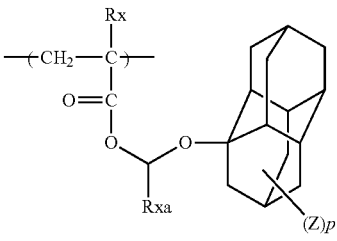
25
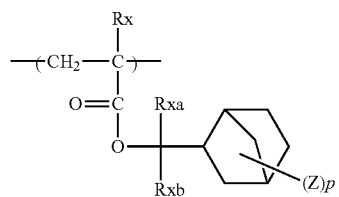
20
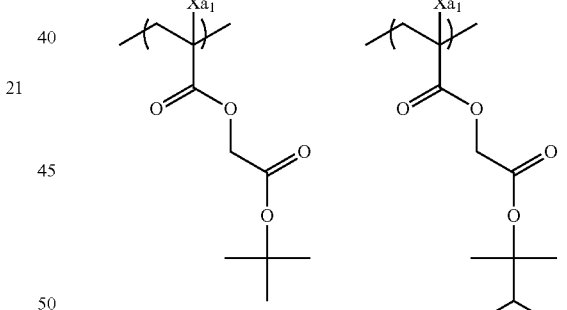
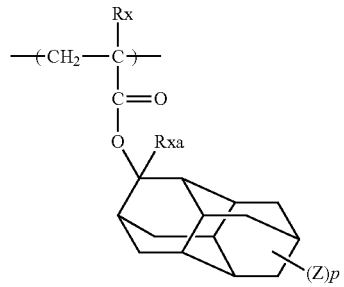
21
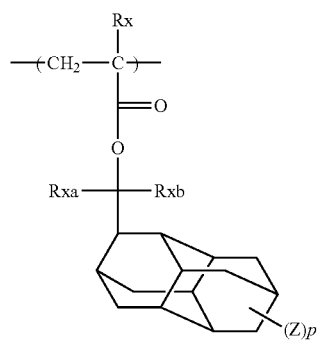
22
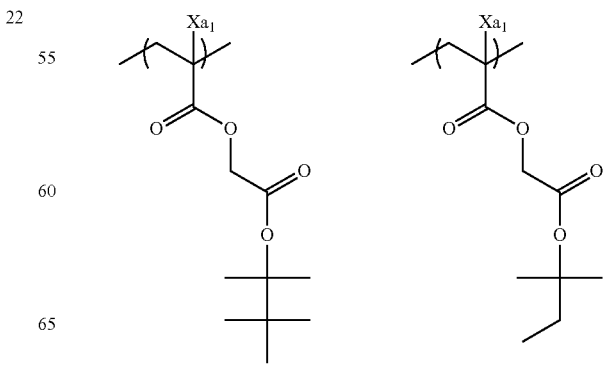

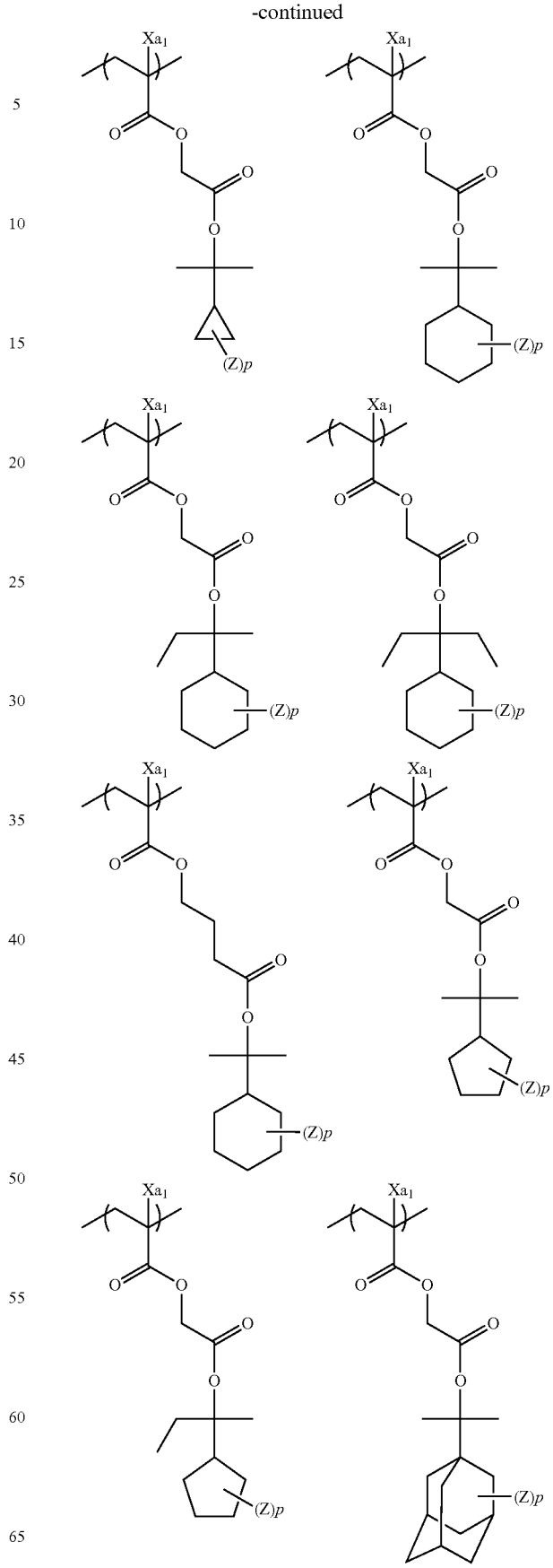

97
-continued
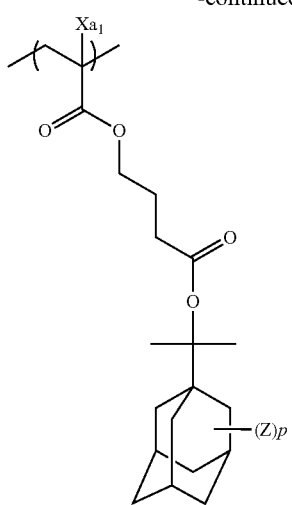
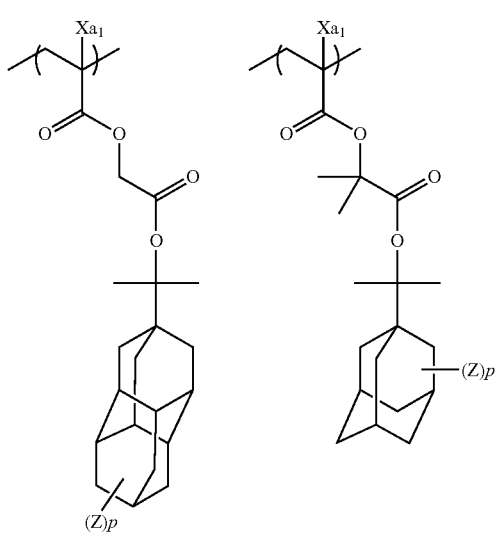
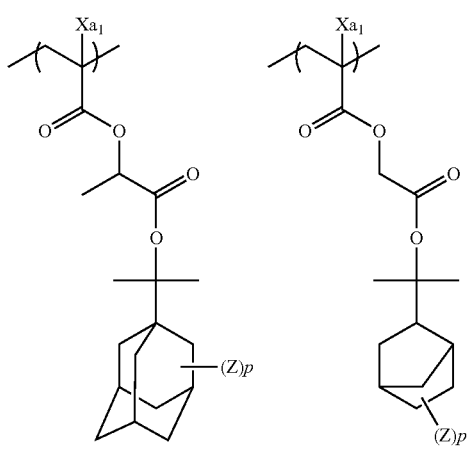
98
-continued
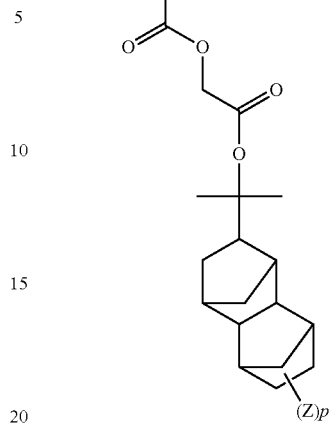
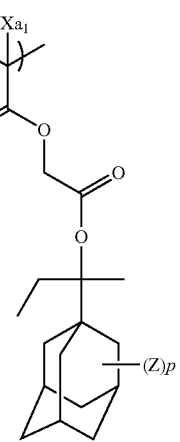
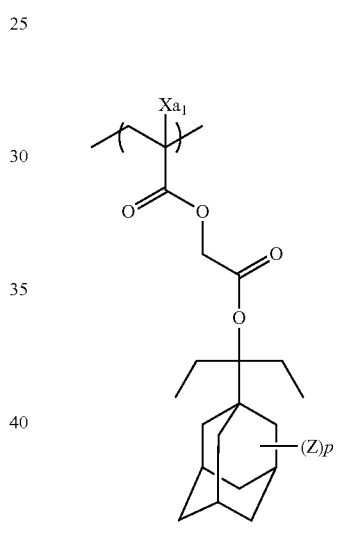
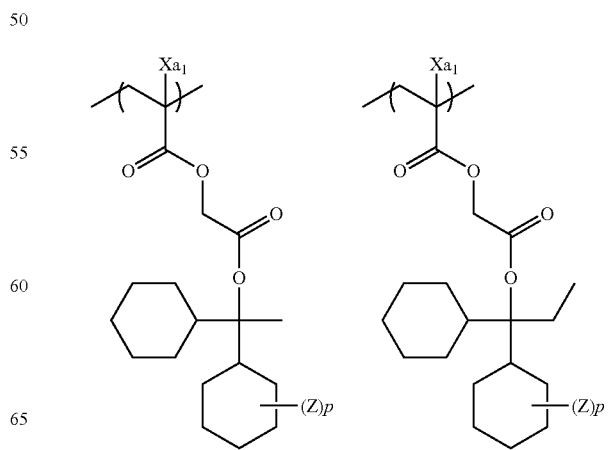

99
-continued
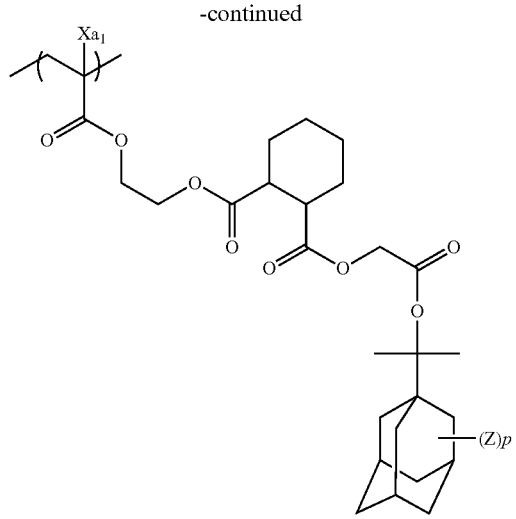
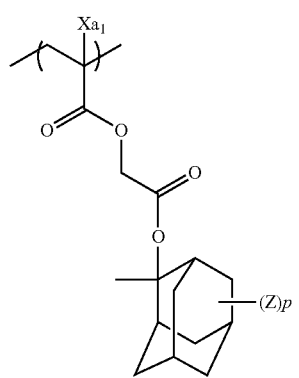
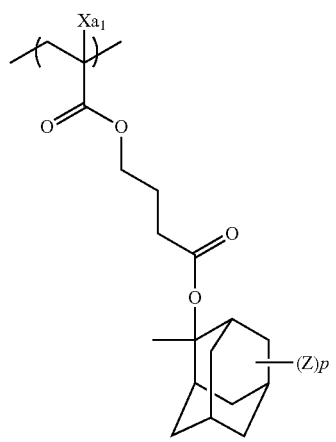
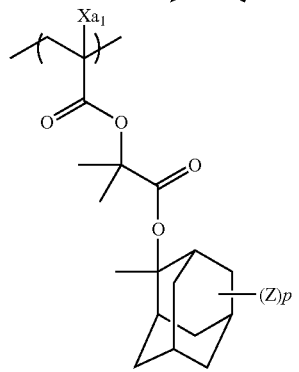
100
-continued
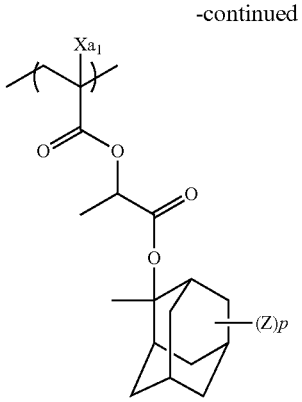
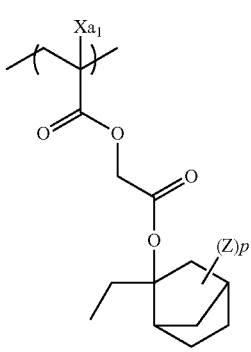
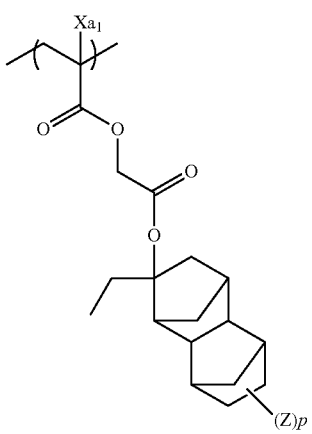
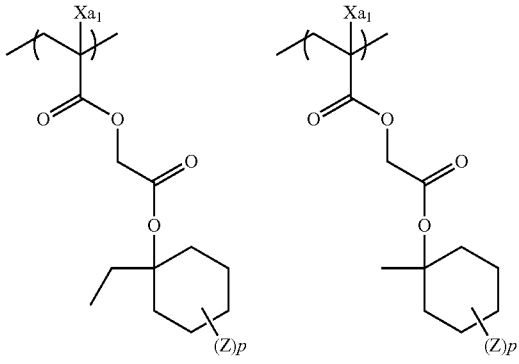

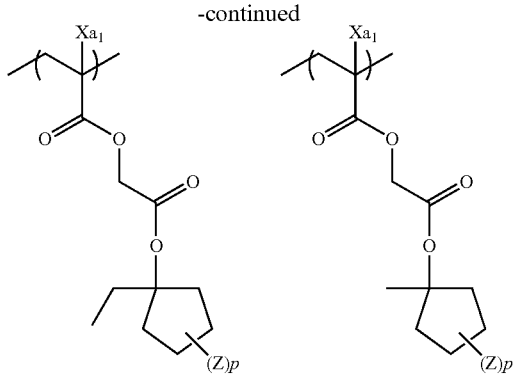

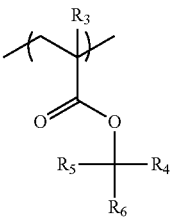

(II)

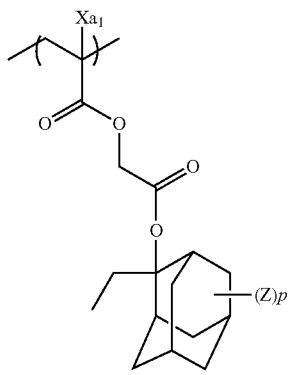

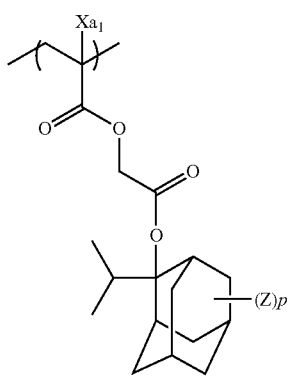

It is more preferred for the resin (B) to contain, as the repeating units of general formula (AI), any of the repeating units of general formula (I) below and/or any of the repeating units of general formula (II) below.

(I)

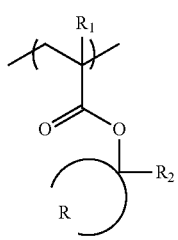

In formulae (I) and (II), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by R2 may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocyclic cycloalkyl group, such as a cyclopentyl group or a cyclohexyl group, and a polycyclic cycloalkyl group, such as a norbornyl group, a tetracyclodecanyl group, a tetracyclododecanyl group or an adamantyl group.

The repeating units of general formula (II) are preferably those of general formula (II-1) below.

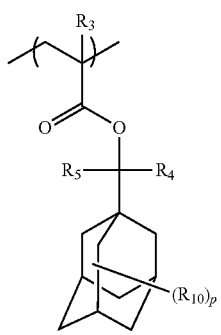

(II-1)

In general formula (II-1), $R_3$ to $R_5$ have the same meaning as in general formula (II).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. An isopropyl group is especially preferred as the branched alkyl group.

In the formula, p is an integer of 0 to 15, preferably in the range of 0 to 2, and more preferably 0 or 1.

When the resin (B) contains a plurality of acid-decomposable repeating units, the following combinations are preferred. In the following formulae, R each independently represents a hydrogen atom or a methyl group.

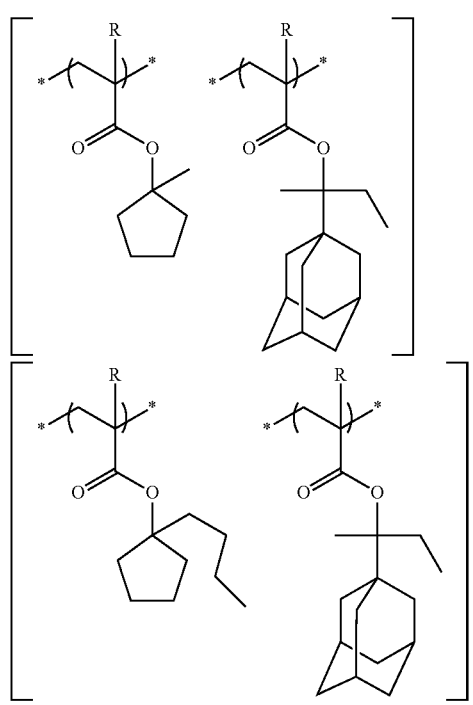

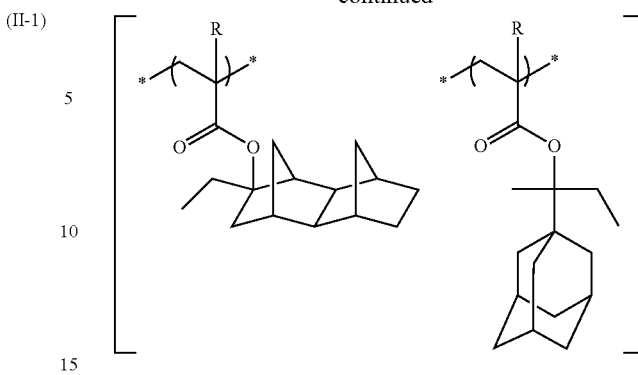

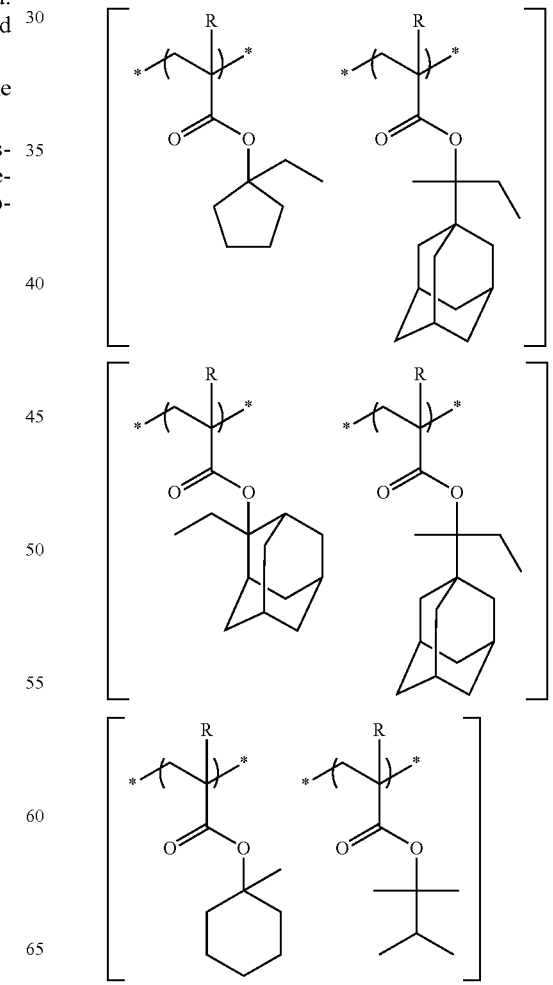

105
-continued
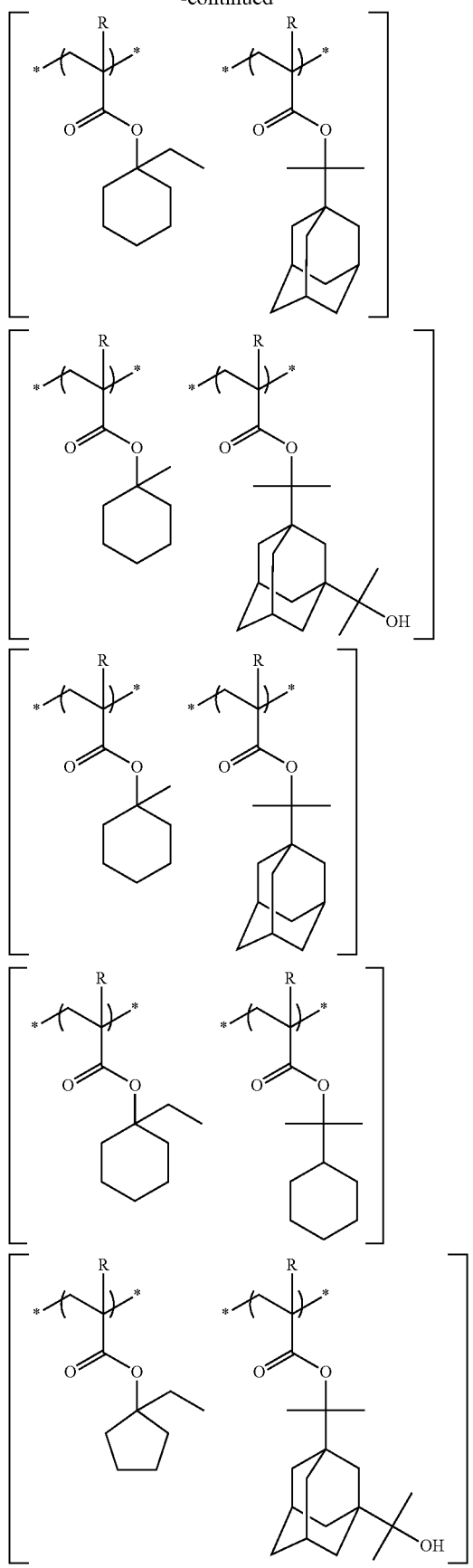
106
-continued
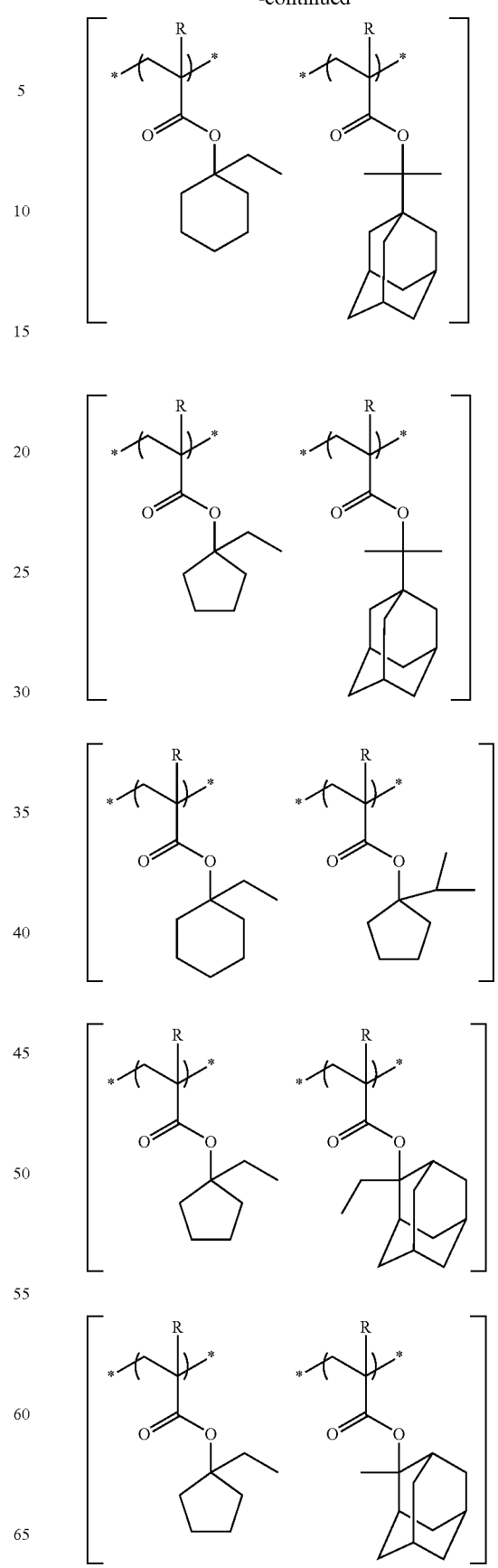

-continued

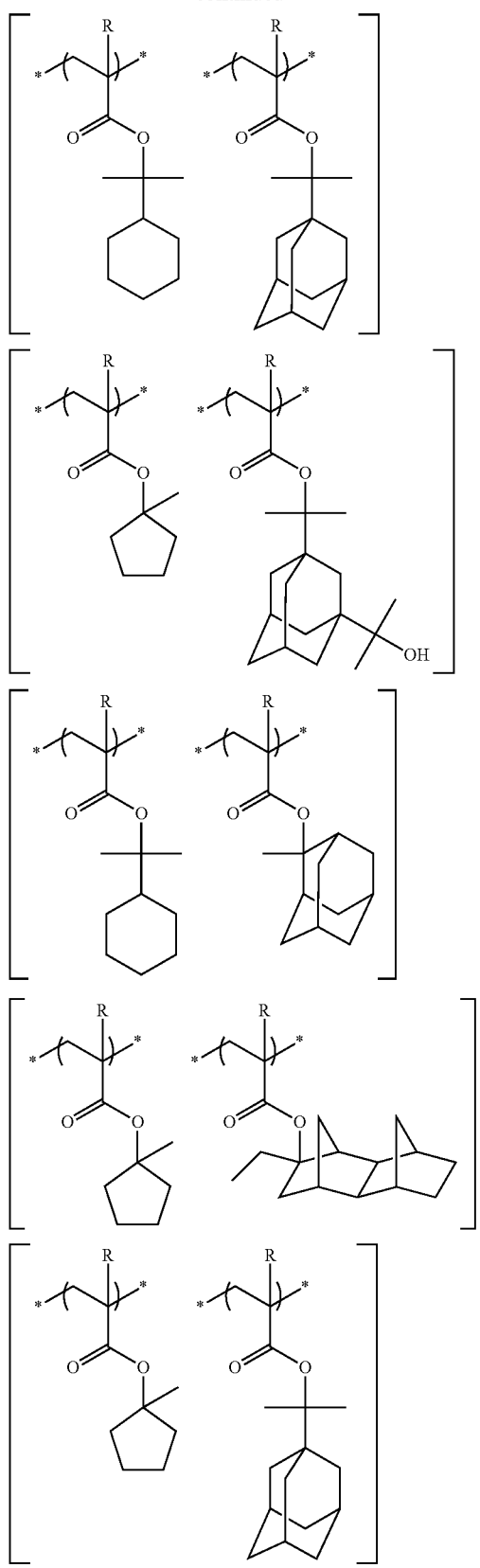

The resin (B) preferably contains a repeating unit having a lactone structure represented by general formula (III) below.

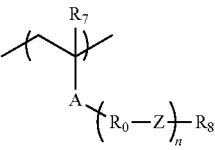

(III)

In formula (III),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, an amido bond, a urethane bond
(a group represented by

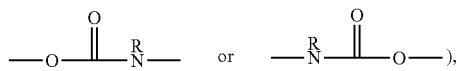

or a urea bond
(a group represented by

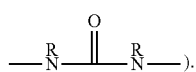

Each of Rs independently represents a hydrogen atom, an alkyl group, cycloalkyl group or an aryl group.

$R_8$ represents a monovalent organic group with a lactone structure.

n represents the number of repetitions of the structure of the formula —$R_0$—Z— and is an integer of 1 to 5.

$R_7$ represents a hydrogen atom, a halogen atom or an alkyl group.

Each of the alkylene group and cycloalkylene group represented by $R_0$ may have a substituent.

Z preferably represents an ether bond or an ester bond, most preferably an ester bond.

The alkyl group represented by $R_7$ is preferably an alkyl group having 1 to 4 carbon atoms, more preferably a methyl group or an ethyl group and most preferably a methyl group. The alkyl group represented by $R_7$ may be substituted. As substituents, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyl group such as an acetyl group or a propionyl group, an acetoxy group and the like. $R_7$ is preferably a hydrogen atom, a methyl group, a trifluoromethyl group or a hydroxymethyl group.

The alkylene group represented by $R_0$ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The monovalent organic group with a lactone structure represented by $R_8$ is not limited as long as the lactone structure is contained. As particular examples thereof, there can be mentioned the lactone structures of general formulae (LC1-1) to (LC1-17) to be described hereinafter. Of these, the structures of general formula (LC1-4) are most preferred. In general formulae (LC1-1) to (LC1-17), $n_2$ is more preferably 2 or less.

$R_8$ preferably represents a monovalent organic group with an unsubstituted lactone structure or a monovalent organic group with a lactone structure substituted with a methyl group, a cyano group or an alkoxycarbonyl group. More preferably, $R_8$ represents a monovalent organic group with a lactone structure substituted with a cyano group (cyanolactone).

Specific examples of the repeating units having a group with a lactone structure represented by general formula (III) will be shown below, which however in no way limit the scope of the present invention. In the specific examples, R represents a hydrogen atom, an optionally substituted alkyl group or a halogen atom. R is preferably a hydrogen atom, a methyl group, a hydroxymethyl group or an acetoxymethyl group.

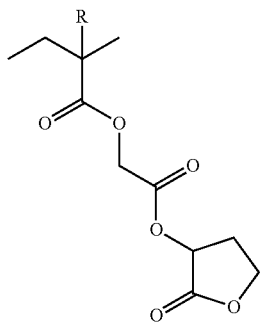

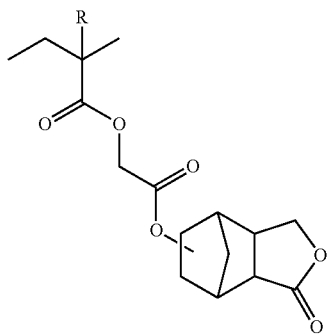

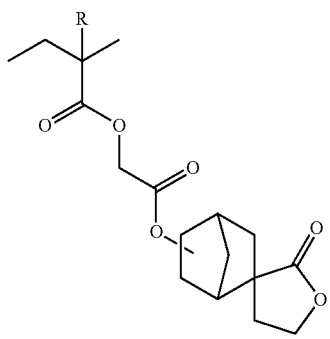

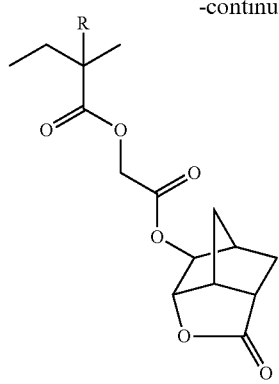

The repeating units having a lactone structure are preferably those of general formula (III-1) below.

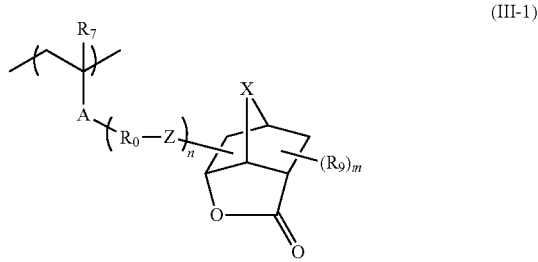

(III-1)

In general formula (III-1), $R_7$, A, $R_0$, Z and n are as defined in general formula (III) above.

R9, when m≥2 each of Rb's independently, represents an alkyl group, a cycloalkyl group, an alkoxycarbonyl group, a cyano group, a hydroxyl group or an alkoxy group. When m≥2, two or more $R_9$'s may be bonded to each other to thereby form a ring.

X represents an alkylene group, an oxygen atom or a sulfur atom.

In the formula, m is the number of substituents, being an integer of 0 to 5; and preferably 0 or 1.

The alkyl group represented by $R_9$ is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, a propoxy group, isopropoxy group or a butoxy group. These groups may have one or more substituents. As such substituents, there can be mentioned, for example, a hydroxyl group; an alkoxy group such as a methoxy group or an ethoxy group; a cyano group; and a halogen atom such as a fluorine atom. More preferably, $R_9$ is a methyl group, a cyano group or an alkoxycarbonyl group, further more preferably a cyano group.

As the alkylene group represented by X, there can be mentioned, for example, a methylene group or an ethylene group. X is preferably an oxygen atom or a methylene group, more preferably a methylene group.

When m≥1, it is preferred for the substitution with at least one $R_9$ to take place at the α- or β-position of the carbonyl group of the lactone. The substitution with $R_9$ at the α-position of the carbonyl group of the lactone is especially preferred.

Specific examples of the repeating units having a group with a lactone structure represented by formula (III-1) will be shown below, which however in no way limit the scope of the present invention. In the specific examples, R represents a hydrogen atom, an optionally substituted alkyl group or a halogen atom. R is preferably a hydrogen atom, a methyl group, a hydroxymethyl group or an acetoxymethyl group.

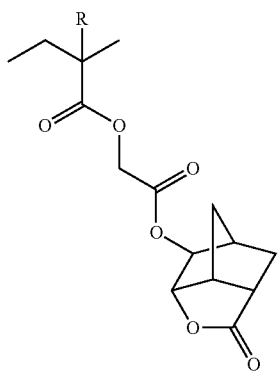

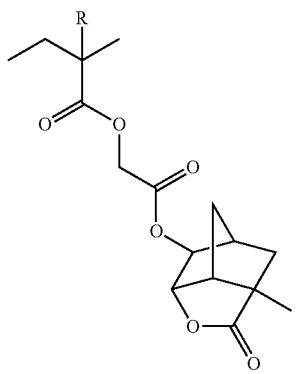

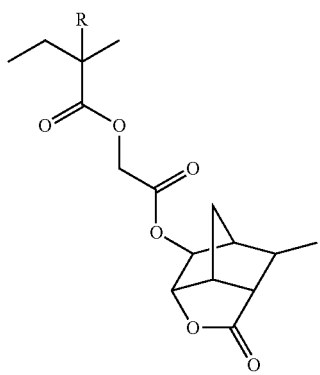

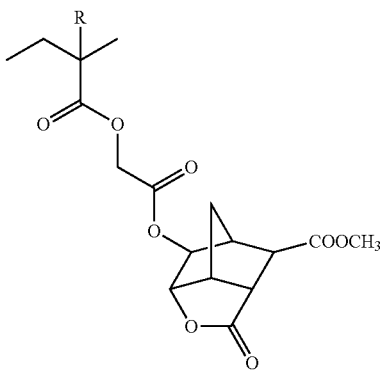

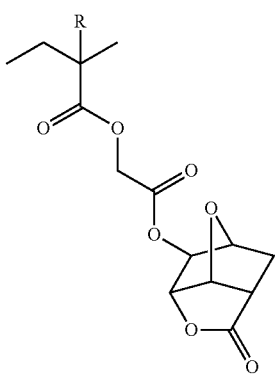

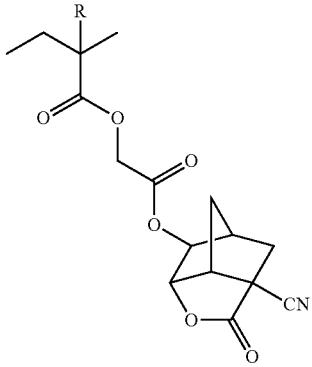

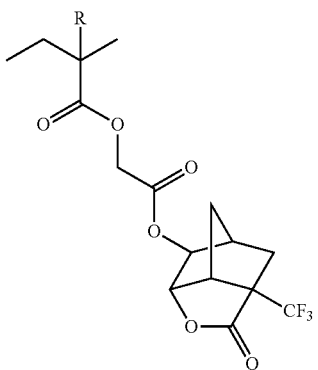

113
-continued
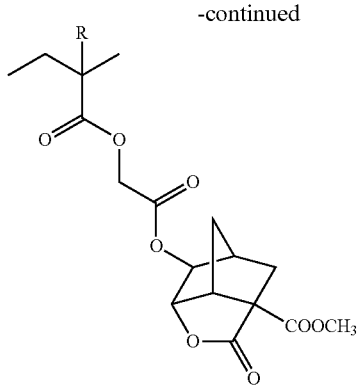
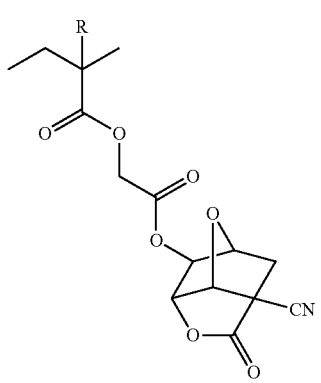
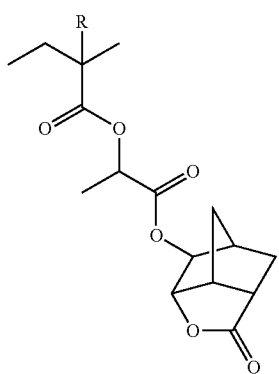
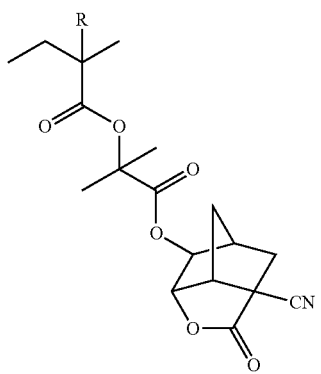
114
-continued
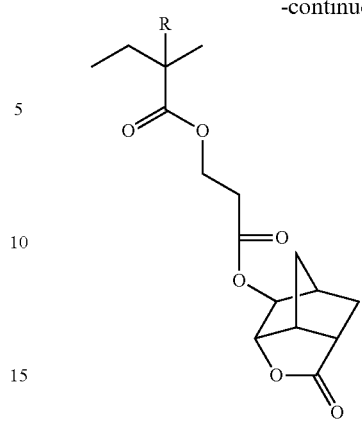
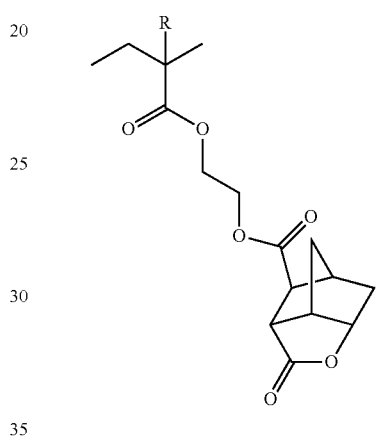
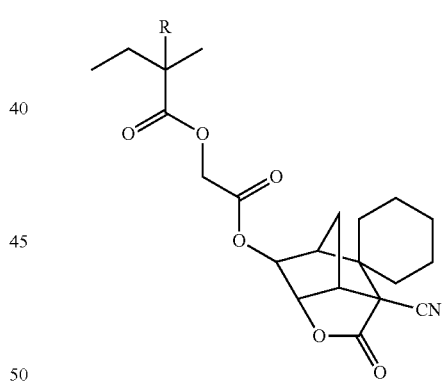
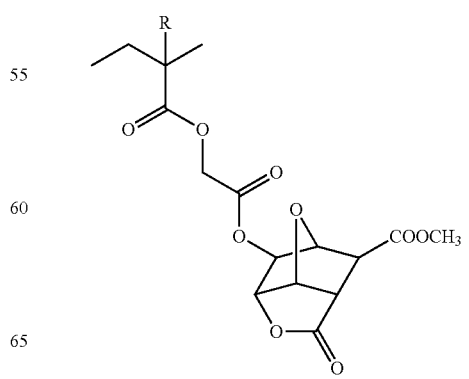

115
-continued
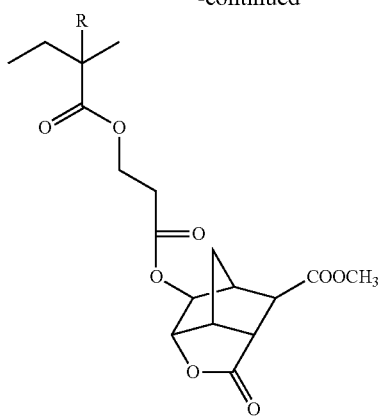
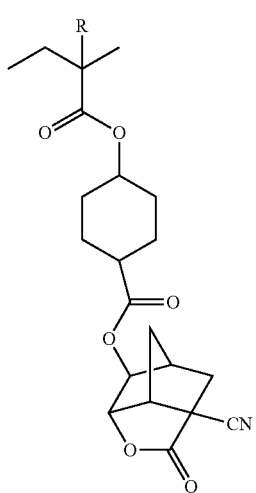
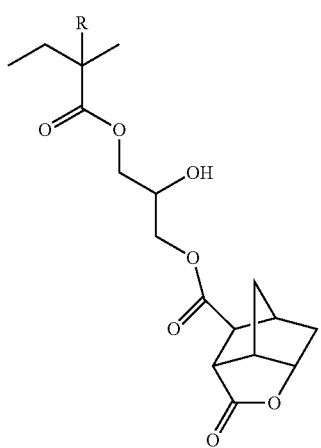
116
-continued
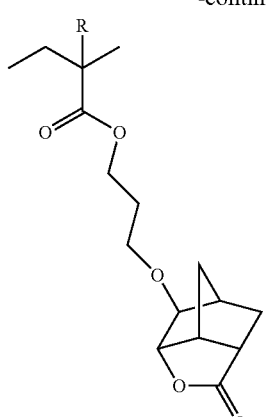
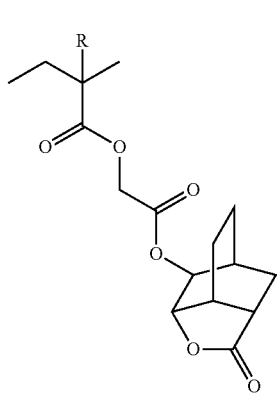
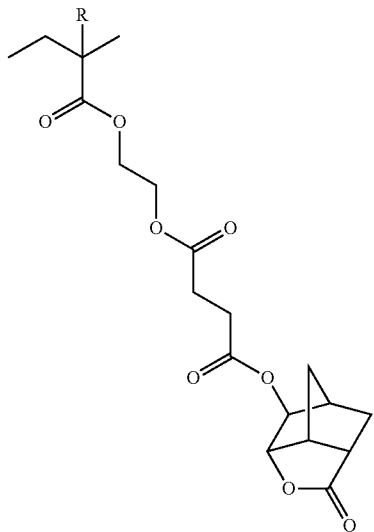

-continued

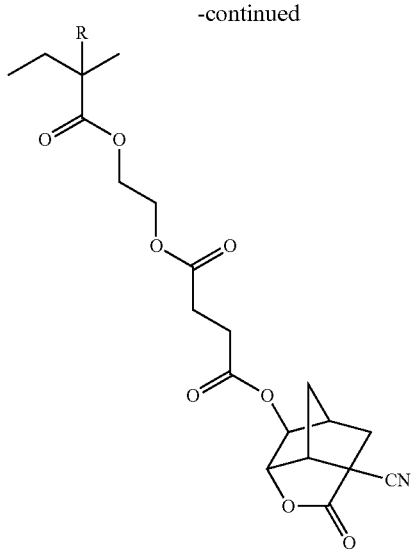

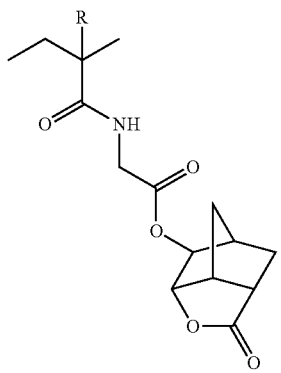

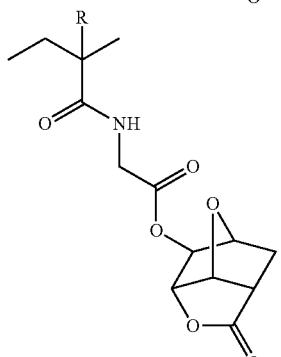

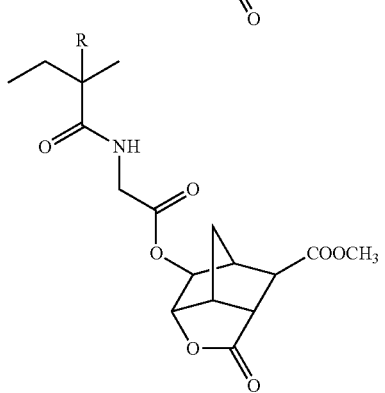

The content of any of the repeating units of general formula (III), the total content when two or more types thereof are contained, is preferably in the range of 15 to 60 mol %, more preferably 20 to 60 mol % and further more preferably 30 to 50 mol %, based on all the repeating units of the resin (B).

The resin (B) may contain a repeating unit containing a lactone group besides the units of general formula (III).

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in the LWR and development defect.

LC1-1

LC1-2

LC1-3

LC1-4

LC1-5

LC1-6

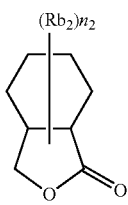
LC1-7

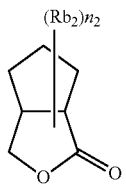
LC1-15

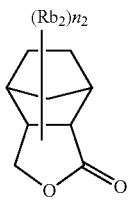
LC1-8

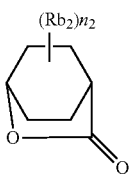
LC1-9

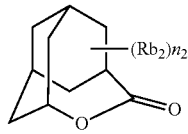
LC1-16

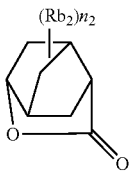
LC1-10

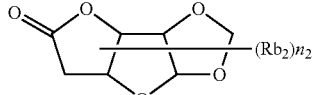
LC1-17

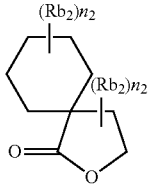
LC1-11

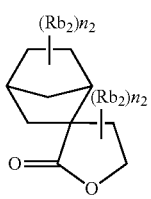
LC1-12

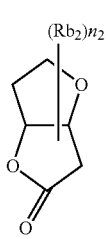
LC1-13

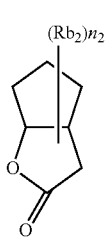
LC1-14

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

As the repeating units containing a lactone structure besides the units of general formula (III), a repeating unit represented by general formula (AII') below can be exemplified.

(AII')

In general formula (AII'), $Rb_0$ represents a hydrogen atom, a halogen atom or an alkyl group having 1 to 4 carbon atoms. As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom. Preferably, $Rb_0$ represents a hydrogen atom, a methyl group, a hydroxymethyl group, or a trifluoromethyl group, and more preferably a hydrogen atom or a methyl group.

V represents any of the groups of the general formulae (LC1-1) to (LC1-17).

Specific examples of repeating unit containing a lactone structure besides the units of general formula (III) will be shown below, which in no way limit the scope of the present invention.

In the formulae, Rx represents H, CH₃, CH₂OH, or CF₃.
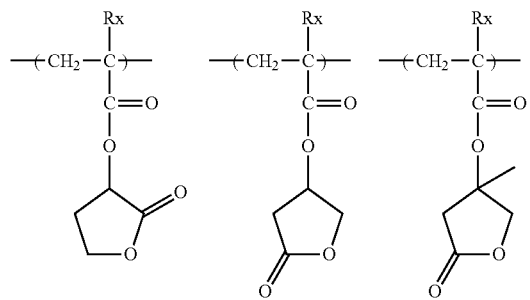
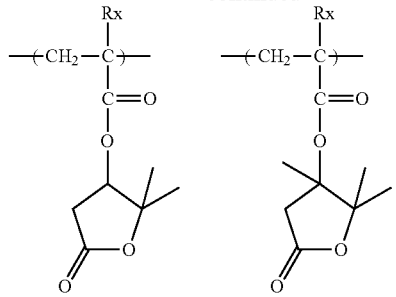
-continued
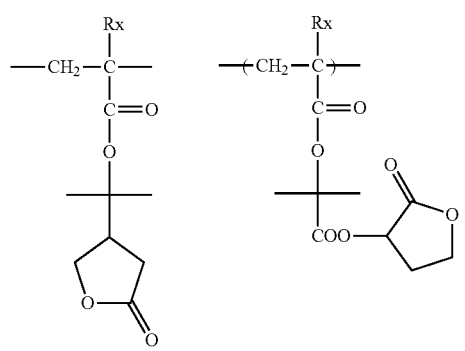
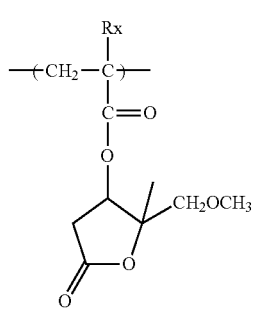
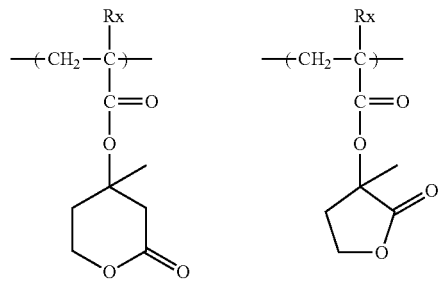
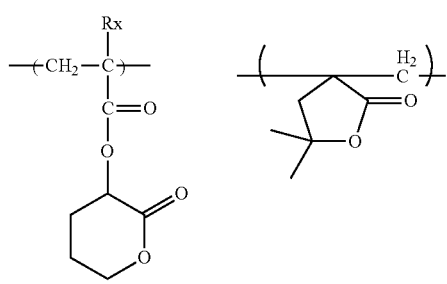
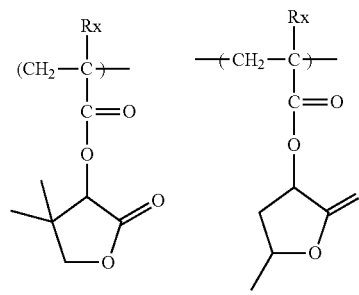
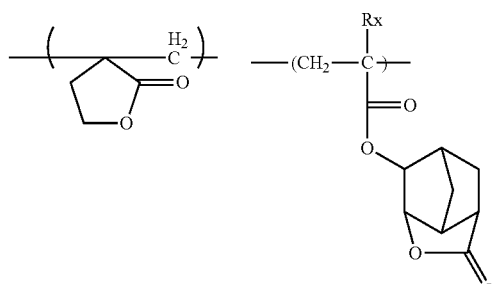
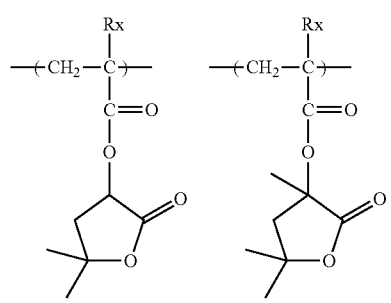
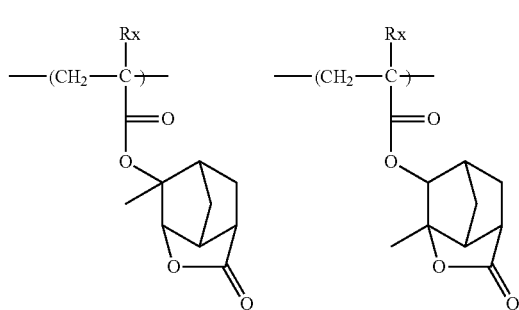

123
-continued
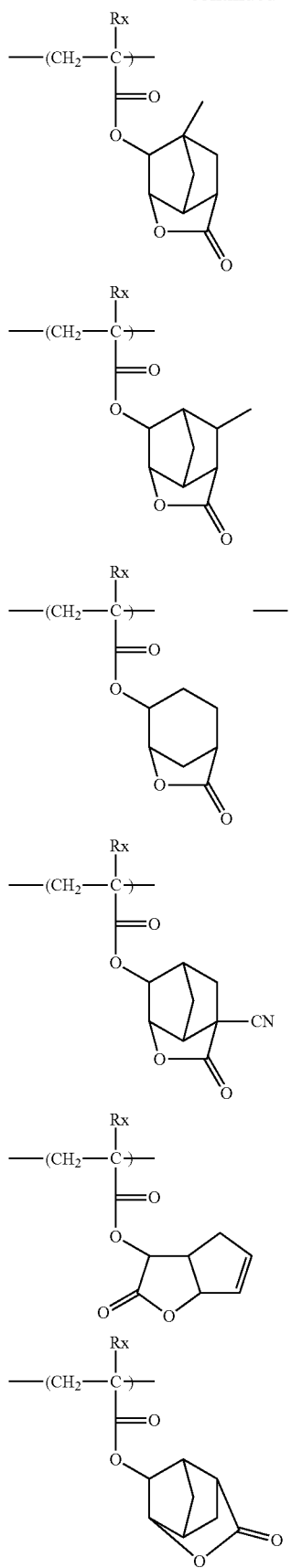
124
-continued
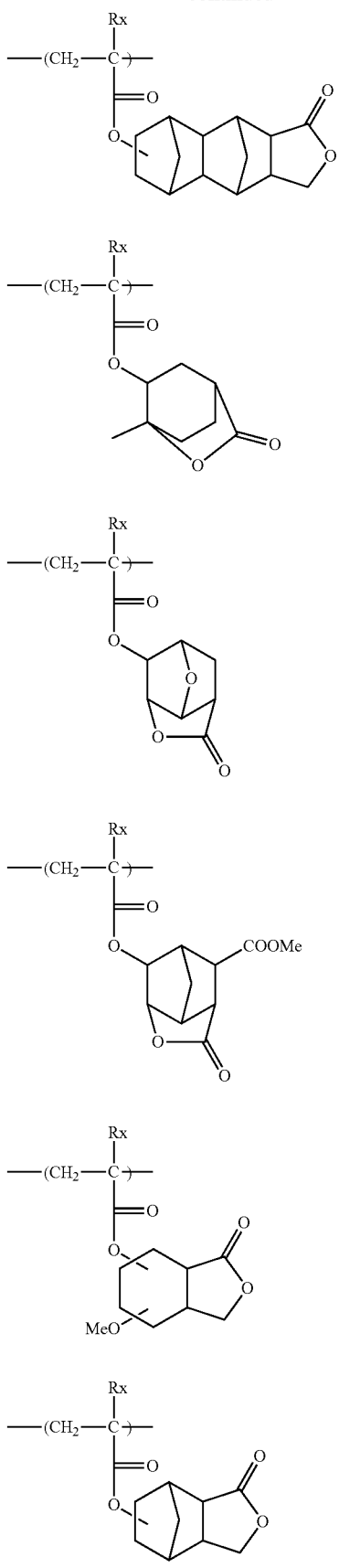

125
-continued
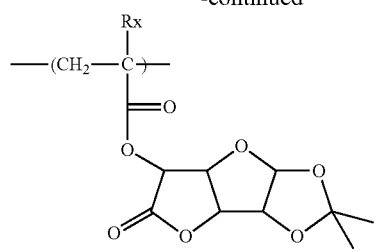
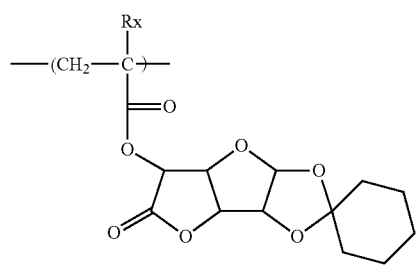
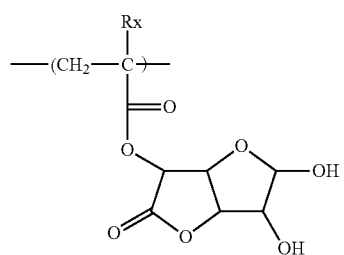
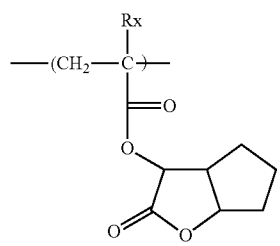
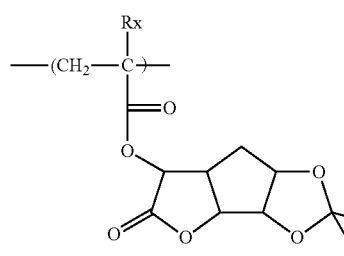
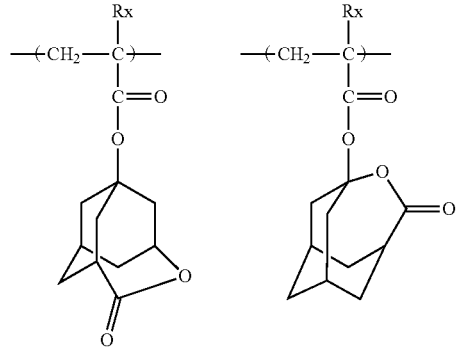
126
-continued
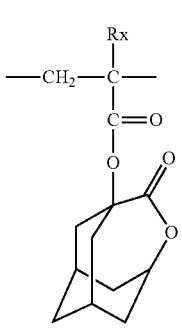
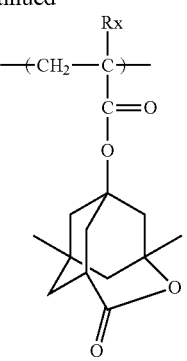
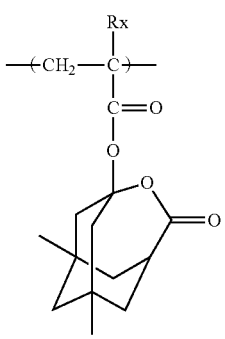
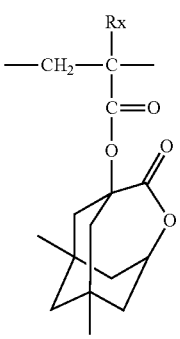
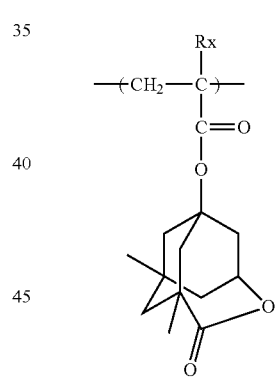
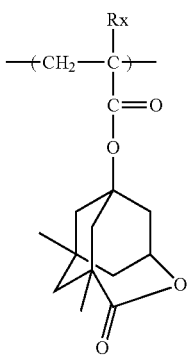
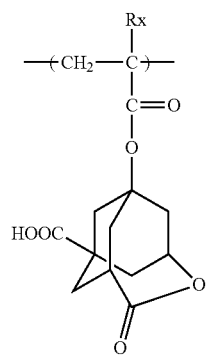
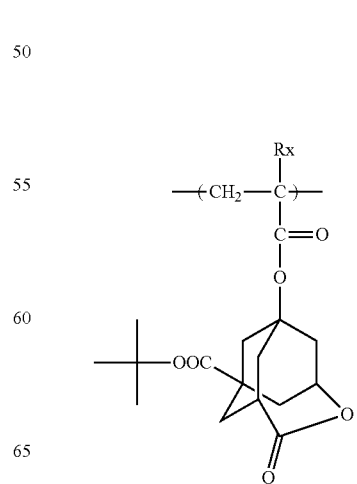

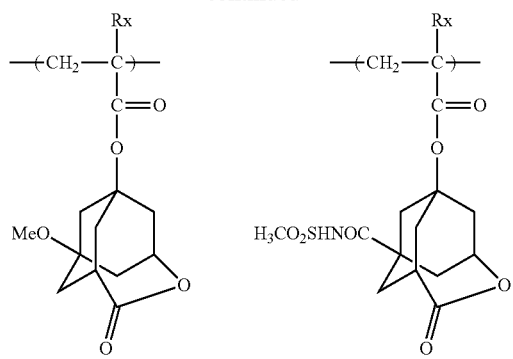
As especially preferred repeating units each containing a lactone group other than the units of general formula (III), there can be mentioned the following repeating units. Favorable pattern profile and iso/dense bias can be realized by selecting most appropriate lactone groups.
In the formulae, Rx represents H, CH$_3$, CH$_2$OH, or CF$_3$.
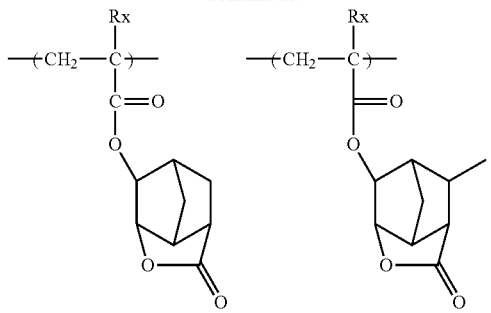
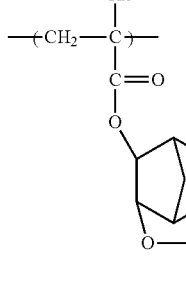
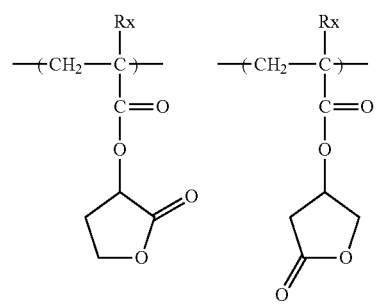
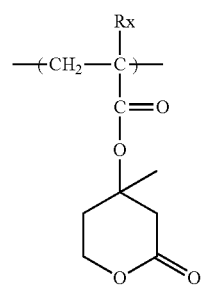
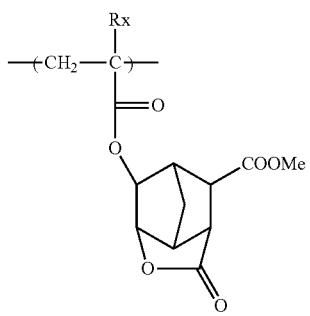
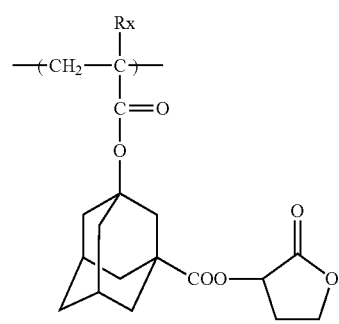
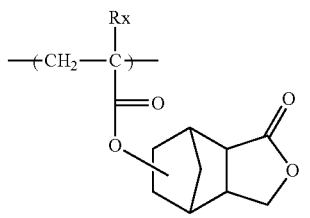
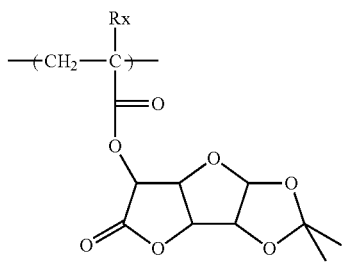

-continued

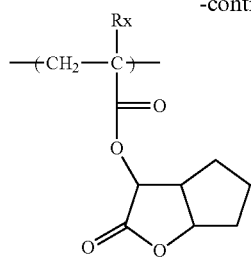

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The content of repeating unit containing a lactone group other than the repeating units of general formula (III), the total content when two or more types thereof are contained, is preferably in the range of 15 to 60 mol %, more preferably 20 to 50 mol % and further more preferably 30 to 50 mol %, based on all the repeating units of the resin.

In order to enhance the effect of the present invention, two or more types of lactone repeating units selected from among those of general formula (III) can be used in combination. When such a combinational use is conducted, it is preferred to select two or more from among the lactone repeating units of general formula (III) in which n is 1 and use them in combination.

The resin (B) may further contain a repeating unit containing a hydroxy group or a cyano group other than repeating units represented by general formulae (AI) and (III). The containment of this repeating unit would realize enhancements of adhesion to substrate and developer affinity.

The repeating unit containing a hydroxy group or a cyano group is preferably a repeating unit having an alicyclic hydrocarbon structure substituted with a hydroxy group or a cyano group. Further, the repeating unit containing a hydroxy group or a cyano group is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

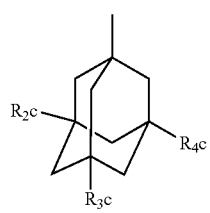
(VIIa)

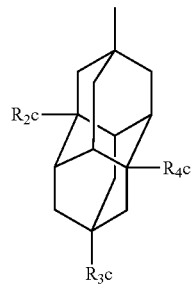
(VIIb)

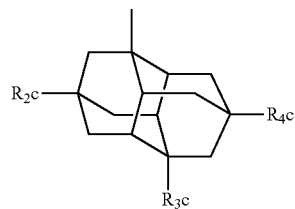
(VIIc)

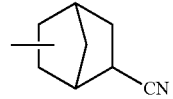
(VIId)

In the general formulae (VIIa) to (VIIc),
each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

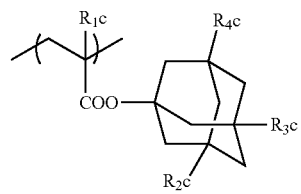
(AIIa)

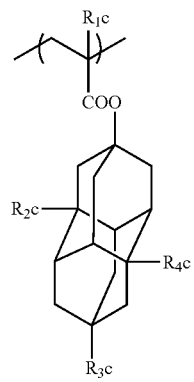
(AIIb)

-continued

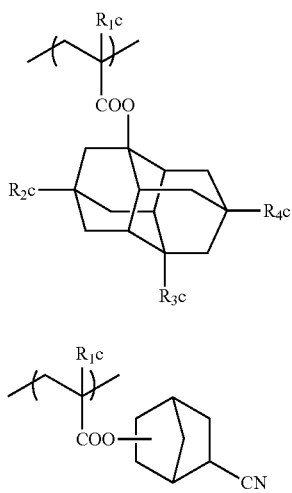

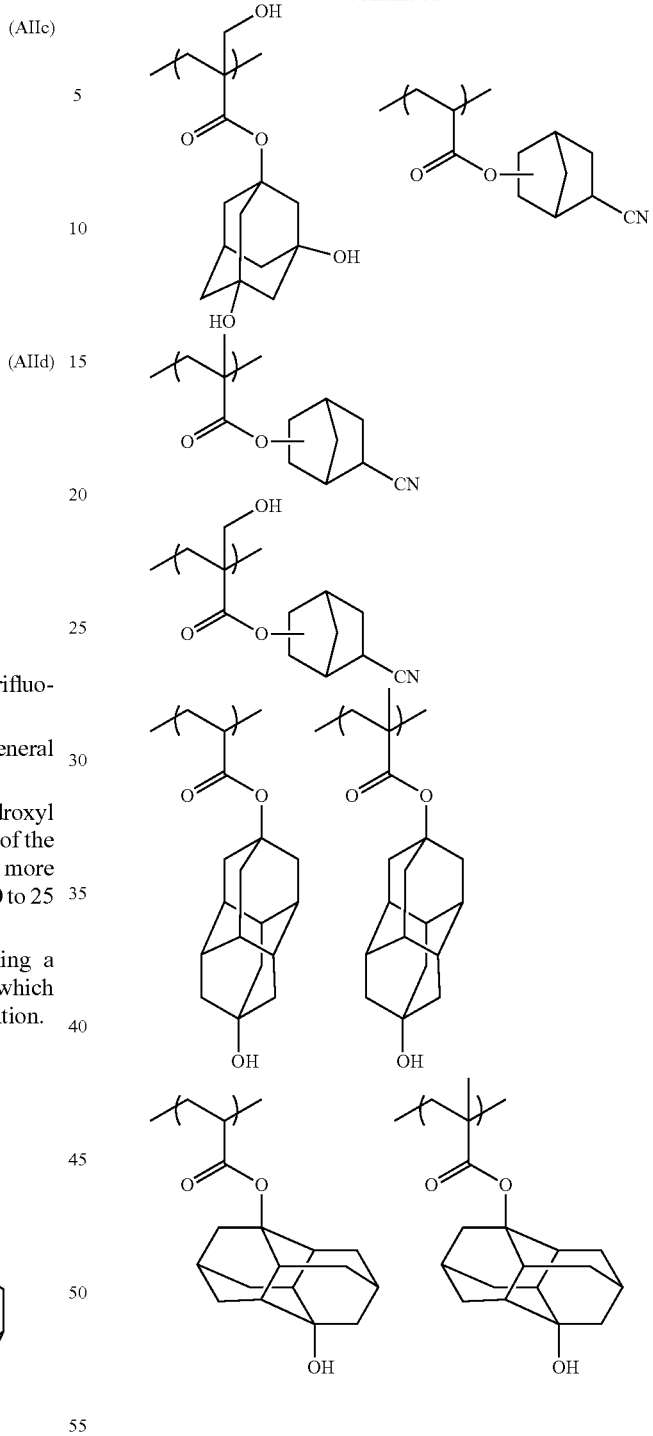

In general formulae (AIIa) to (AIId),

R₁c represents a hydrogen atom, a methyl group, a trifluoromethyl group or a hydroxymethyl group.

R₂c to R₄c have the same meaning as those of the general formulae (VIIa) to (VIIc).

The content of the repeating unit containing a hydroxyl group or a cyano group based on all the repeating units of the resin (B) is preferably in the range of 5 to 40 mol %, more preferably 5 to 30 mol % and further more preferably 10 to 25 mol %.

Specific examples of the repeating units containing a hydroxyl group or a cyano group will be shown below, which however in no way limit the scope of the present invention.

The resin for use in the composition of the present invention may contain a repeating unit containing an alkali-soluble group. As the alkali-soluble group, there can be mentioned a phenolic hydroxyl group, a carboxyl group, a sulfonamido group, a sulfonylimido group, a bisulfonylimido group or an aliphatic alcohol substituted at its α-position with an electron withdrawing group (for example, a hexafluoroisopropanol group). It is more preferred to contain a repeating unit containing a carboxyl group. The incorporation of the repeating unit containing an alkali-soluble group increases the resolution in contact hole usage. The repeating unit containing an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a mono- or polycyclohydrocarbon structure. The repeating unit of acrylic acid or methacrylic acid is especially preferred.

The content of the repeating unit containing an alkali-soluble group based on all the repeating units of the resin (B) is preferably in the range of 0 to 20 mol %, more preferably 3 to 15 mol % and further more preferably 5 to 10 mol %.

Specific examples of the repeating units containing an alkali-soluble group will be shown below, which however in no way limit the scope of the present invention.

In the specific examples, Rx represents H, $CH_3$, $CH_2OH$, or $CF_3$.

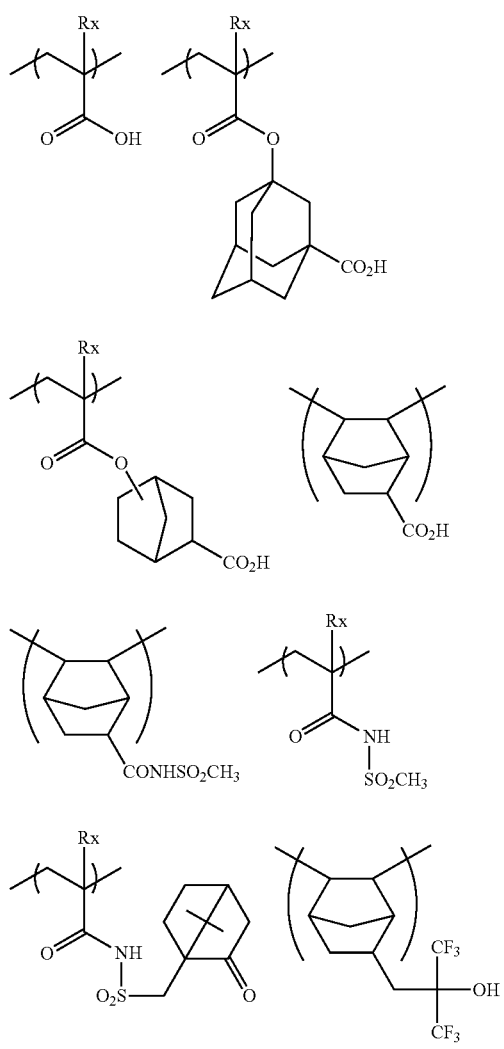
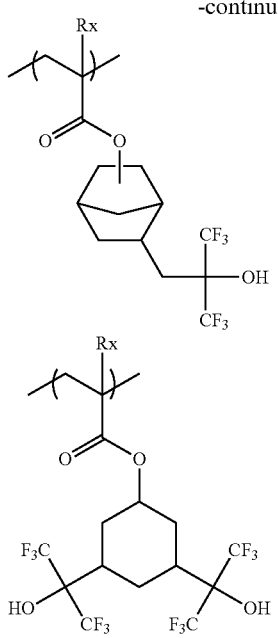

The resin (B) may further contain a repeating unit having an alicyclic hydrocarbon structure containing no polar group, which repeating unit exhibits no acid decomposability. As the repeating unit, there can be mentioned, for example, any of those of general formula (IV) below.

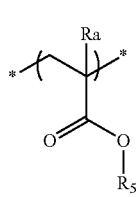

(IV)

In the general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms. As such, a cyclopentyl group and a cyclohexyl group can be exemplified.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$] undecane rings; and tetracyclic hydrocarbon rings, such as tetracyclo[4.4.0.1$^{2,5}$.1$^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.0$^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

The content of the repeating unit having an alicyclic hydrocarbon structure containing no polar group, which repeating unit exhibits no acid decomposability, based on all the repeating units of the resin (B) is preferably in the range of 0 to 40 mol %, more preferably 0 to 20 mol %.

Specific examples of the repeating unit having an alicyclic hydrocarbon structure containing no polar group, which repeating unit exhibits no acid decomposability will be shown below, which however in no way limit the scope of the present invention. In the formulae, Ra represents H, CH$_3$, CH$_2$OH or CF$_3$.

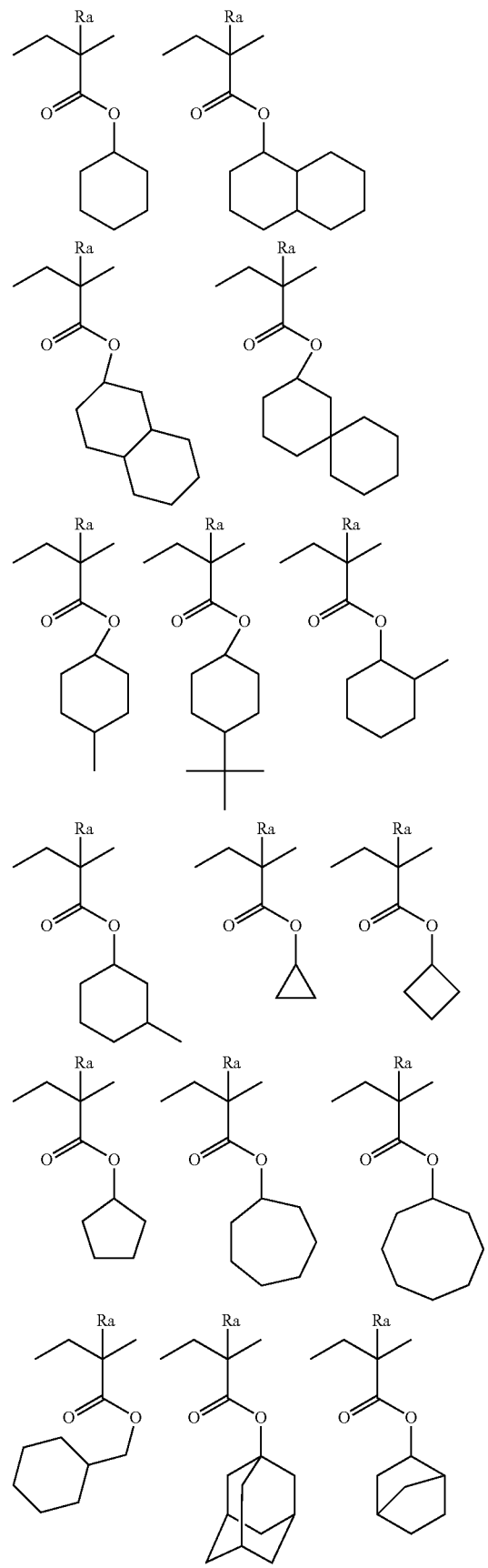

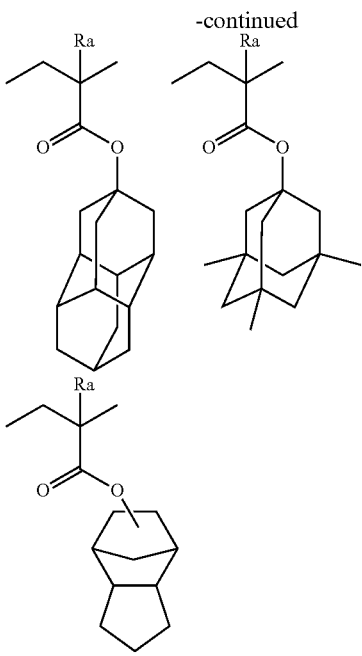

Various repeating structural units other than those mentioned hereinbefore can be introduced in the resin (B) in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and alkali soluble group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin (B) for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the resin (B) to contain no aromatic group from the viewpoint of transparency to ArF light. It is especially preferred for the acid-decomposable resin to contain an alicyclic hydrocarbon structure of a single ring or multiple rings.

Further, it is preferred for the resin (B) to contain neither a fluorine atom nor a silicon atom from the viewpoint of compatibility with the hydrophobic resin (C) to be described hereinafter.

Preferred resin (B) is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. Further, a copolymer containing 20 to 50 mol % of (meth)acrylate repeating unit having an acid-decomposable group; 20 to 50 mol % of (meth)acrylate repeating unit having a lactone structure; 5 to 30 mol % of (meth)acrylate repeating unit containing a hydroxy group or a cyano group; and 0 to 20 mol % of other (meth)acrylate repeating units is more preferred.

In the event of exposing the composition of the present invention to KrF excimer laser beams, electron beams, X-rays or high-energy light rays of wavelength 50 nm or less (EUV, etc.), it is preferred for the resin (B) to further have hydroxystyrene repeating units. More preferably, the resin has hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl (meth)acrylate and a dialkyl(1-adamantyl)methyl (meth)acrylate are more preferred.

The resin (B) of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

Further, the operation of dissolving a synthesized resin in a solvent to thereby obtain a solution and heating the solution at about 30 to 90° C. for about 30 minutes to 4 hours as described in, for example, JP-A-2009-037108 may be added in order to inhibit any aggregation, etc. of the resin after the preparation of the composition.

The weight average molecular weight of the resin (B) in terms of polystyrene molecular weight as measured by GPC is preferably in the range of 1000 to 200,000, more preferably 2000 to 20,000, still more preferably 3000 to 15,000 and further preferably 3000 to 10,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the content ratio of the resin (B) based on the total solid content of the whole composition is preferably in the range of 30 to 99 mass %, and more preferably 60 to 95 mass %.

The resin (B) of the present invention may either be used individually or in combination.

[Compound (A) that when Exposed to Actinic Rays or Radiation, Generates an Acid>

The composition of the present invention contains a compound that when exposed to actinic rays or radiation, generates an acid (hereinafter referred to as an "acid generator" or "photoacid generator").

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that generate an acid when exposed to actinic rays or radiation employed in microresists, etc., and mixtures thereof.

As the acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae (ZI), (ZII) and (ZIII) can be exemplified.

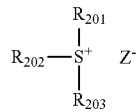

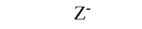

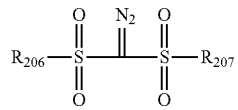

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents a nonnucleophilic anion.

As the nonnucleophilic anion represented by $Z^-$, a sulfonate anion, a carboxylate anion, a sulfonylimido anion, a bis(alkylsulfonyl)imido anion, and a tris(alkylsulfonyl)methyl anion can be exemplified.

The nonnucleophilic anion means an anion whose capability of inducing a nucleophilic reaction is extremely low. Any decomposition over time attributed to an intramolecular nucleophilic reaction can be suppressed by the use of this anion. Therefore, when this anion is used, the stability over time of the relevant composition and the film formed therefrom can be enhanced.

As the sulfonate anion, an aliphatic sulfonate anion, an aromatic sulfonate anion, and a camphor sulfonate anion can be exemplified.

As the carboxylate anion, an aliphatic carboxylate anion, an aromatic carboxylate anion, and an aralkyl carboxylate anion can be exemplified.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group can be exemplified.

As a preferred aromatic group of the aromatic sulfonate anion, an aryl group having 6 to 14 carbon atoms, such as a phenyl group, a tolyl group and a naphthyl group can be exemplified.

The alkyl group, cycloalkyl group and aryl group of the aliphatic sulfonate anion and aromatic sulfonate anion may have one or more substituents. As the substituent of the alkyl group, cycloalkyl group and aryl group of the aliphatic sulfonate anion and aromatic sulfonate anion, a nitro group, a halogen atom (fluorine atom, chlorine atom, bromine atom or iodine atom), a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) as its substituent.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have one or more substituents. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with one or more fluorine atoms is preferred.

As the other nonnucleophilic anions, there can be mentioned, for example, phosphorus fluoride, boron fluoride, antimony fluoride and the like.

The nonnucleophilic anion represented by $Z^-$ is preferably selected from among an aliphatic sulfonate anion substituted at its α-position of sulfonic acid with a fluorine atom, an aromatic sulfonate anion substituted with one or more fluorine atoms or a group having a fluorine atom, a bis(alkylsulfonyl)imido anion whose alkyl group is substituted with one or more fluorine atoms and a tris(alkylsulfonyl)methide anion whose alkyl group is substituted with one or more fluorine atoms. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

The non-nucleophilic anion represented by $Z^-$ is preferably expressed by, for example, general formula (LD1) below:

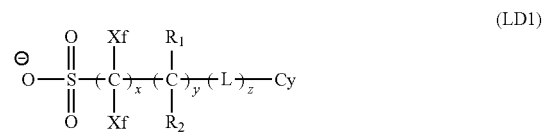

(LD1)

In the formula, each of Xf's independently represents a fluorine atom or an alkyl group substituted with at least one fluorine atom.

Each of $R_1$ and $R_2$ independently represents a group selected from the group consisting of a hydrogen atom, a fluorine atom, an alkyl group and an alkyl group substituted with at least one fluorine atom. When two or more $R^1$s or $R^2$s are contained, the two or more may be identical to or different from each other.

L, or each of L's independently, represents a single bond or a bivalent connecting group.

Cy represents a group with a cyclic structure.

In the formula, x is an integer of 1 to 20, y is an integer of 0 to 10, and z is an integer of 0 to 10.

Xf represents a fluorine atom or an alkyl group substituted with at least one fluorine atom. The alkyl group preferably has 1 to 10 carbon atoms, more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$.

Each of $R_1$ and $R_2$ independently represents a group selected from the group consisting of a hydrogen atom, a fluorine atom, an alkyl group and an alkyl group substituted with at least one fluorine atom. Each of the alkyl group and the alkyl group of the alkyl group substituted with at least one fluorine atom preferably has 1 to 4 carbon atoms. More preferably, each of $R_1$ and $R_2$ is a perfluoroalkyl group having 1 to 4 carbon atoms. In particular, there can be mentioned, for example, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, $CF_3$ is preferred.

L represents a single bond or a bivalent connecting group. As the bivalent connecting group, there can be mentioned, for example, —COO—, —OCO—, —CONH—, —CO—, —O—, —S—, —SO—, —$SO_2$—, an alkylene group, a cycloalkylene group or an alkenylene group. Of these, —COO—, —OCO—, —CONH—, —CO—, —O— and —SO$_2$— are preferred. —COO—, —OCO—, —CONH— and —SO$_2$— are more preferred.

Cy represents a group with a cyclic structure. As the group with a cyclic structure, there can be mentioned, for example, an alicyclic group, an aryl group or a group with a heterocyclic structure.

The alicyclic group may be monocyclic or polycyclic. As the alicyclic group that is monocyclic, there can be mentioned, for example, a monocycloalkyl group, such as a cyclopentyl group, a cyclohexyl group or a cyclooctyl group. As the alicyclic group that is polycyclic, there can be mentioned, for example, a polycycloalkyl group, such as a norbornyl group, a tricyclodecanyl group, a tetracyclodecanyl group, a tetracyclododecanyl group or an adamantyl group. Of the mentioned groups, alicyclic groups with a bulky structure having at least 7 carbon atoms, such as a norbornyl group, a tricyclodecanyl group, a tetracyclodecanyl group, a tetracyclododecanyl group and an adamantyl group, are preferred from the viewpoint of inhibition of any in-film diffusion in the PEB (post-exposure bake) operation and enhancement of MEEF (Mask Error Enhancement Factor).

The aryl group may be monocyclic or polycyclic. As the aryl group, there can be mentioned, for example, a phenyl group, a naphthyl group, a phenanthryl group or an anthryl group. Of these, a naphthyl group exhibiting a relatively low light absorbance at 193 nm is preferred.

The group with a heterocyclic structure may be monocyclic or polycyclic. The polycyclic structure is superior in the inhibition of any acid diffusion. It is optional for the group with a heterocyclic structure to have aromaticity. As the heterocycle having aromaticity, there can be mentioned, for example, a furan ring, a thiophene ring, a benzofuran ring, a benzothiophene ring, a dibenzofuran ring, a dibenzothiophene ring or a pyridine ring. As the heterocycle having no aromaticity, there can be mentioned, for example, a tetrahydropyran ring, a lactone ring or a decahydroisoquinoline ring. It is especially preferred for the heterocycle of the group with a heterocyclic structure to be a furan ring, a thiophene ring, a pyridine ring or a decahydroisoquinoline ring.

A substituent may be introduced in the above group with a cyclic structure. As the substituent, there can be mentioned, for example, an alkyl group, a cycloalkyl group, an aryl group, a hydroxyl group, an alkoxy group, an ester group, an amido group, a urethane group, a ureido group, a thioether group, a sulfonamido group or a sulfonic ester group. The alkyl group may be in the form of a linear or branched chain. It is preferred for the alkyl group to have 1 to 12 carbon atoms. The cycloalkyl group may be monocyclic or polycyclic. It is preferred for the cycloalkyl group to have 3 to 12 carbon atoms. The aryl group preferably has 6 to 14 carbon atoms.

In the formula, x is preferably 1 to 8, more preferably 1 to 4 and most preferably 1; y is preferably 0 to 4, more preferably 0; and z is preferably 0 to 8, more preferably 0 to 4.

Also, the non-nucleophilic anion represented by Z⁻ is preferably expressed by, for example, general formula (LD2) below.

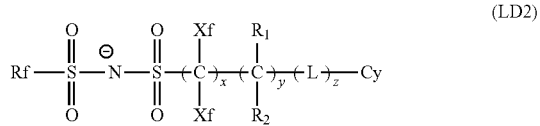

(LD2)

In general formula (LD2), Xf, R$_1$, R$_2$, L, Cy, x, y and z are as defined above in connection with general formula (LD1). Rf is a group containing a fluorine atom.

As the group containing a fluorine atom represented by Rf, there can be mentioned, for example, an alkyl group containing at least one fluorine atom, a cycloalkyl group containing at least one fluorine atom or an aryl group containing at least one fluorine atom.

These alkyl group, cycloalkyl group and aryl group may be those substituted with a fluorine atom, or those substituted with another substituent containing a fluorine atom. When Rf is a cycloalkyl group containing at least one fluorine atom or an aryl group containing at least one fluorine atom, the other substituent containing a fluorine atom can be, for example, an alkyl group substituted with at least one fluorine atom.

Further, these alkyl group, cycloalkyl group and aryl group may further be substituted with a substituent containing no fluorine atom. As this substituent, there can be mentioned, for example, any of those mentioned above with respect to Cy wherein no fluorine atom is contained.

As the alkyl group containing at least one fluorine atom represented by Rf, there can be mentioned, for example, any of those mentioned hereinbefore as the alkyl group substituted with at least one fluorine atom, represented by Xf. As the cycloalkyl group containing at least one fluorine atom represented by Rf, there can be mentioned, for example, a perfluorocyclopentyl group or a perfluorocyclohexyl group. As the aryl group containing at least one fluorine atom represented by Rf, there can be mentioned, for example, a perfluorophenyl group.

As the organic groups represented by R$_{201}$, R$_{202}$ and R$_{203}$, there can be mentioned, for example, the corresponding groups of compounds (ZI-1), (ZI-2), (ZI-3) or (ZI-4) to be described hereinafter.

Compounds having two or more of the structures of the general formula (ZI) may be used as the acid generator. For example, use may be made of a compound having a structure in which at least one of the R$_{201}$ to R$_{203}$ of one of the compounds of the general formula (ZI) is bonded to at least one of the R$_{201}$ to R$_{203}$ of another of the compounds of the general formula (ZI).

As preferred (ZI) components, the following compounds (ZI-1) to (ZI-4) can be exemplified.

The compounds (ZI-1) are arylsulfonium compounds of the general formula (ZI) wherein at least one of R$_{201}$ to R$_{203}$ is an aryl group, namely, compounds containing an arylsulfonium as a cation.

In the arylsulfonium compounds, all of the R$_{201}$ to R$_{203}$ may be aryl groups. It is also appropriate that the R$_{201}$ to R$_{203}$ are partially an aryl group and the remainder is an alkyl group or a cycloalkyl group.

As the arylsulfonyl compound, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the heterocyclic structure, there can be mentioned, for example, a pyrrole, a furan, a thiophene, an indole, a benzofuran and a benzothiophene. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group, and a vinyl group. More preferred groups include a linear or branched 2-oxoalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C=O at the 2-position of the above-described alkyl group can be preferably exemplified.

The 2-oxocycloalkyl group is preferably a group having >C=O at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

Now the compounds (ZI-3) will be described. The compounds (ZI-3) are those represented by the following general formula (ZI-3) which have a phenacylsulfonium salt structure.

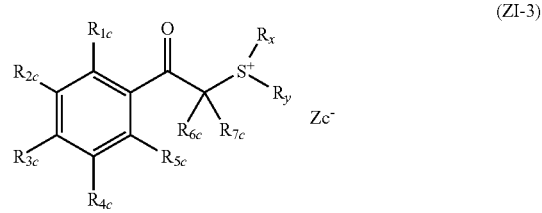

In the formula (ZI-3), each of $R_{1c}$ to $R_{5c}$ independently represents a hydrogen atom, an alkyl group, a cycloalkyl group, an alkoxy group, a halogen atom, or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R^x$ and $R^y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having >C=O at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited.

However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cation part in the compound (ZI-3) will be described below.

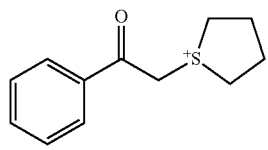

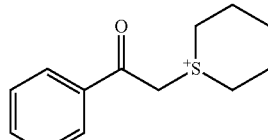

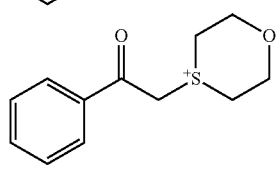

-continued

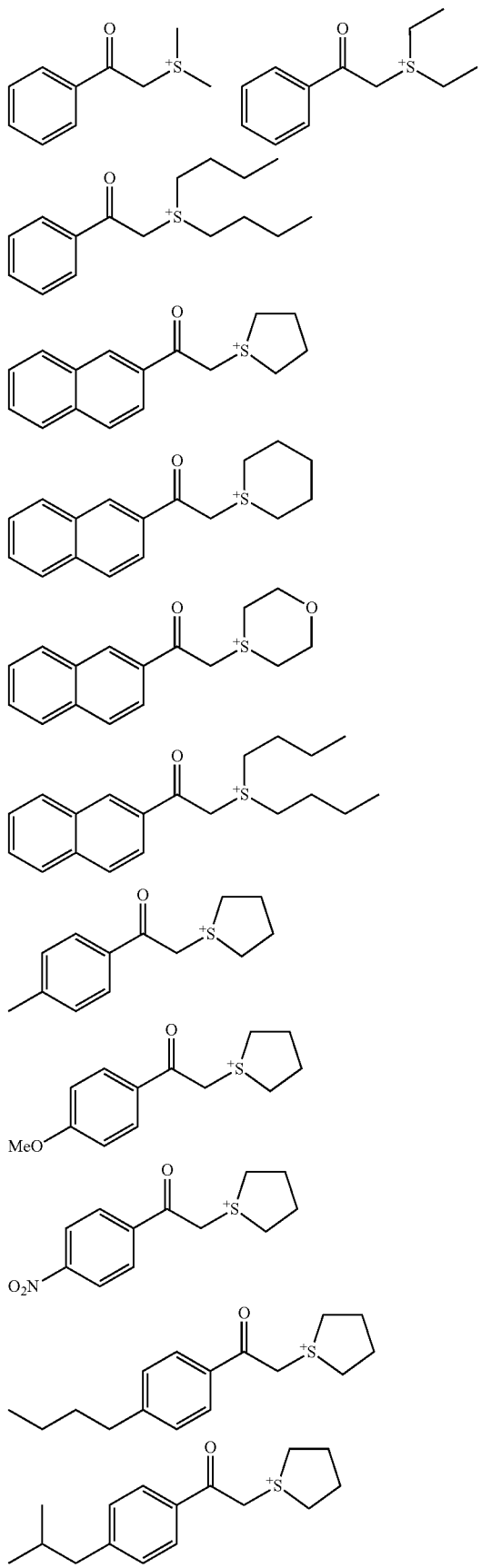

149
-continued
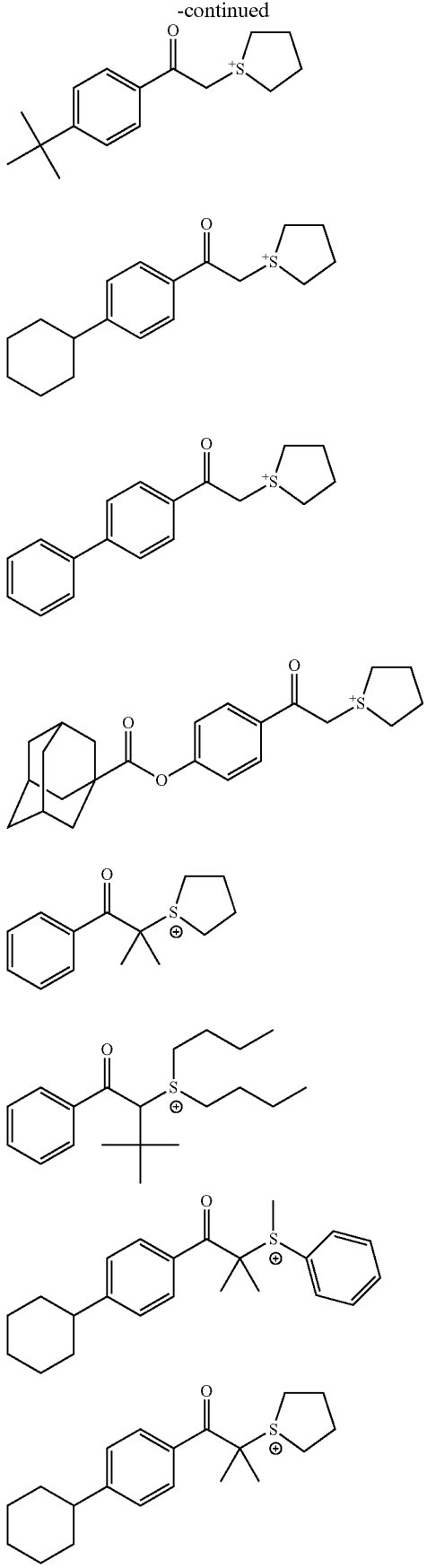
150
-continued
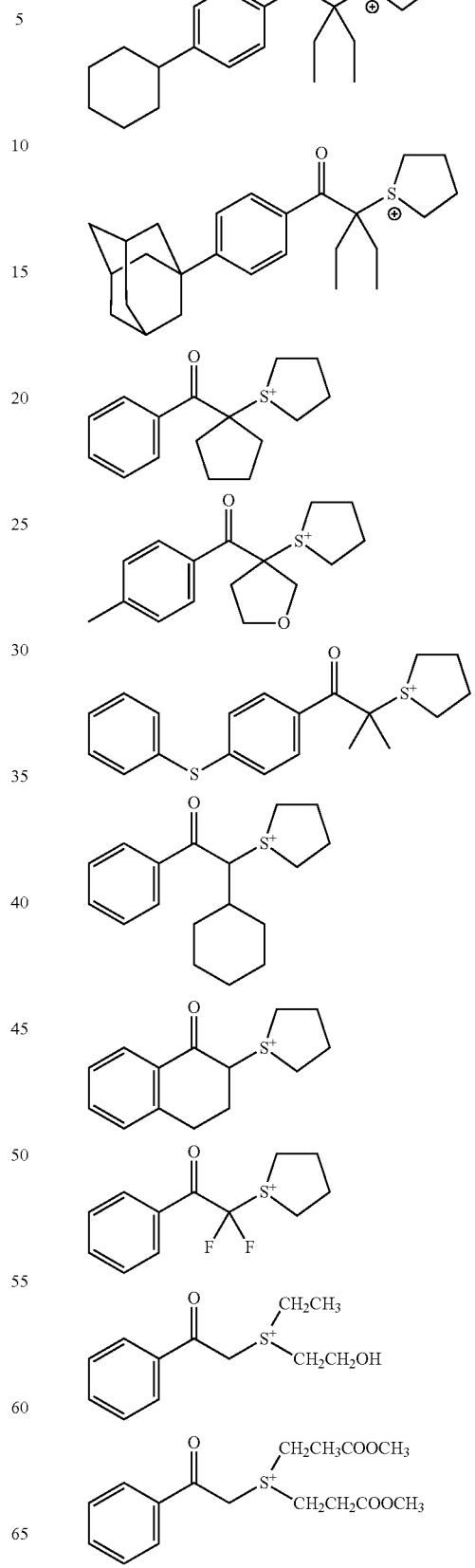

151
-continued

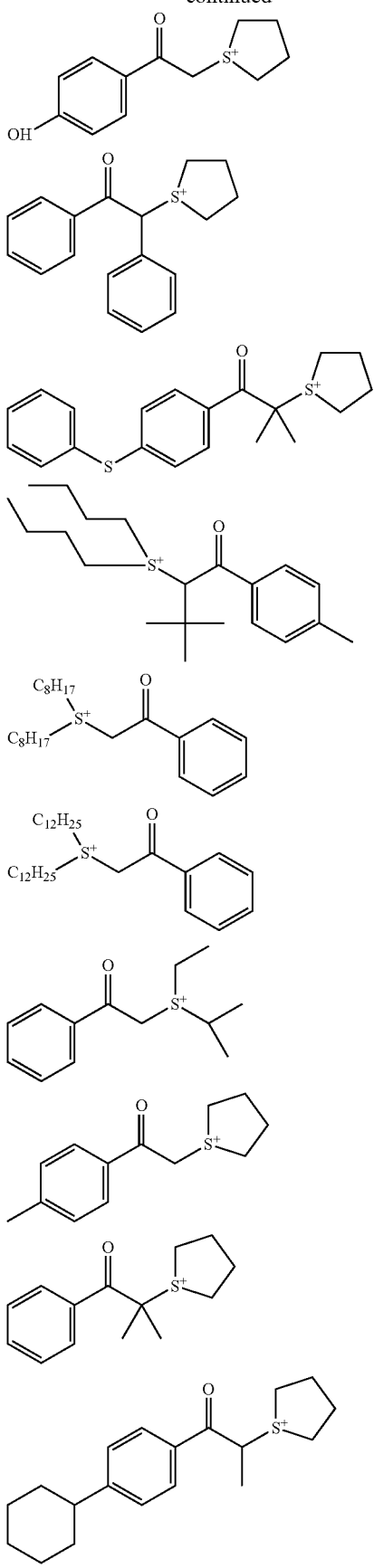

152
-continued

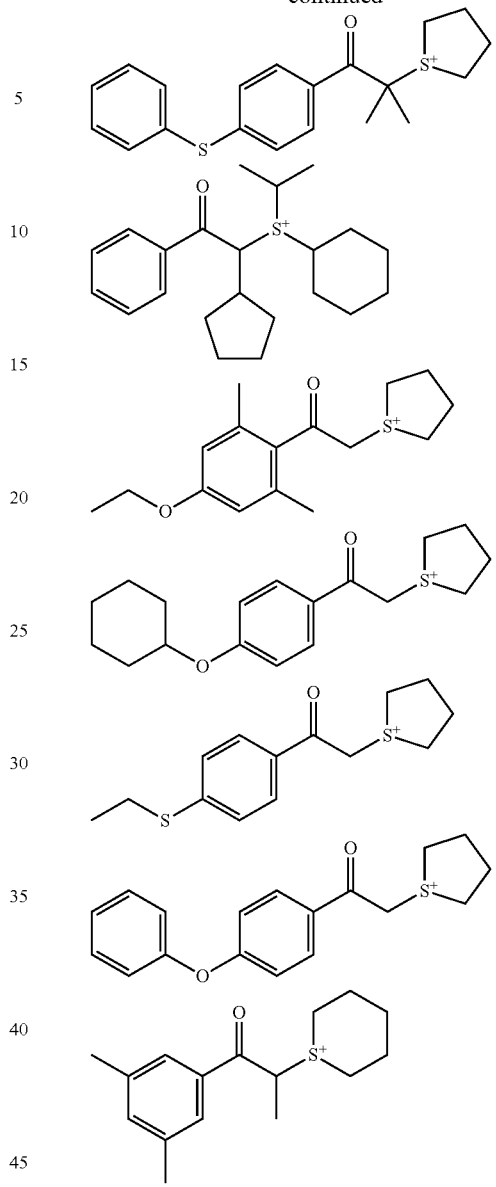

The compounds (ZI-4) are those of general formula (ZI-4) below.

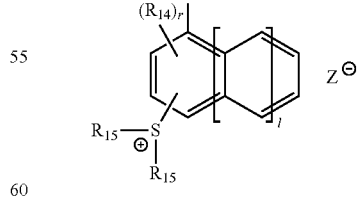

(ZI-4)

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, 1 is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cation part in the compound (ZI-4) will be shown below.

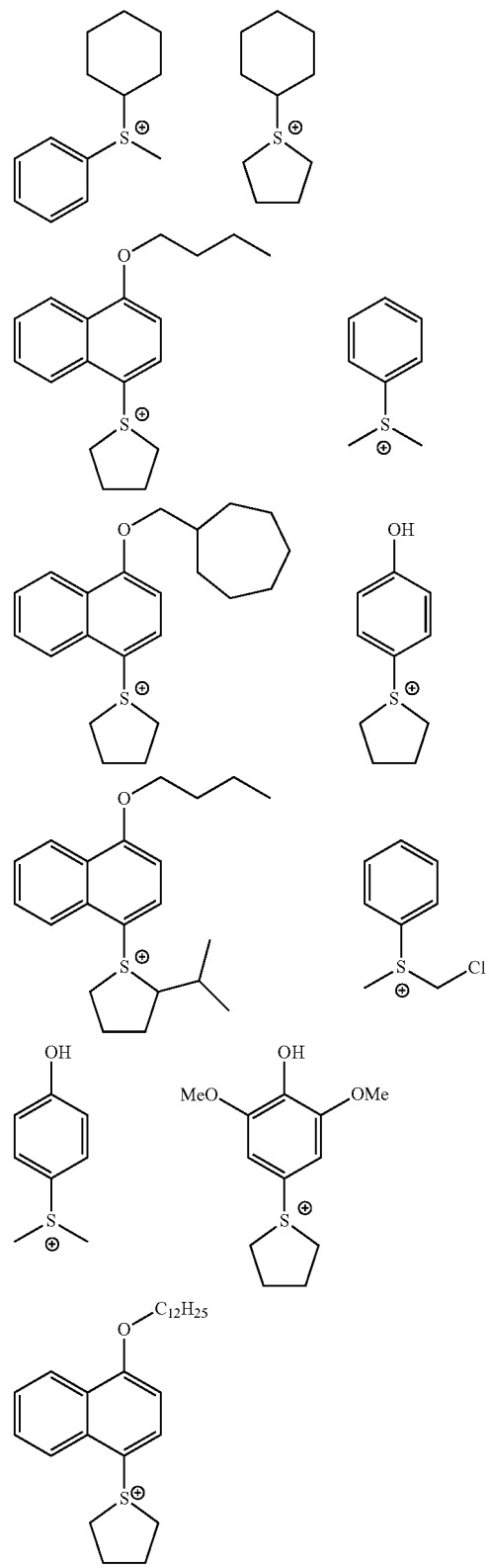

-continued

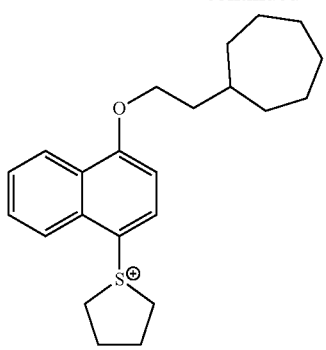
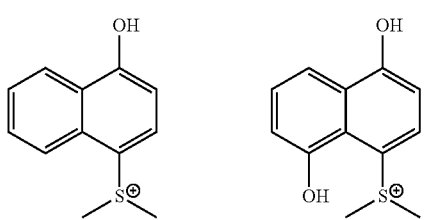
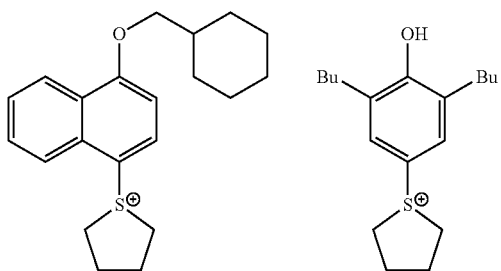
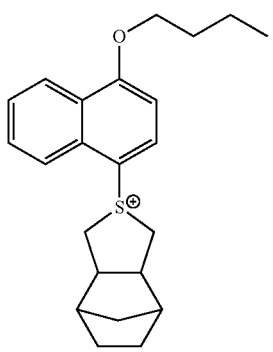
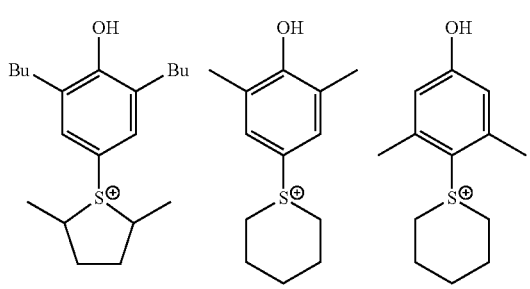

-continued

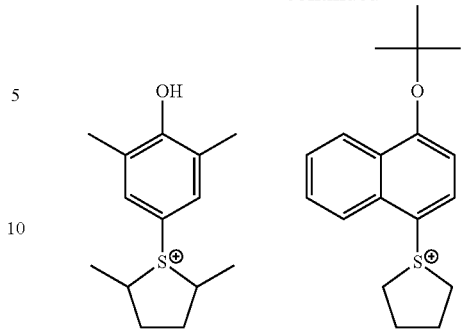
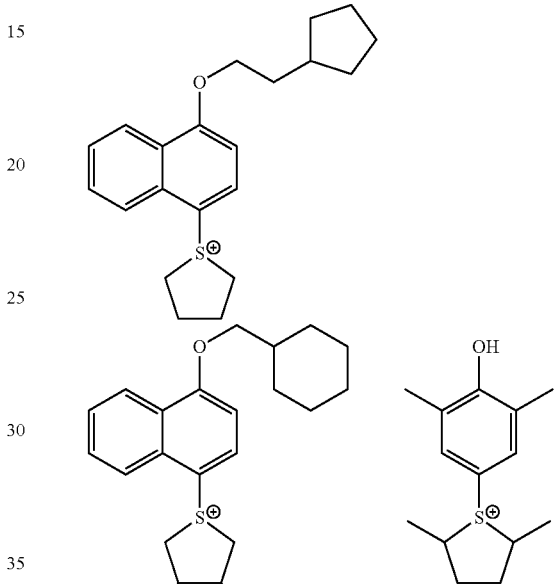
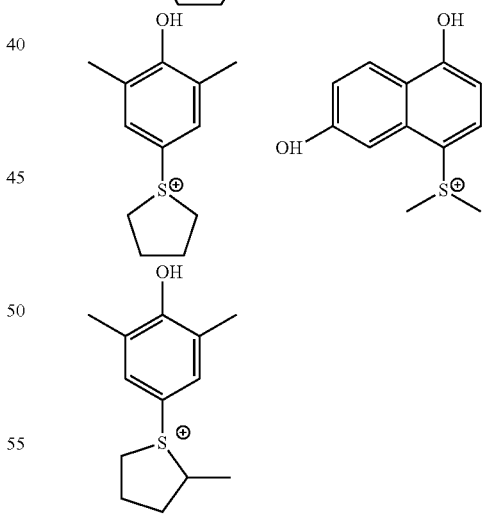

Now, general formulae (ZII) and (ZIII) will be described.
In general formulae (ZII) and (ZIII),
each of $R_{204}$ to $R_{207}$ independently represents an aryl group, an alkyl group or a cycloalkyl group.
The aryl group represented by each of $R_{204}$ to $R_{207}$ is preferably a phenyl group or a naphthyl group, more preferably a phenyl group. The aryl group may be one having a heterocyclic structure containing an oxygen atom, nitrogen atom, sulfur atom, etc. As the heterocyclic structure, there can be mentioned, for example, a pyrrole, a furan, a thiophene, an indole, a benzofuran and a benzothiophene.

As preferred alkyl groups and cycloalkyl groups represented by $R_{204}$ to $R_{207}$, a linear or branched alkyl group having 1 to 10 carbon atoms and a cycloalkyl group having 3 to 10 carbon atoms can be exemplified. As the alkyl group, for example, a methyl group, an ethyl group, a propyl group, a butyl group and a pentyl group can be exemplified. As the cycloalkyl group, for example, a cyclopentyl group, a cyclohexyl group and a norbornyl group can be exemplified.

The aryl group, alkyl group and cycloalkyl group represented by $R_{204}$ to $R_{207}$ may have one or more substituents. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a nonnucleophilic anion. As such, the same nonnucleophilic anions as mentioned with respect to the $Z^-$ in the general formula (ZI) can be exemplified.

As the acid generators, the compounds represented by the following general formulae (ZIV), (ZV) and (ZVI) can further be exemplified.

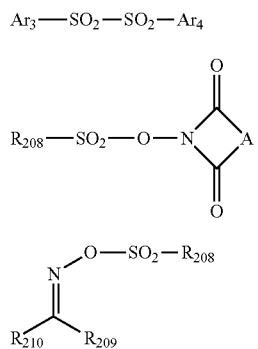

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, the compounds represented by the general formulae (ZI) to (ZIII) are more preferred.

As a preferred acid generator, a compound that generates an acid having one sulfonate group or imido group. As a more preferred acid generator, a compound that generates a monovalent perfluoroalkanesulfonic acid, a compound that generates a monovalent aromatic sulfonic acid substituted with one or more fluorine atoms or fluorine-atom-containing group, and a compound that generates a monovalent imidic acid substituted with one or more fluorine atoms or fluorine-atom-containing group can be exemplified. As a still more preferred acid generator, any of sulfonium salts of fluorinated alkanesulfonic acid, fluorinated benzenesulfonic acid, fluorinated imidic acid and fluorinated methide acid can be exemplified. As acid generators, it is especially preferred for the generated acid to be a fluorinated alkanesulfonic acid, fluorinated benzenesulfonic acid or fluorinated imidic acid, each of which having pKa's of −1 or below in order to improve the sensitivity.

Especially preferred examples of the acid generators will be shown below.

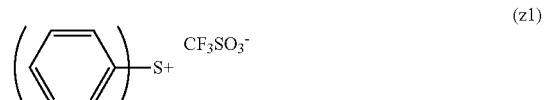

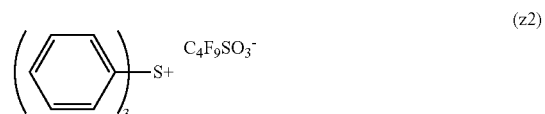

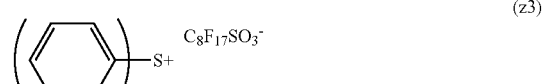

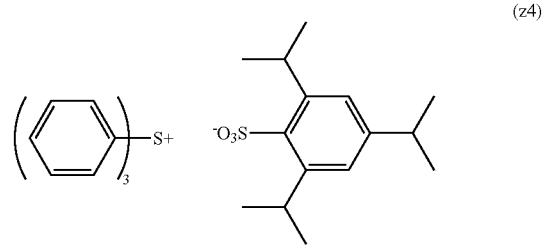

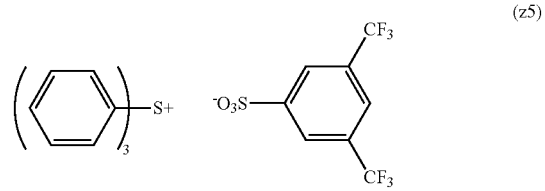

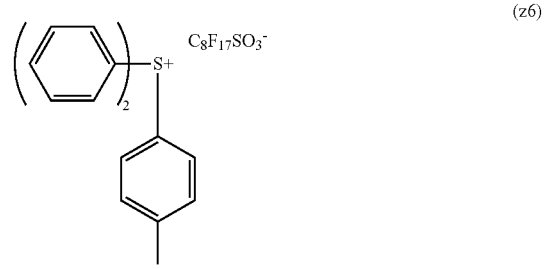

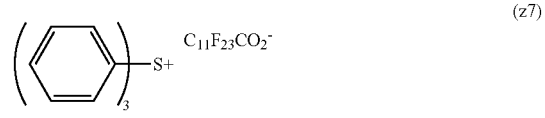

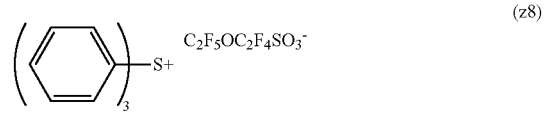

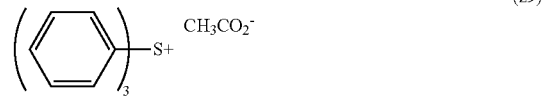

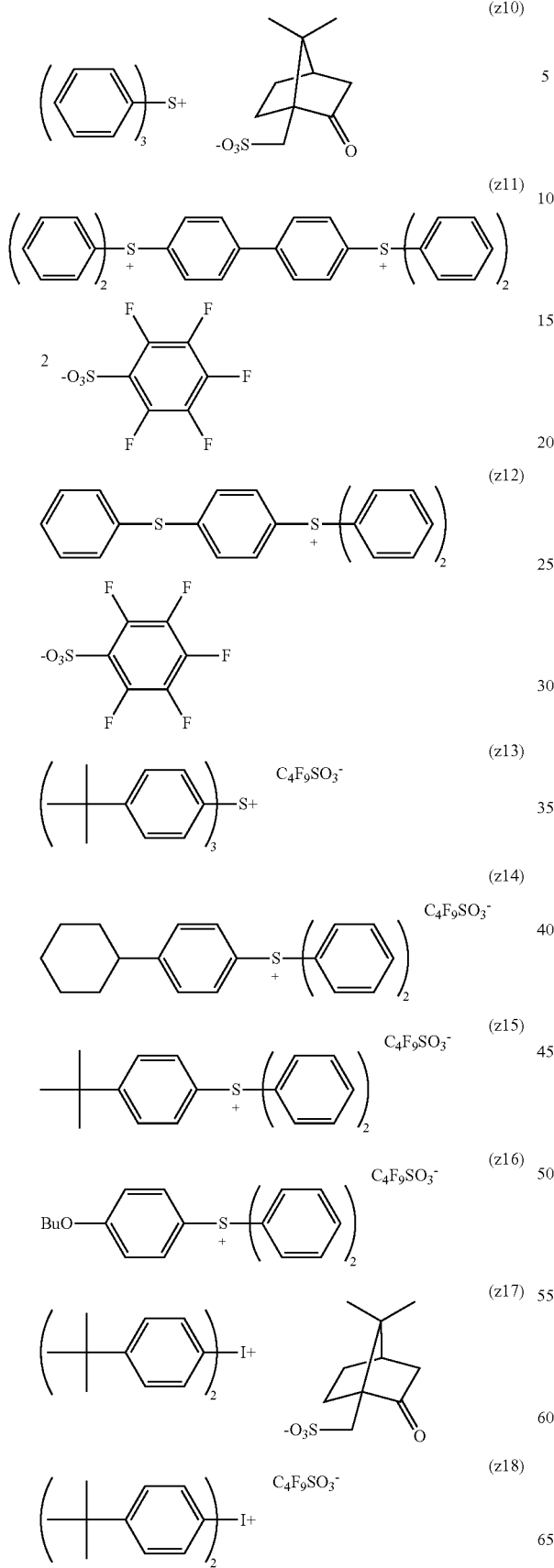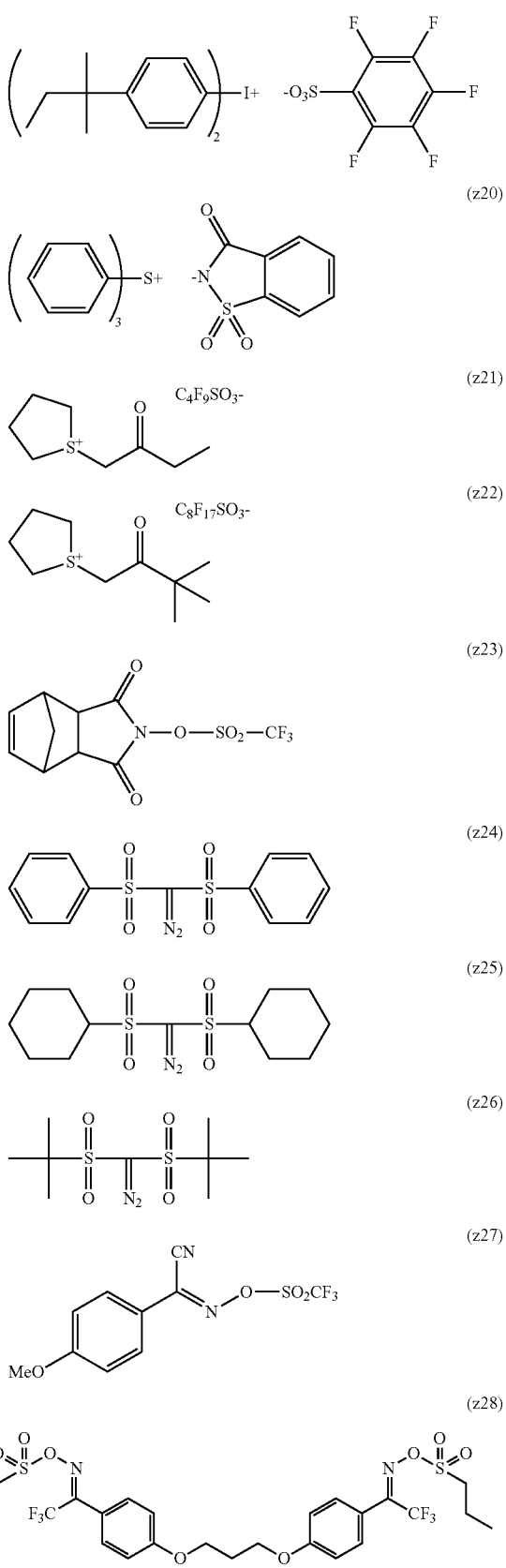

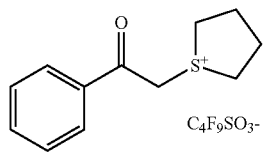 (z29)
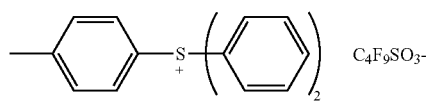 (z30)
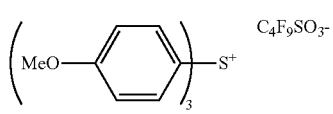 (z31)
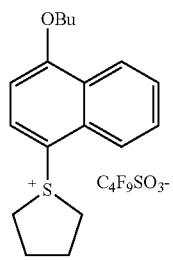 (z32)
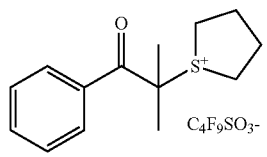 (z33)
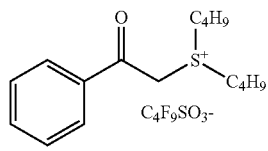 (z34)
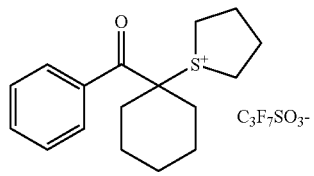 (z35)
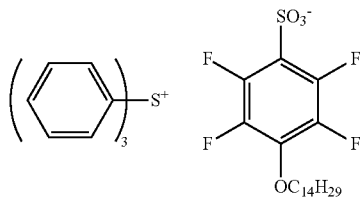 (z36)
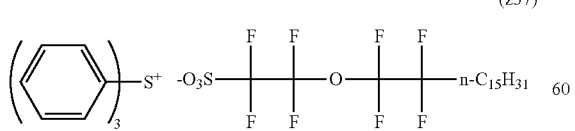 (z37)
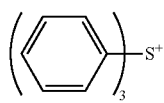 (z38)
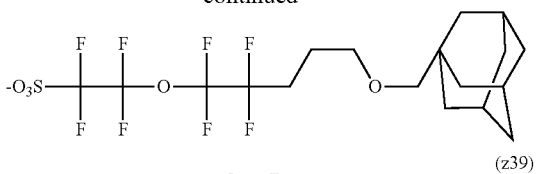 (z39)
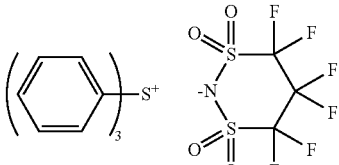 (z40)
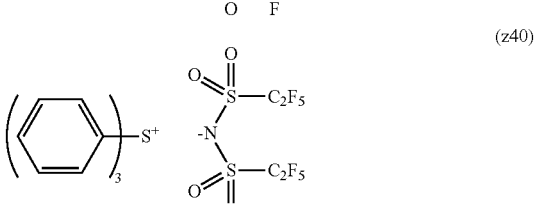 (z41)
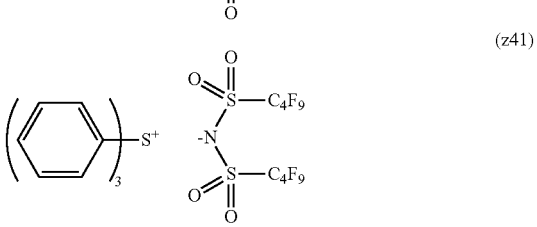 (z42)
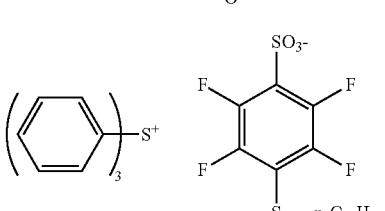 (z43)
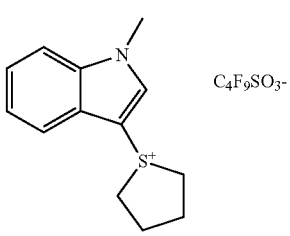 (z44)
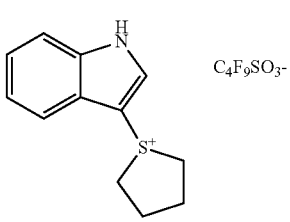 (z45)
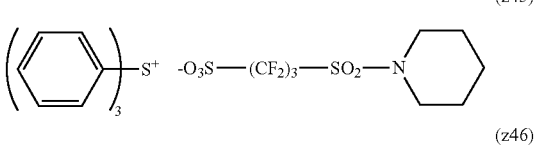 (z46)
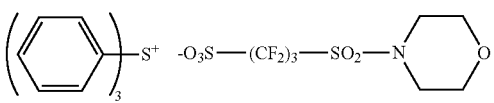

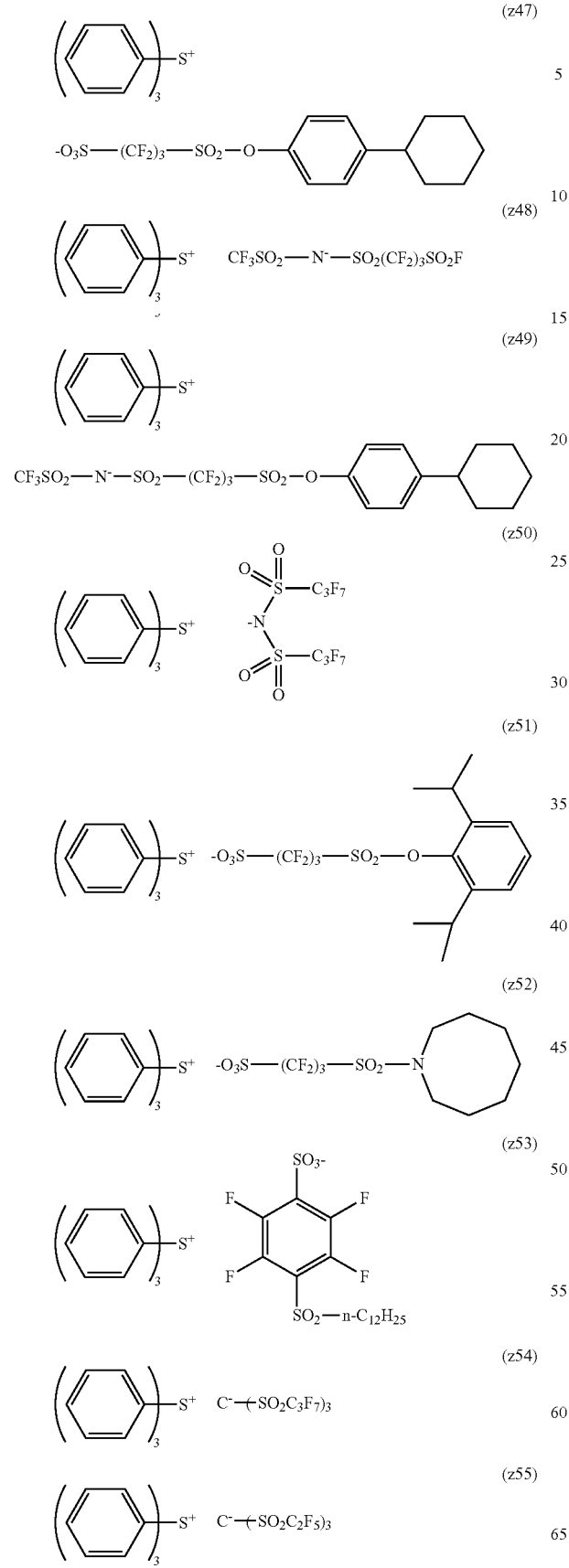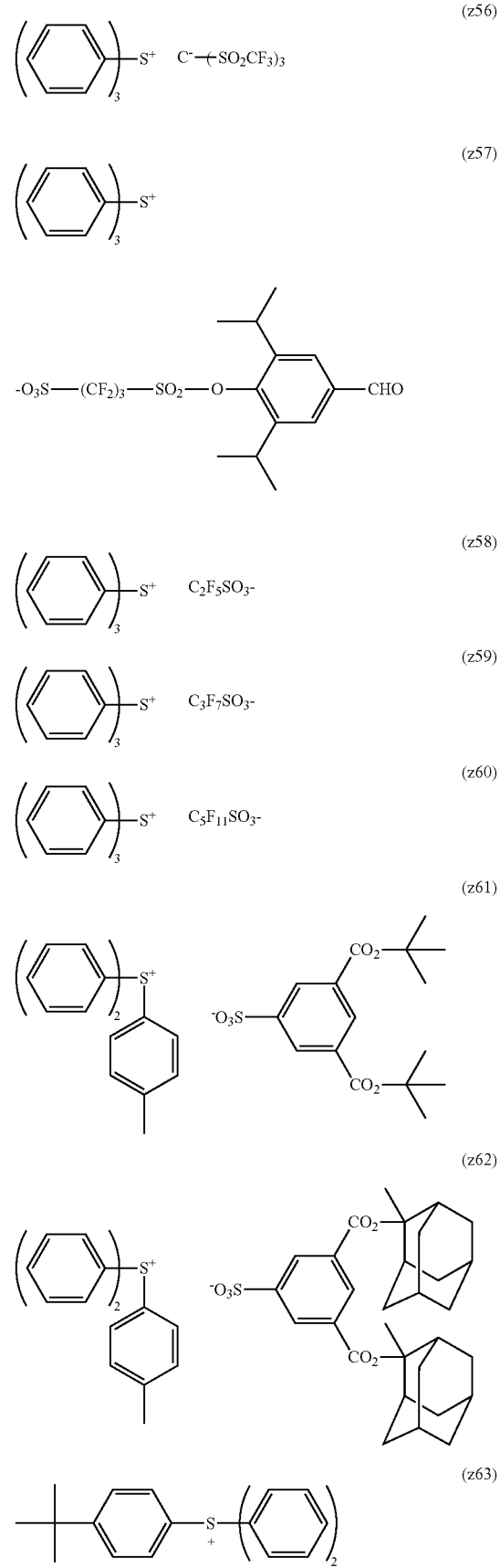

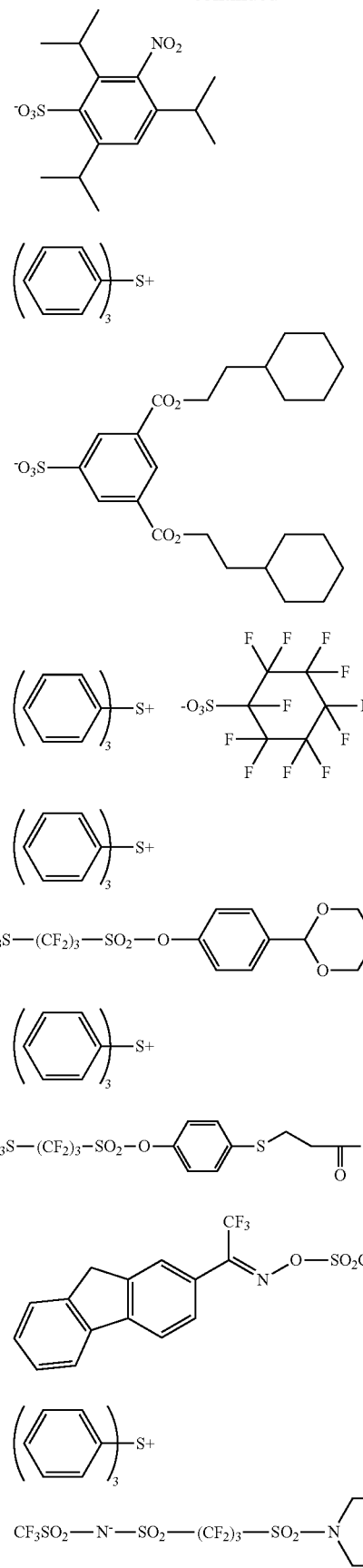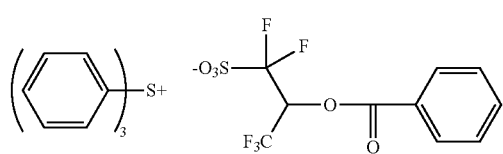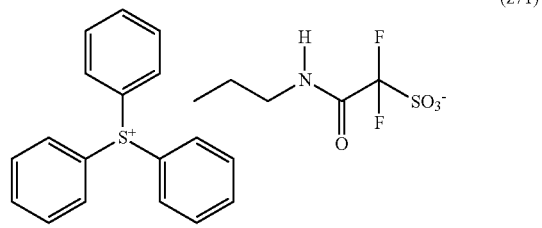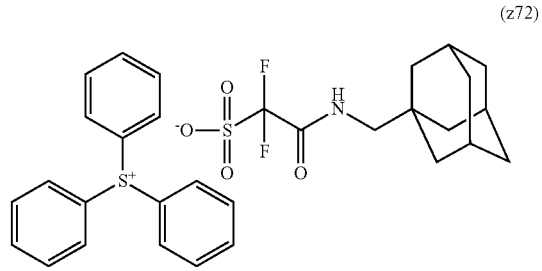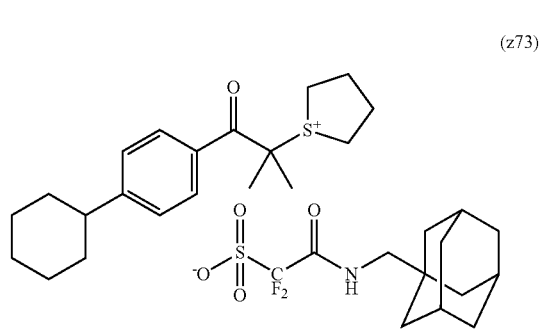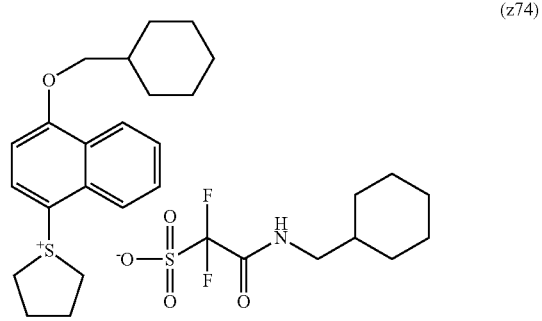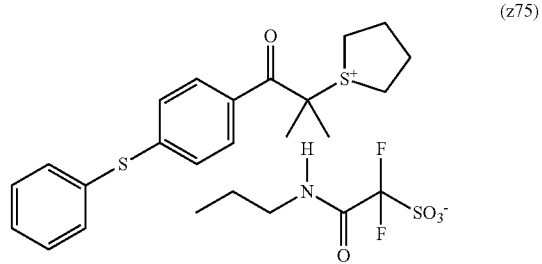

-continued
(z76)
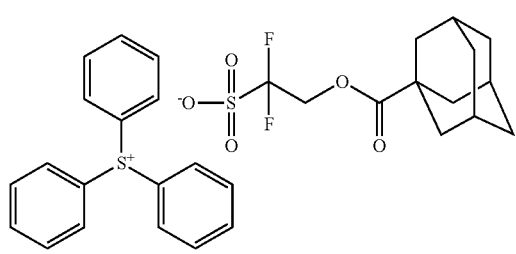
(z77)
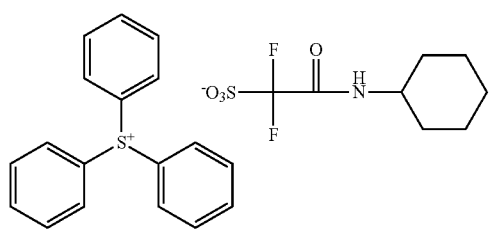
(z78)
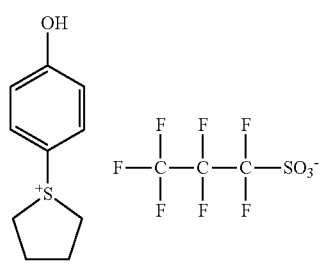
(z79)
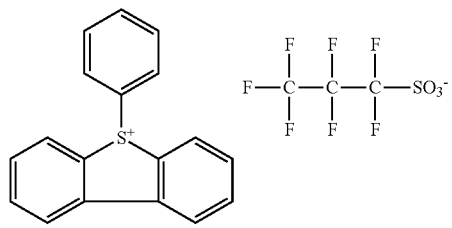
(z80)
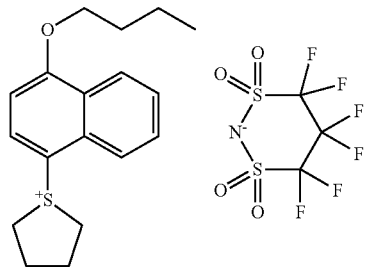
(z81)
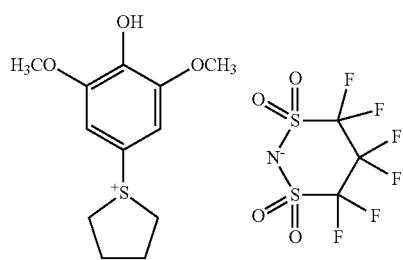
-continued
(z82)
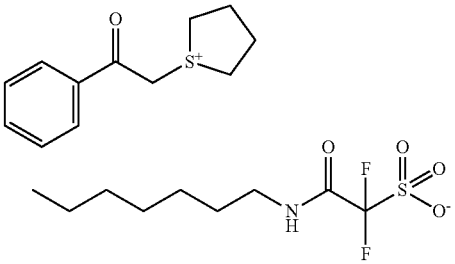
(z83)
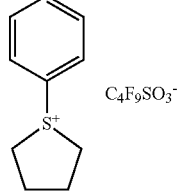
(z84)
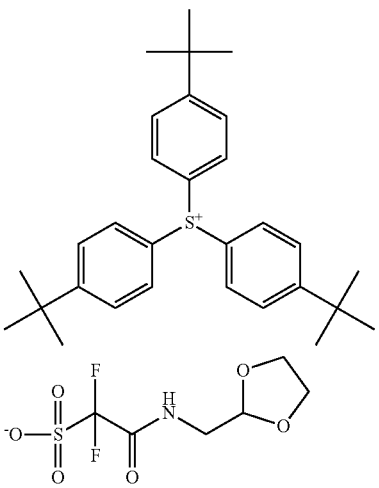
(z85)
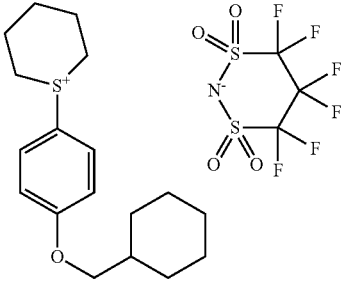
(z86)
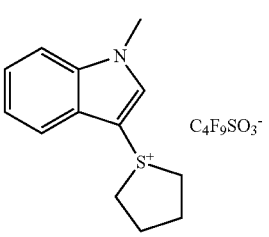

(z87) 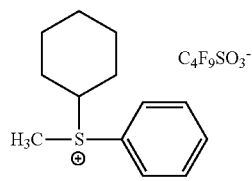
(z88) 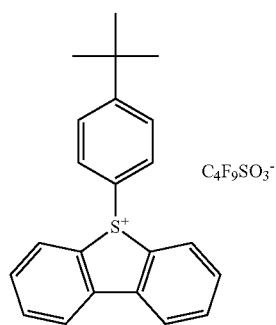
(z89) 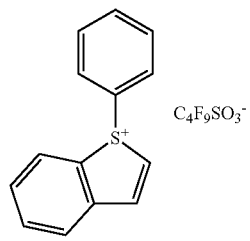
(z90) 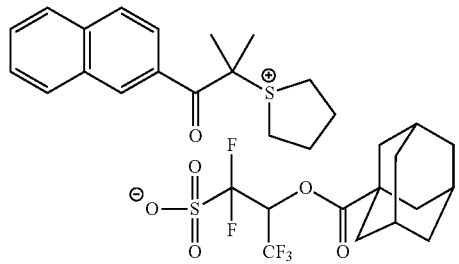
(z91) 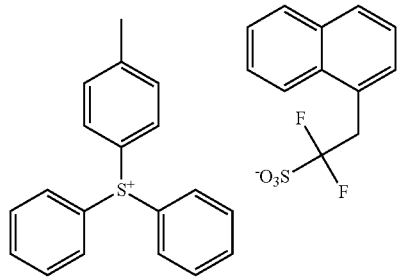
(z92) 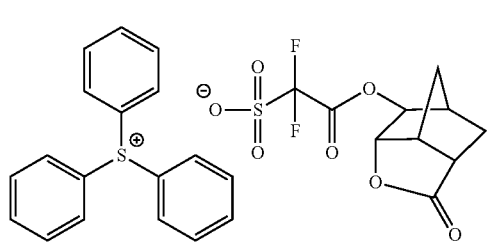
(z93) 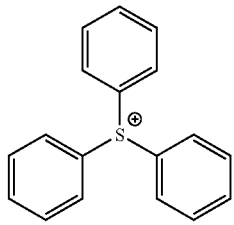
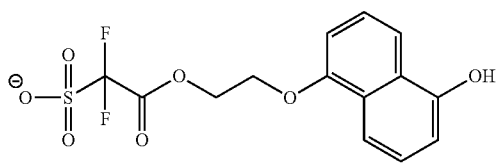
(z94) 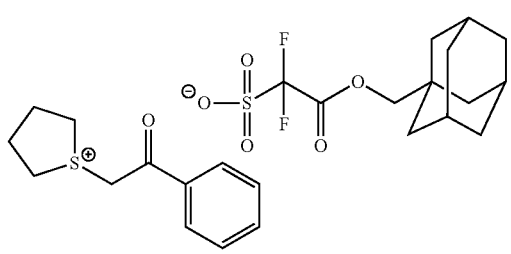
(z95) 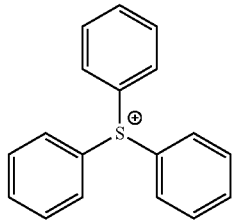
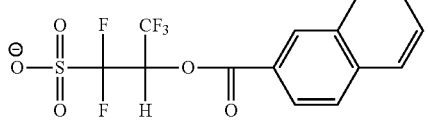
(z96) 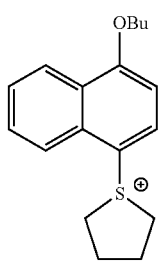
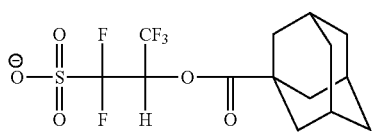

-continued (z97) 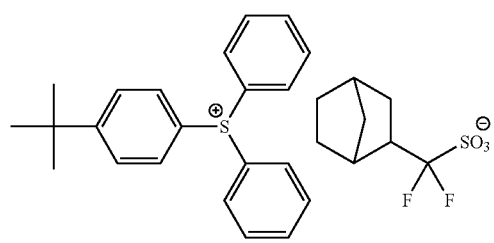

(z98) 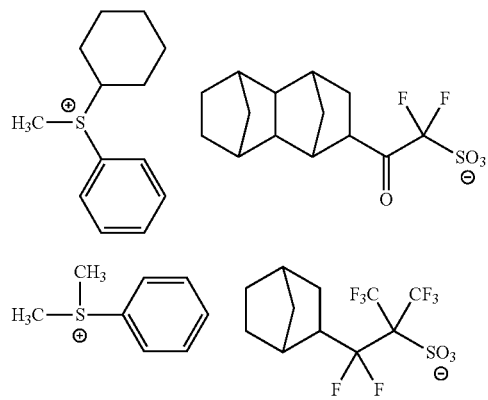

(z99)

(z100) 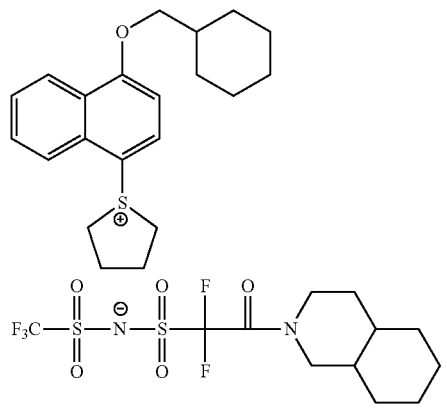

(z101) 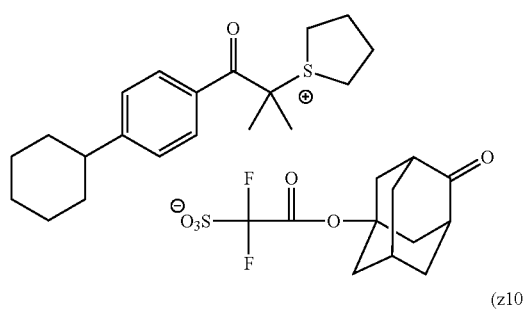

(z102) 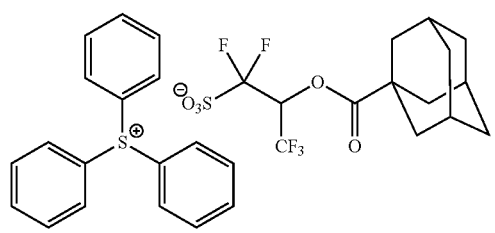

-continued (z103) 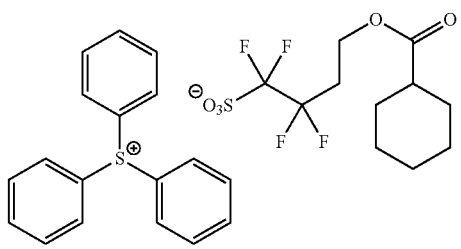

(z104) 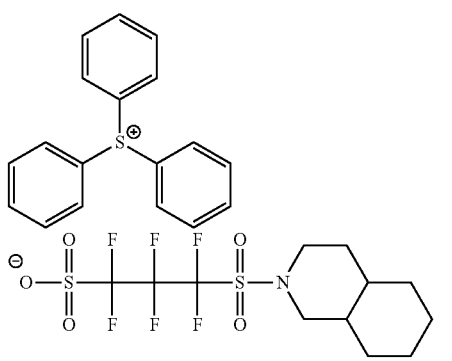

(z105) 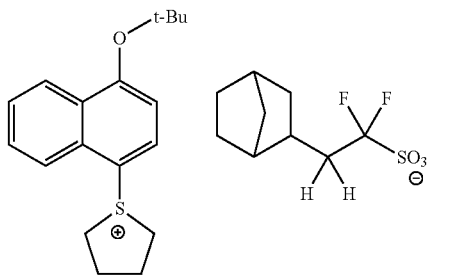

(z106) 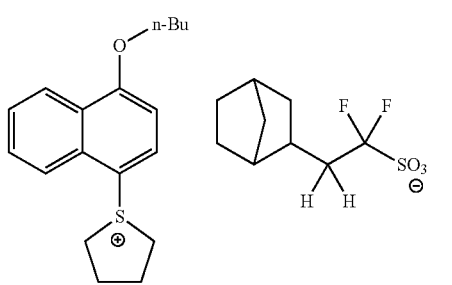

The acid generators can be used either individually or in combination of two or more kinds.

The content of the acid generators based on the total solids of the composition is preferably in the range of 0.1 to 30 mass %, more preferably 0.5 to 25 mass %, further more preferably 3 to 20 mass %, and particularly preferably 3 to 15 mass %.

When the acid generator is represented by general formula (ZI-3) or (ZI-4), the content thereof based on the total solids of the composition is preferably in the range of 5 to 20 mass %, more preferably 8 to 20 mass %, further more preferably 10 to 20 mass %, and particularly preferably 10 to 15 mass %.

[Solvent]

The composition according to the present invention may further contain solvent. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As alkyl lactates, methyl lactate, ethyl lactate, propyl lactate and butyl lactate can be exemplified.

As alkyl alkoxypropionates, ethyl 3-ethoxypropionate, methyl 3-methoxypropionate, methyl 3-ethoxypropionate, and ethyl 3-methoxypropionate can be exemplified.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As alkylene carbonates, propylene carbonate, vinylene carbonate, ethylene carbonate, and butylene carbonate can be exemplified.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As alkyl pyruvates, methyl pyruvate, ethyl pyruvate and propyl pyruvate can be exemplified.

As a preferably employable solvent, a solvent having a boiling point measured at ordinary temperature under ordinary pressure of 130° C. or above can be mentioned. As the solvent, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester, and propylene carbonate can be exemplified.

These solvents may be used either individually or in combination.

In the present invention, a mixed solvent consisting of a mixture of a solvent having a hydroxyl group in its structure and a solvent having no hydroxyl group may be used as the organic solvent.

As the solvent having a hydroxyl group, there can be mentioned, for example, ethylene glycol, ethylene glycol monomethyl ether, ethylene glycol monoethyl ether, propylene glycol, propylene glycol monomethyl ether, propylene glycol monoethyl ether, ethyl lactate or the like. Of these, propylene glycol monomethyl ether and ethyl lactate are especially preferred.

As the solvent having no hydroxyl group, there can be mentioned, for example, propylene glycol monomethyl ether acetate, ethyl ethoxypropionate, 2-heptanone, γ-butyrolactone, cyclohexanone, butyl acetate, N-methylpyrrolidone, N,N-dimethylacetamide, dimethyl sulfoxide or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents containing propylene glycol monomethyl ether acetate.

[Basic Compound]
[Basic Compound]

The composition of the present invention preferably contains a basic compound so as to decrease any performance alteration over time from exposure to heating.

As preferred basic compounds, there can be mentioned the compounds having the structures of the following formulae (A) to (E).

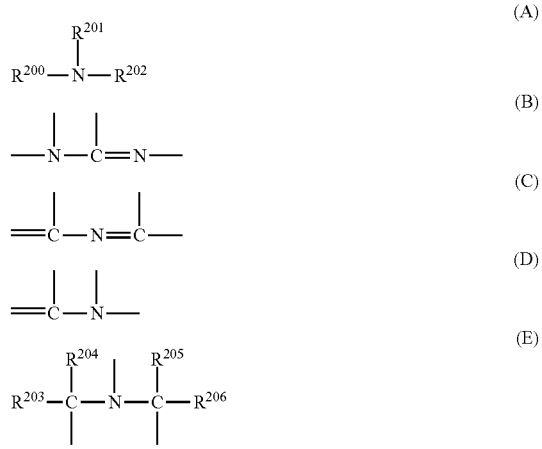

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring.

$R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

As the amine compound, use can be made of primary, secondary and tertiary amine compounds. An amine compound having its at least one alkyl group bonded to the nitrogen atom thereof is preferred. Among the amine compounds, a tertiary amine compound is more preferred. In the amine compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. In the amine compounds, it is preferred for the alkyl chain to contain an oxygen atom so as to form an oxyalkylene group. The number of oxyalkylene groups in each molecule is one or more, preferably 3 to 9 and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

As the ammonium salt compound, use can be made of primary, secondary, tertiary and quaternary ammonium salt compounds. An ammonium salt compound having its at least one alkyl group bonded to the nitrogen atom thereof is preferred. Of the ammonium salt compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. Of the ammonium salt compounds, it is preferred for the alkyl chain to contain an oxygen atom so as to form an oxyalkylene group. The number of oxyalkylene groups in each molecule is one or more, preferably 3 to 9 and still more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

As the anion of the ammonium salt compounds, there can be mentioned a halide atom, a sulfonate, a borate, a phosphate or the like. Of these, a halide and a sulfonate are preferred. Among halides, chloride, bromide and iodide are especially preferred. Among sulfonates, an organic sulfonate having 1 to 20 carbon atoms is especially preferred. As the organic sulfonate, there can be mentioned an aryl sulfonate and an alkyl sulfonate having 1 to 20 carbon atoms. The alkyl group of the alkyl sulfonate may have a substituent. As the substituent, there can be mentioned, for example, fluorine, chlorine, bromine, an alkoxy group, an acyl group, an aryl group or the like. As specific examples of the alkyl sulfonates, there can be mentioned methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate and the like. As the aryl group of the aryl sulfonate, there can be mentioned a benzene ring, a naphthalene ring or an anthracene ring. The benzene ring, naphthalene ring or anthracene ring may have a substituent. As preferred substituents, there can be mentioned a linear or branched alkyl group having 1 to 6 carbon atoms and a cycloalkyl group having 3 to 6 carbon atoms. As specific examples of the linear or branched alkyl groups and cycloalkyl groups, there can be mentioned methyl, ethyl, n-propyl, isopropyl, n-butyl, i-butyl, t-butyl, n-hexyl, cyclohexyl and the like. As other substituents, there can be mentioned an alkoxy group having 1 to 6 carbon atoms, a halogen atom, cyano, nitro, an acyl group, an acyloxy group and the like.

The amine compound having a phenoxy group and ammonium salt compound having a phenoxy group are those having a phenoxy group at the end of the alkyl group of the amine compound or ammonium salt compound opposed to the nitrogen atom. The phenoxy group may have a substituent. As the substituent of the phenoxy group, there can be mentioned, for example, an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like. The substitution position of the substituent may be any of 2- to 6-positions. The number of substituents is optional within the range of 1 to 5.

It is preferred that at least one oxyalkylene group exist between the phenoxy group and the nitrogen atom. The number of oxyalkylene groups in each molecule is one or more, preferably 3 to 9 and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group.

The sulfonic ester group of the amine compound having a sulfonic ester group or ammonium salt compound having a sulfonic ester group may be any of an alkylsulfonic ester, a cycloalkylsulfonic ester and an arylsulfonic ester. In the alkylsulfonic ester, the alkyl group preferably has 1 to 20 carbon atoms. In the cycloalkylsulfonic ester, the cycloalkyl group preferably has 3 to 20 carbon atoms. In the arylsulfonic ester, the aryl group preferably has 6 to 12 carbon atoms. The alkylsulfonic ester, cycloalkylsulfonic ester and arylsulfonic ester may have substituents. As preferred substituents, there can be mentioned a halogen atom, a cyano group, a nitro group, a carboxyl group, a carboxylic ester group and a sulfonic ester group.

It is preferred that at least one oxyalkylene group exist between the sulfonic ester group and the nitrogen atom. The number of oxyalkylene groups in each molecule is one or more, preferably 3 to 9 and more preferably 4 to 6. The oxyalkylene group is preferably an oxyethylene group (—CH$_2$CH$_2$O—) or an oxypropylene group (—CH(CH$_3$)CH$_2$O— or —CH$_2$CH$_2$CH$_2$O—), more preferably an oxyethylene group.

These basic compounds are used either individually or in combination.

The amount of basic compound used is generally in the range of 0.001 to 10 mass %, preferably 0.01 to 5 mass % based on the solid contents of the composition of the invention.

With respect to the ratio of the acid generator to basic compound used in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 5.0 to 200, still more preferably 7.0 to 150.

[Surfactant]

The composition of the present invention preferably further contains a surfactant, and more preferably contains any one, or two or more members, of fluorinated and/or siliconized surfactants (fluorinated surfactant, siliconized surfactant and surfactant containing both fluorine and silicon atoms).

The composition of the present invention when containing the above surfactant would, in the use of an exposure light source of 250 nm or below, especially 220 nm or below, realize favorable sensitivity and resolving power and produce a resist pattern with less adhesion and development defects.

As the fluorinated and/or siliconized surfactants, there can be mentioned, for example, those described in JP-A's-62-36663, 61-226746, 61-226745, 62-170950, 63-34540, 7-230165, 8-62834, 9-54432, 9-5988 and 2002-277862 and U.S. Pat. Nos. 5,405,720, 5,360,692, 5,529,881, 5,296,330, 5,436,098, 5,576,143, 5,294,511 and 5,824,451. Any of the following commercially available surfactants can be used as is.

As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly(oxyalkylene) methacrylate, which copolymer may have an irregular distribution or may result from block copolymerization. As the poly(oxyalkylene) group, there can be mentioned a poly(oxyethylene) group, a poly(oxypropylene) group, a poly(oxybutylene) group or the like. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a C$_6$F$_{13}$ group and a poly(oxyalkylene) acrylate (or methacrylate), a copolymer from an acrylate (or methacrylate) having a C$_3$F$_7$ group, poly(oxyethylene) acrylate (or methacrylate) and poly(oxypropylene) acrylate (or methacrylate), or the like.

In the present invention, surfactants other than the fluorinated and/or siliconized surfactants can also be employed. In particular, there can be mentioned, for example, nonionic surfactants including a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, or the like These surfactants may be used either individually or in combination.

The amount of each surfactant used is preferably in the range of 0 to 2 mass %, more preferably 0.0001 to 2 mass % and still more preferably 0.0005 to 1 mass % based on the total mass of the composition of the present invention(excluding the solvent).

[Carboxylic Acid Onium Salt]

The composition of the present invention may contain a carboxylic acid onium salt. As the carboxylic acid onium salt, there can be mentioned, for example, a carboxylic acid sulfonium salt, a carboxylic acid iodonium salt, a carboxylic acid ammonium salt or the like. The especially preferred carboxylic acid onium salts are the iodonium salt and the sulfonium salt. It is preferred for the carboxylate residue of the carboxylic acid onium salt for use in the present invention to be one containing neither an aromatic group nor a carbon-carbon double bond. In particular, the especially preferred anion moiety thereof is a linear or branched cycloalkylcarboxylate anion of a single ring or multiple rings having 1 to 30 carbon atoms. A more preferred anion moiety is an anion of carboxylic acid wherein the alkyl group is partially or wholly fluorinated. The alkyl chain may contain an oxygen atom. Accordingly, there would be achieved securement of the transparency in 220 nm or shorter light, enhancement of the sensitivity and resolving power and improvement of the isodense bias and exposure margin.

As the fluorinated carboxylic acid anion, there can be mentioned any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid, or the like.

These carboxylic acid onium salts can be synthesized by reacting a sulfonium hydroxide, an iodonium hydroxide or an ammonium hydroxide and a carboxylic acid with silver oxide in an appropriate solvent.

The content ratio of each carboxylic acid onium salt in the composition is generally in the range of 0.1 to 20 mass %, preferably 0.5 to 10 mass % and still more preferably 1 to 7 mass % based on the total solids of the composition.

[Dissolution Inhibiting Compound]

The composition of the present invention may contain a dissolution inhibiting compound of 3000 or less molecular weight that is decomposed by the action of an acid to thereby increase the solubility in an alkali developer (hereinafter referred to as "dissolution inhibiting compound").

From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to the resin as the component (B).

When the composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

In the present invention, the molecular weight of each dissolution inhibiting compound is 3000 or less, preferably 300 to 3000 and more preferably 500 to 2500.

The amount of dissolution inhibiting compound added is preferably in the range of 3 to 50 mass %, more preferably 5 to 40 mass % based on the total solids of the composition of the present invention.

Specific examples of the dissolution inhibiting compounds will be shown below, which however in no way limit the scope of the present invention.

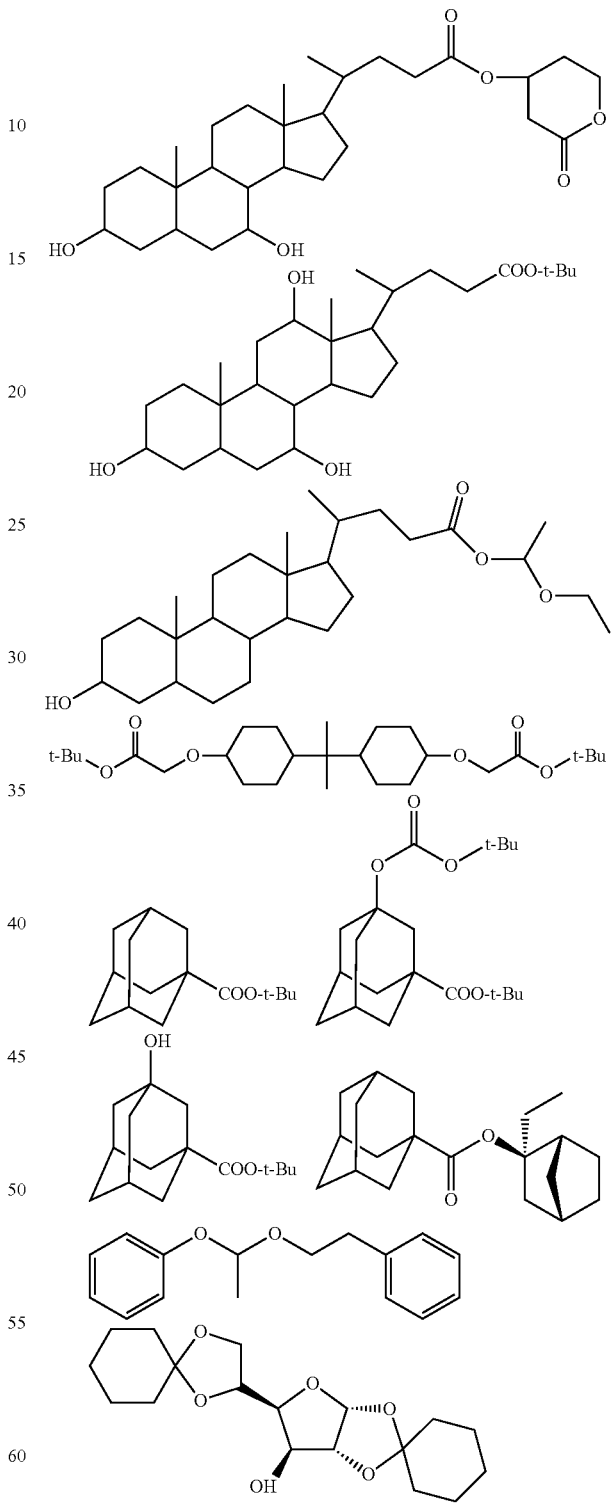

[Other Additives]

The composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

Method of Forming Pattern

From the viewpoint of enhancement of resolving power, it is preferred for the composition of the present invention to be used with a coating thickness of 30 to 250 nm. More preferably, the composition is used with a coating thickness of 30 to 200 nm. This coating thickness can be attained by setting the solid content of the composition within an appropriate range so as to cause the composition to have an appropriate viscosity, thereby improving the applicability and film forming property.

The total solids content of the actinic-ray- or radiation-sensitive resin composition is generally in the range of 1 to 10 mass %, preferably 1 to 8.0 mass % and more preferably 1 to 6.0 mass %.

The composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, especially 0.05 μm or less and more especially 0.03 μm or less.

For example, an actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a resist film.

The resist film is exposed through a given mask to actinic rays or radiation, preferably baked (heated), and developed and rinsed. Accordingly, a desirable pattern can be obtained.

As the actinic rays or radiation, there can be mentioned infrared rays, visible light, ultraviolet rays, far ultraviolet rays, extreme ultraviolet rays, X-rays, electron beams or the like. Among them, preferred use is made of far ultraviolet rays of especially 250 nm or less, more especially 220 nm or less and still more especially 1 to 200 nm wavelength, such as a KrF excimer laser (248 nm), an ArF excimer laser (193 nm) and an $F_2$ excimer laser (157 nm), as well as X-rays, electron beams and the like. More preferred use is made of an ArF excimer laser, an $F_2$ excimer laser, EUV (13 nm) and electron beams.

Prior to the formation of a resist film, the substrate may be coated with an antireflection film.

As the antireflection film, use can be made of not only an inorganic film of titanium, titanium oxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

In the development step, an alkali developer is used as follows. As the alkali developer for an actinic-ray- or radiation-sensitive resin composition, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

EXAMPLE

The present invention will be described in greater detail below by way of its examples. However, the gist of the present invention is in no way limited to these examples.

Synthetic Example 1

Synthesis of Compound (1)

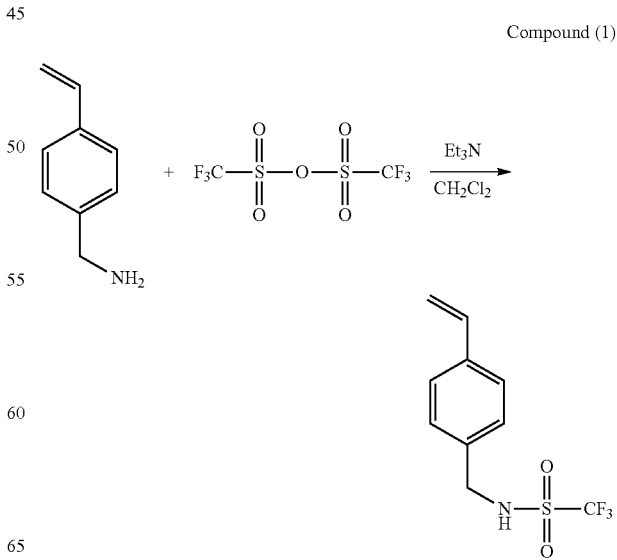

In a three-necked flask, 15 g of 4-vinylbenzylamine and 22.8 g of triethylamine were dissolved in 75 g of dichloromethane, and the internal temperature was cooled to −20° C. Subsequently, 31.2 g of trifluoromethanesulfonic acid anhydride was dropped in the cooled solution. During the dropping, the internal temperature was regulated so as to be maintained at −10° C. or below. The mixture was agitated for one hour while maintaining the internal temperature at −20° C., and the temperature was raised to room temperature. The mixture was further agitated for one hour, and the reaction liquid was poured into 150 g of saturated aqueous sodium bicarbonate solution. The resultant organic phase was separated, washed with 75 g of water, concentrated and crystallized, thereby obtaining 16.2 g of compound (1) (yield: 87.5%, white solid). FIG. 1 shows the NMR chart of obtained compound (1) (1H-NMR400MHz, solvent CDCl$_3$).

Synthetic Example 2

Synthesis of Resin (C-1)

In a nitrogen gas atmosphere, 56.7 g of propylene glycol monomethyl ether acetate (PGMEA) was placed in a three-necked flask and heated at 80° C. A solution obtained by dissolving 15.0 g of compound (1), 13.6 g of 4-tert-butylstyrene and 5.0 mol %, based on the monomers, of polymerization initiator V601 (produced by Wako Pure Chemical Industries, Ltd.) in 105.3 g of PGMEA was dropped thereinto over a period of 4 hours. After the completion of the dropping, reaction was continued at 80° C. for 4 hours. The thus obtained reaction liquid was allowed to stand still to cool and was dropped into a mixed liquid consisting of 1300 g of methanol and 150 g of distilled water over a period of 20 minutes. The thus precipitated powder was collected by filtration and dried, thereby obtaining 24.0 g of polymer (C-1).

With respect to the obtained polymer (C-1), the standard-polystyrene-equivalent weight average molecular weight was 7600 and the dispersity (Mw/Mn) thereof was 1.99.

In the same manner as described above, the following other resins (C) were synthesized.

[Resin (C)]

(C-1)

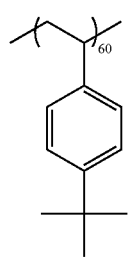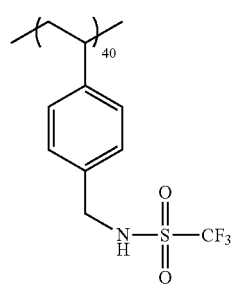

Mw = 7600
Mw/Mn = 1.99

(C-2)

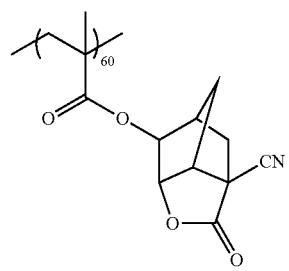

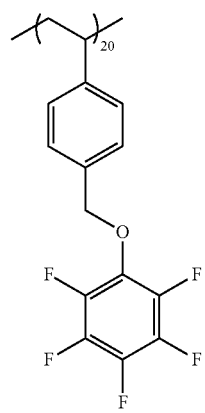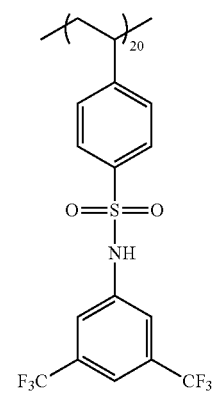

Mw - 8500
Mw/Mn = 1.81

(C-3)

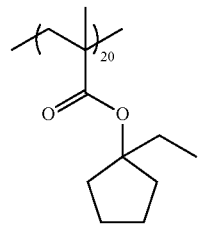

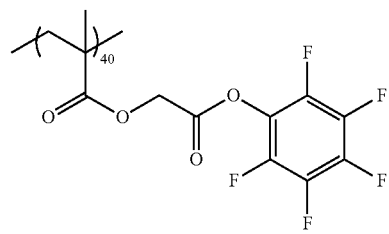

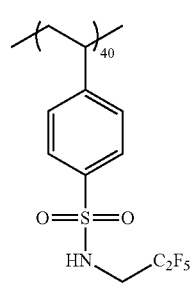

Mw = 9800
Mw/Mn = 1.87

(C-4)
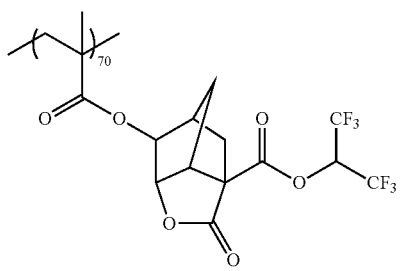
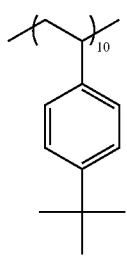 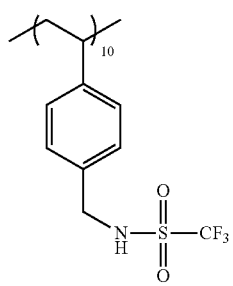
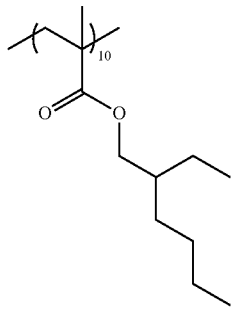
Mw = 17300
Mw/Mn = 2.01
(C-5)
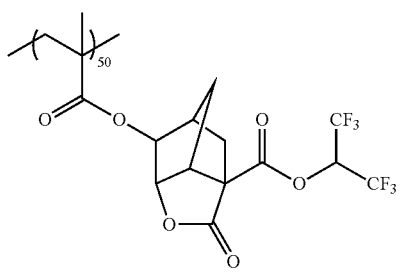
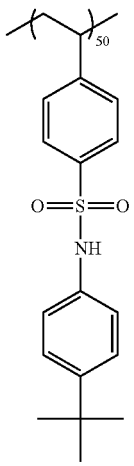
Mw = 9900
Mw/Mn = 1.81
(C-6)
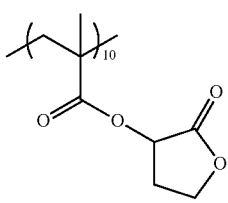 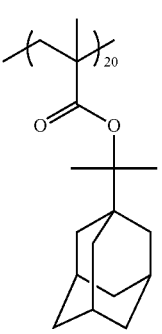
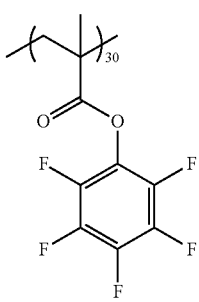
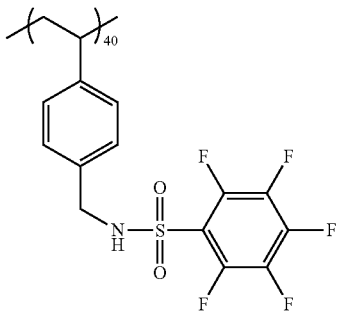
Mw = 9800
Mw/Mn = 1.86

-continued
(C-7)
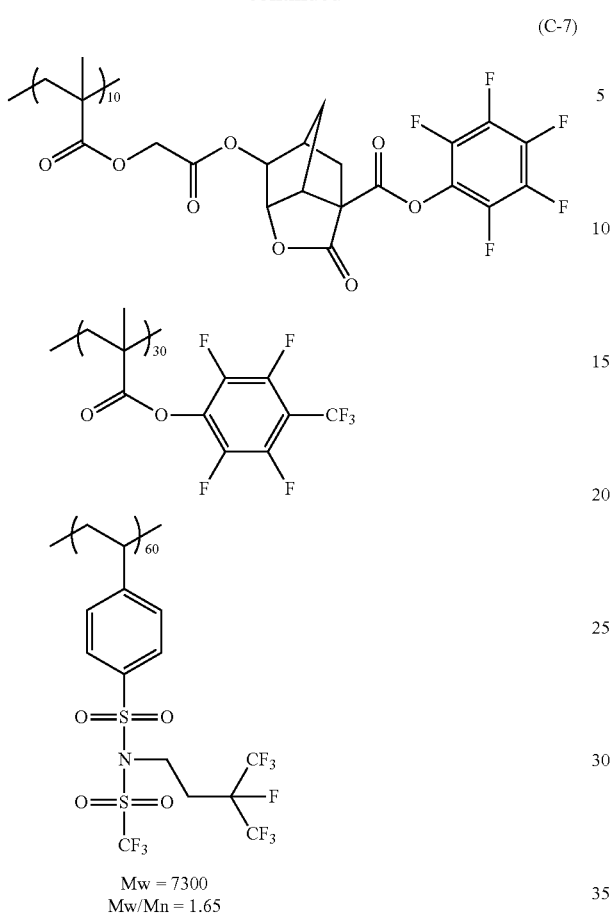
Mw = 7300
Mw/Mn = 1.65
(C-8)
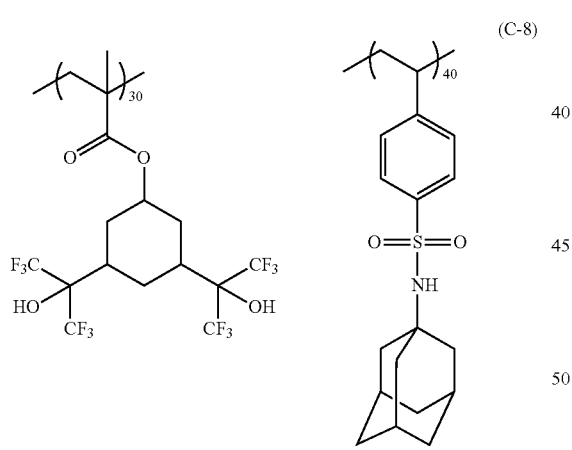
Mw = 9800
Mw/Mn = 1.65
-continued
(C-9)
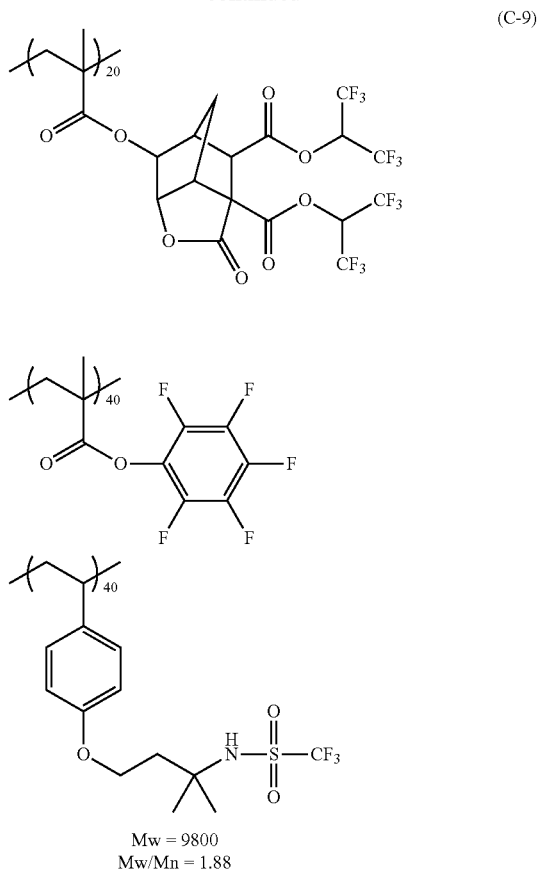
Mw = 9800
Mw/Mn = 1.88
(C-10)
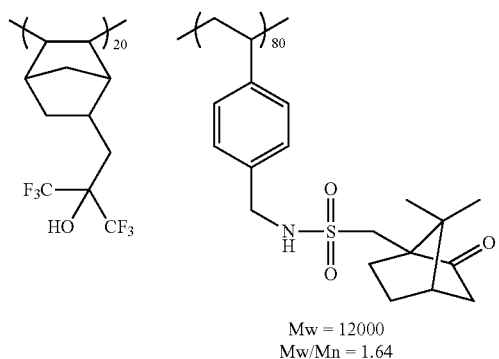
Mw = 12000
Mw/Mn = 1.64
(C-11)
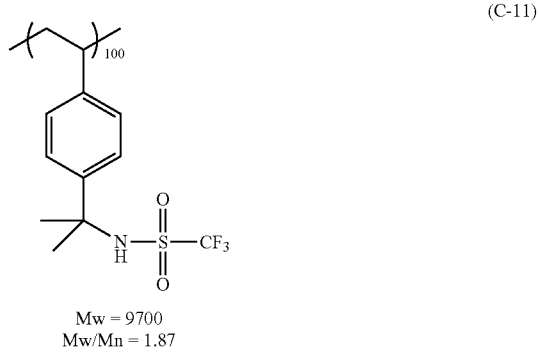
Mw = 9700
Mw/Mn = 1.87

[Resin (CP)]
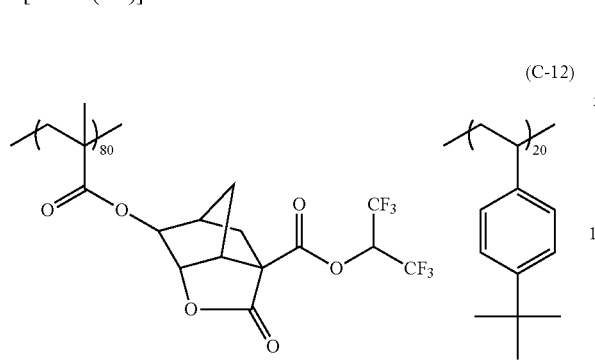
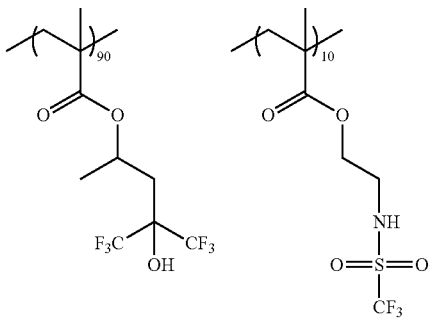
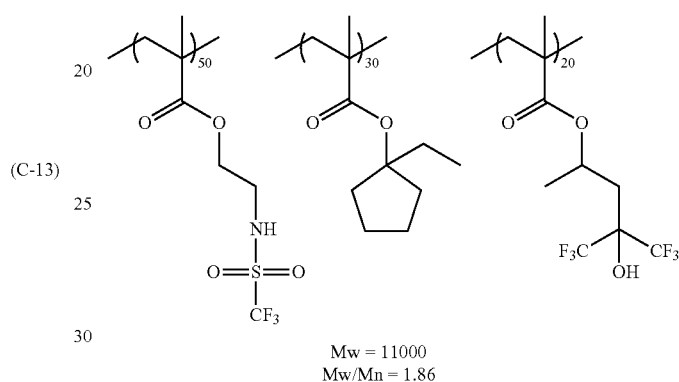
Synthetic Example 3
Synthesis of Resin (RA-1)
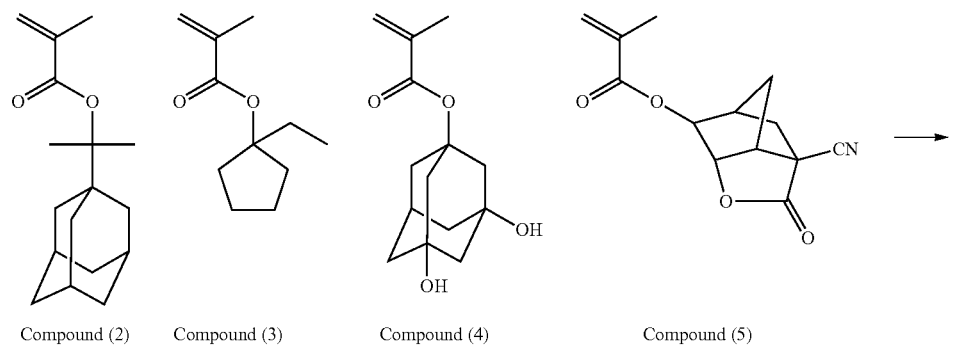
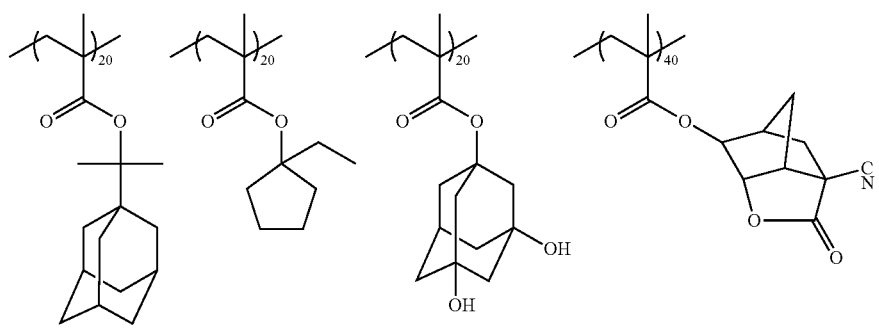

In a nitrogen gas stream, 71.0 g of cyclohexanone was placed in a three-necked flask and heated at 80° C. A solution obtained by dissolving 7.9 g of compound (2), 5.5 g of compound (3), 7.6 g of compound (4), 14.8 g of compound (5) and 7 mol %, based on the total amount of compounds (1) to (5), of polymerization initiator V601 (produced by Wako Pure Chemical Industries, Ltd.) in 132 g of cyclohexanone was dropped thereinto over a period of 6 hours. After the completion of the dropping, reaction was continued at 80° C. for 2 hours. The thus obtained reaction liquid was allowed to stand still to cool and was dropped into a mixed liquid consisting of 800 ml of hexane and 200 ml of ethyl acetate over a period of 20 minutes. The thus precipitated powder was collected by filtration and dried, thereby obtaining 28.7 g of resin (RA-1). With respect to the obtained resin, the standard-polystyrene-equivalent weight average molecular weight was 8300 and the dispersity (Mw/Mn) thereof was 1.81.

In the same manner as described above, the following other resins (B) were synthesized.

With respect to each of the acid-decomposable resins (B) used in the Examples, the structures of individual repeating units, molar ratio thereof, weight average molecular weight (Mw) and dispersity (Mw/Mn) are shown below.

(RA-1)

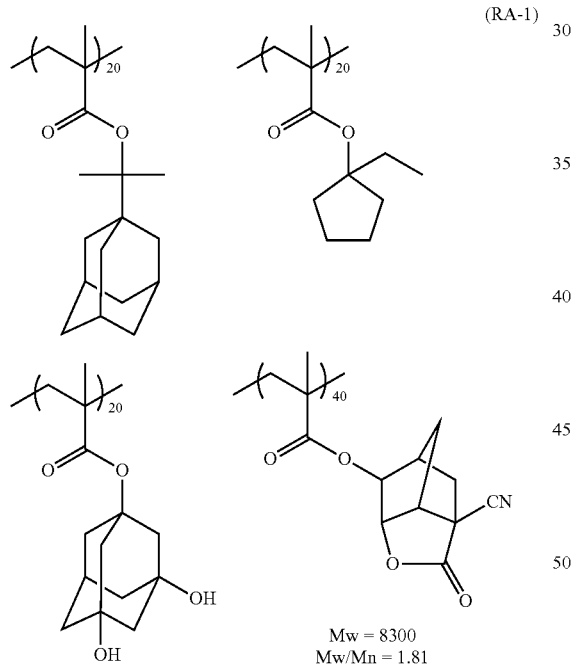

Mw = 8300
Mw/Mn = 1.81

(RA-2)

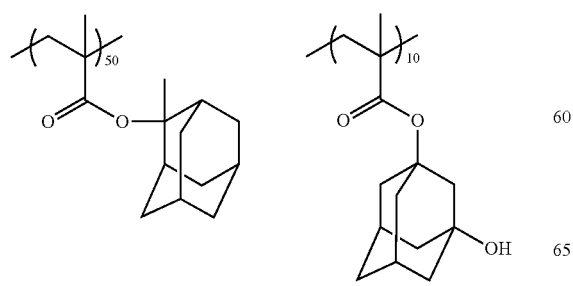

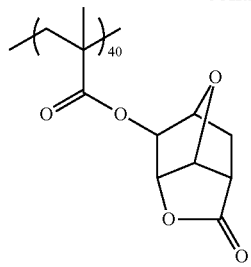

Mw = 15600
Mw/Mn = 2.03

(RA-3)

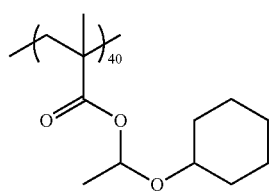

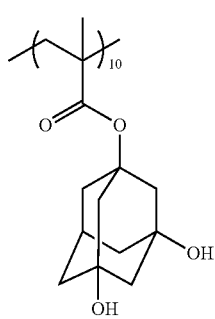

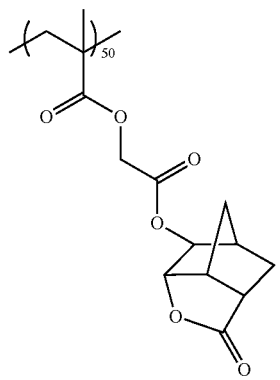

Mw = 9800
Mw/Mn = 1.86

(RA-4)

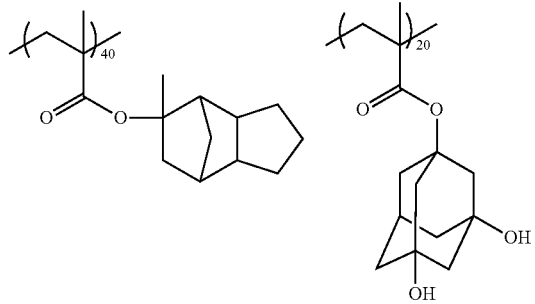

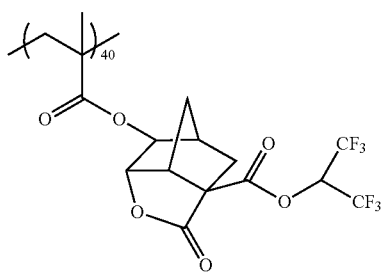
Mw = 6900
Mw/Mn = 1.71
(RA-5)
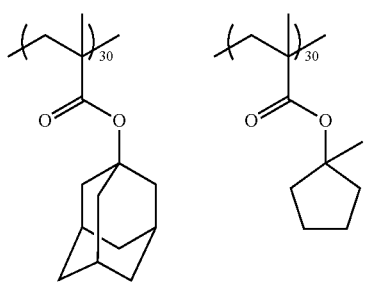
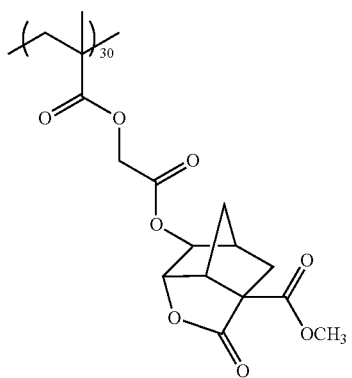
Mw = 18300
Mw/Mn = 2.10
(RA-6)
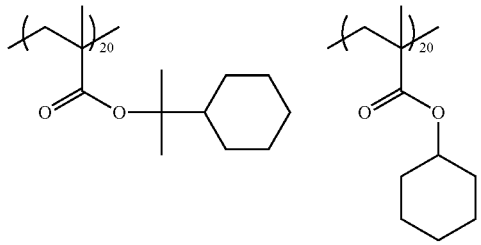
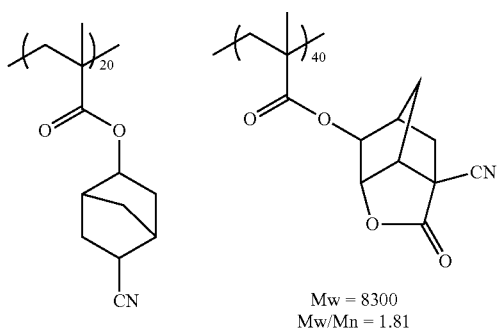
Mw = 8300
Mw/Mn = 1.81
(RA-7)
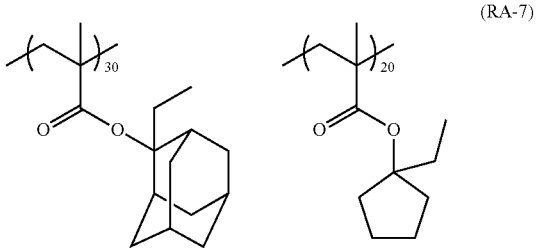
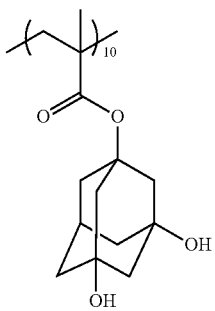
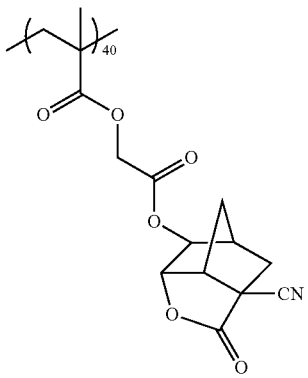
Mw = 9800
Mw/Mn = 1.86
(RA-8)
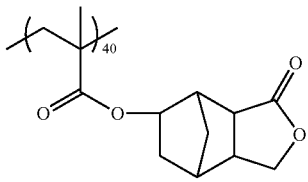
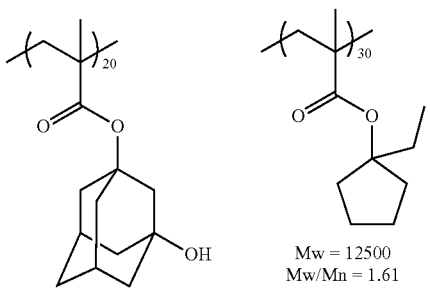
Mw = 12500
Mw/Mn = 1.61
(RA-9)
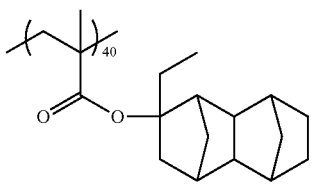

-continued

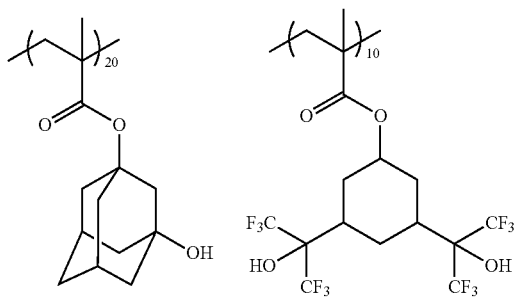

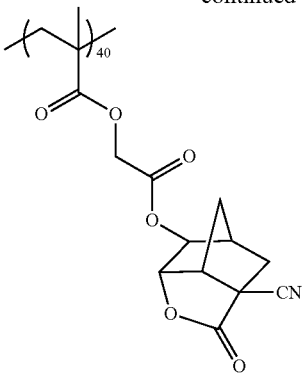

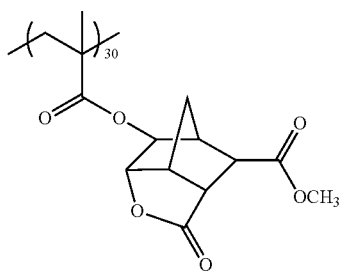

Mw = 8800
Mw/Mn = 1.76

(RA-10)

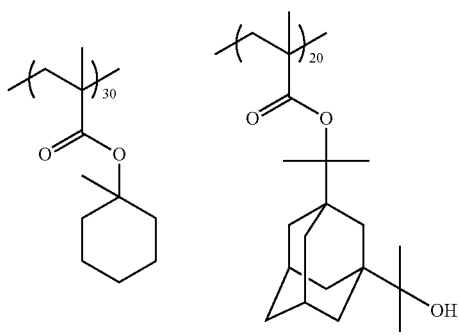

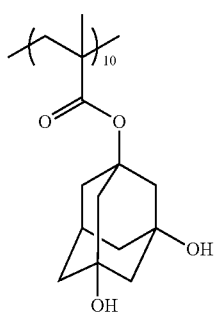

-continued

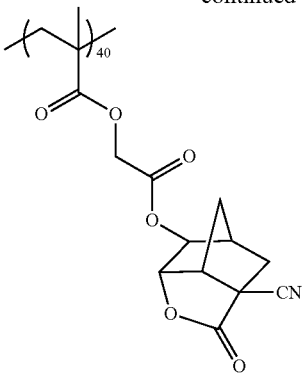

Mw = 9800
Mw/Mn = 1.66

<Preparation of Resist>

Components of the following Table were dissolved in solvents indicated in the table, thereby obtaining solutions of 5 mass % solid content. The solutions were each passed through a polyethylene filter of 0.1 μm pore size, thereby obtaining positive resist compositions. The thus obtained positive resist compositions were evaluated by the following methods, and the evaluation results are given in the table.

<Image Performance Test>

[Exposure Condition: ArF Liquid-Immersion Exposure]

An organic antireflection film ARC29SR (produced by Nissan Chemical Industries, Ltd.) was applied onto a silicon wafer of 12 inch caliber and baked at 205° C. for 60 seconds, thereby forming a 98 nm-thick antireflection film. Each of the prepared positive resist compositions was applied thereonto and baked at 120° C. for 60 seconds, thereby forming a 120 nm-thick resist film.

The resultant wafer was exposed through a 6% half-tone mask of 1:1 line and space pattern of 75 nm line width by means of an ArF excimer laser liquid-immersion scanner (manufactured by ASML, XT1250i, NA 0.85). Ultrapure water was used as an immersion liquid. Thereafter, the exposed wafer was baked at 120° C. for 60 seconds, developed with an aqueous solution of tetramethylammonium hydroxide (2.38 mass %) for 30 seconds, rinsed with pure water and spin dried, thereby obtaining a resist pattern.

[Scum]

Any development residues (scums) on a resist pattern of 75 nm line width were observed by means of a scanning electron microscope (model S-4800, manufactured by Hitachi, Ltd.). The evaluation mark "double circle" was given when no residue occurred at all. The evaluation mark Δ was given when the occurrence of residue was extreme. The evaluation mark ○ was given when the occurrence of residue was intermediate.

[Evaluation of Development Defect]

Random-mode measurement was carried out by means of a defect inspection apparatus KLA-2360 (trade name) manufactured by KLA-Tencor Corporation. In the defect inspection apparatus, the pixel size was set at 0.16 μm and the threshold value at 20. Any development defects extracted from differences generated by superimposition between a comparative image and the pixel unit were detected, and the number of development defects per area ($cm^2$) was calculated. The evaluation marks "double circle", ○, Δ and x were given when the calculated value was less than 0.5, 0.5 to less than 0.7, 0.7 to less than 1.0 and 1.0 or greater, respectively. The smaller the value, the better the performance exhibited.

[Bubble Defect]

An organic antireflection film ARC29SR (produced by Nissan Chemical Industries, Ltd.) was applied onto a silicon wafer of 12 inch caliber and baked at 205° C. for 60 seconds, thereby forming a 78 nm-thick antireflection film. Each of the prepared positive resist compositions was applied thereonto and dried by heating on a hot plate at 120° C. for 60 seconds, thereby forming a 100 nm-thick resist film.

The resultant wafer was exposed through a 6% half-tone mask of 1:1 line and space pattern of 75 nm line width by means of an ArF excimer laser liquid-immersion scanner (manufactured by ASML, XT1250i, NA 0.85). Ultrapure water was used as an immersion liquid. Thereafter, the exposed wafer was baked on a hot plate at 110° C. for 60 seconds.

The baked wafer was developed with a 2.38 mass % aqueous tetramethylammonium hydroxide solution at 23° C. for 60 seconds, rinsed with pure water for 40 seconds and dried, thereby obtaining a resist pattern.

On the thus obtained sample wafer, the number of development defects was measured by means of an apparatus KLA-2360 (manufactured by KLA-Tencor Corporation).

The detected development defect sites were observed by means of a critical dimension SEM model S9380 manufactured by Hitachi, Ltd., and the number of bubble defects per area (1 cm$^2$) was determined.

The evaluation marks "double circle," ○, Δ and x were given when the number of bubble defects was 0/cm$^2$, greater than 0 to 0.01/cm$^2$, greater than 0.01 to 0.1/cm$^2$ and greater than 0.1/cm$^2$, respectively.

[Receding Contact Angle]

Each of the prepared positive resist compositions was applied onto a silicon wafer of 8 inch caliber, and baked at 120° C. for 60 seconds, thereby forming a 160 nm-thick resist film. The receding contact angle of each of the films with a water droplet was measured in accordance with a dilation/contraction method by means of a dynamic contact angle meter (manufactured by Kyowa Interface Science Co., Ltd.) at room temperature 23±3° C. in 45±5% humidity. The receding contact angle was defined as the value of dynamic contact angle at which, in the five-seconds suction of a droplet of 35 μL initial size at a rate of 6 μL/second, the dynamic contact angle during suction was stabilized. The greater the value of the receding contact angle, the greater the scan speed at which water tracking is ensured.

TABLE 1

| | Resist composition | | | | | | Evaluation result | | | |
|---|---|---|---|---|---|---|---|---|---|---|
| | Resin (B) (2 g) | Photoacid generator (mg) | Solvent (mass ratio) | Basic comp. (mg) | Resin (C) + (CP) (mg) | Surfactant (mg) | Scum | Development defect | Receding contact angle (deg) | Bubble defect |
| Ex. 1 | RA-1 | PAG1 (100) | SL-2/SL-4 60/40 | N-1 (10) | C-1 (80) | W-3 (2) | ◎ | ○ | 80 | ◎ |
| Ex. 2 | RA-2 | PAG2 (100) | SL-2/SL-5 50/50 | N-3 (11) | C-2 (100) | W-2 (2) | ◎ | ○ | 81 | ◎ |
| Ex. 3 | RA-3 | PAG3 (100) | SL-2/SL-4/SL-5 60/30/10 | N-9 (10) | C-3 (80) | W-6 (2) | ○ | ○ | 81 | ◎ |
| Ex. 4 | RA-4 | PAG4 (100) | SL-1/SL-3 50/50 | N-4 (7) | C-4 (80) | W-4 (2) | ◎ | ○ | 80 | ◎ |
| Ex. 5 | RA-5 | PAG5 (100) | SL-2/SL-6 60/40 | N-5 (6)/ N-1 (7) | C-5 (80) | W-5 (2) | ◎ | ○ | 78 | ◎ |
| Ex. 6 | RA-6 | PAG6 (100) | SL-2/SL-5 60/40 | N-6 (8) | C-6 (90) | W-6 (2)/ W-2 (1) | ◎ | ○ | 80 | ◎ |
| Ex. 7 | RA-7 | PAG7 (100) | SL-1/SL-2/SL-5 30/50/20 | N-5 (10) | C-7 (80) | W-1 (2) | ◎ | ○ | 81 | ◎ |
| Ex. 8 | RA-8 | PAG8 (100) | SL-1/SL-2/SL-6 10/50/40 | N-8 (12) | C-8 (70) | W-2 (2) | ◎ | ○ | 78 | ◎ |
| Ex. 9 | RA-9 | PAG9 (100) | SL-2/SL-4/SL-5 30/60/10 | N-9 (9) | C-9 (80) | — | ◎ | ○ | 80 | ◎ |
| Ex. 10 | RA-10 | PAG1 (30)/ PAG2 (70) | SL-2/SL-4/SL-6 40/40/20 | N-4 (12) | C-10 (80) | W-4 (2) | ◎ | ○ | 79 | ◎ |
| Ex. 11 | RA-1 (1 g)/ RA-3 (1 g) | PAG2 (100) | SL-2/SL-5 50/50 | N-5 (8) | C-11 (60) | W-5 (2) | ◎ | ○ | 79 | ◎ |
| Ex. 12 | RA-7 | PAG3 (100) | SL-1/SL-2/SL-6 20/70/10 | N-2 (6) | C-3 (40)/ C-5 (40) | W-2 (2) | ◎ | ○ | 80 | ◎ |
| Ex. 13 | RA-3 | PAG4 (100) | SL-2/SL-4/SL-5 60/30/10 | N-7 (5) | C-4 (40)/ C-12 (50) | W-6 (2) | ◎ | ○ | 80 | ◎ |
| Comp. Ex. 1 | RA-9 | PAG5 (100) | SL-1/SL-3 50/50 | N-8 (10) | C-13 (80) | W-2 (2) | ○ | ○ | 79 | Δ |
| Comp. Ex. 2 | RA-1 | PAG1 (100) | SL-2/SL-4 60/40 | N-1 (10) | C-14 (80) | W-3 (2) | Δ | ○ | 70 | Δ |
| Comp. Ex. 3 | RA-2 | PAG2 (100) | SL-2/SL-5 50/50 | N-3 (11) | C-15 (100) | W-2 (2) | Δ | ○ | 72 | Δ |

The abbreviations appearing in the Table are as defined below.
[Photoacid Generator]
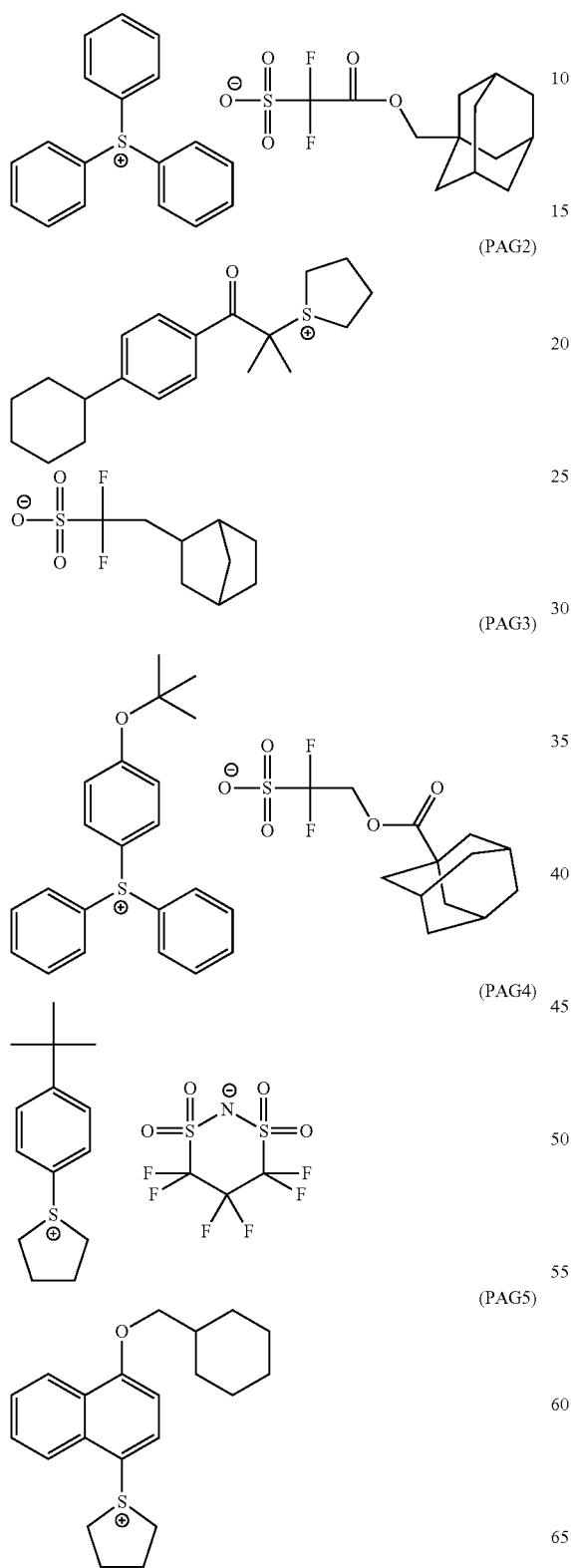
(PAG1)
(PAG2)
(PAG3)
(PAG4)
(PAG5)
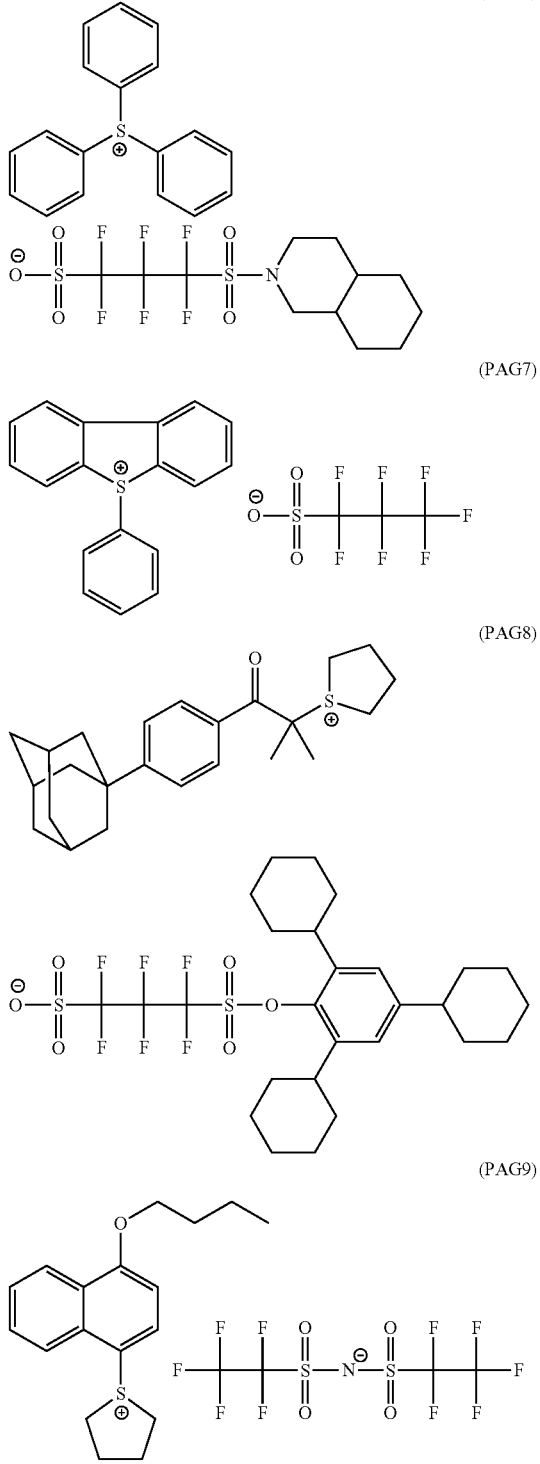
(PAG6)
(PAG7)
(PAG8)
(PAG9)
[Basic Compound]
N-1: N,N-dibutylaniline,
N-2: N,N-dihexylaniline, N-3: 2,6-diisopropylaniline,
N-4: tri-n-octylamine,
N-5: N,N-dihydroxyethylaniline,
N-6: 2,4,5-triphenylimidazole,
N-7: 2-[2-{2-(2,2-dimethoxy-phenoxyethoxy)ethyl}-bis(2-methoxyethyl)]-amine,
N-8: 2,4,6-tri-t-butylaniline, and
N-9: N-t-amyloxycarbonyl-4-hydroxypiperidine.

[Surfactant]

W-1: Megafac F176 (produced by Dainippon Ink & Chemicals, Inc., fluorinated),
W-2: Megafac R08 (produced by Dainippon Ink & Chemicals, Inc., fluorinated and siliconized),
W-3: polysiloxane polymer KP-341 (produced by Shin-Etsu Chemical Co., Ltd., siliconized),
W-4: Troy Sol S-366 (produced by Troy Chemical Co., Ltd.),
W-5: PF656 (produced by OMNOVA SOLUTIONS, INC., fluorinated), and
W-6: PF6320 (produced by OMNOVA SOLUTIONS, INC., fluorinated).

[Solvent]

SL-1: cyclohexanone,
SL-2: propylene glycol monomethyl ether acetate (PGMEA),
SL-3: ethyl lactate,
SL-4: propylene glycol monomethyl ether (PGME),
SL-5: γ-butyrolactone, and
SL-6: propylene carbonate.

It has been proved that the resist patterns formed from the positive resist compositions of the present invention not only suppress the occurrence of scum, development defect and bubble defect but also exhibit excellent performance with respect to the immersion liquid tracking property at liquid-immersion exposure.

The composition according to the present invention can find appropriate application as a lithography process in the manufacturing of a variety of electronic devices including semiconductor elements, recording media and the like.

The invention claimed is:

1. An actinic-ray- or radiation-sensitive resin composition containing (A) a compound that when exposed to actinic rays or radiation, generates an acid, (B) a resin that when acted on by an acid, increases its rate of dissolution in an alkali developer, and (C) a hydrophobic resin, characterized in that the hydrophobic resin (C) contains a repeating unit derived from any of monomers of general formula (1) below, and the hydrophobic resin (C) is contained in the composition in an amount of 0.01 to 20 mass % based on the total solids of the composition, $$A-R_3-B-N\left(\begin{array}{c}(R_2)_n\\ \mathrm{O}\\ \|\\ S-Rf-R_1\\ \|\\ \mathrm{O}\end{array}\right)_m \quad (1)$$

in which $R_1$ or the plurality of $R_1$s when m=2 independently represent a hydrogen atom, a fluorine atom or an organic functional group, $R_2$ or the plurality of $R_2$s when n=2 independently represent a hydrogen atom, an optionally fluorinated alkyl group, an optionally fluorinated cycloalkyl group or an optionally fluorinated aryl group, $R_3$ represents an oxygen atom or a single bond, Rf or the plurality of Rfs when m=2 independently represent an optionally fluorinated alkylene group, an optionally fluorinated cycloalkylene group or an optionally fluorinated arylene group, A represents, a group represented by the general formula below, in which R represents a hydrogen atom or a methyl group, B represents a single bond, an optionally fluorinated alkylene group, an optionally fluorinated cycloalkylene group or a sulfonyl group, provided that the alkylene group has carbon atoms optionally partially replaced by an oxygen atom, m is 1 or 2 when B is a single bond or an alkylene group, and is an integer of 0 to 2 when B is a sulfonyl group, and n is an integer of 0 to 2, satisfying the relationship n=2-m.

2. The composition according to claim 1, characterized in that the hydrophobic resin (C) further contains a repeating unit containing a group that when acted on by an alkali developer, is decomposed to thereby increase its solubility in the alkali developer.

3. The composition according to claim 1, characterized in that the hydrophobic resin (C) further contains any of repeating units of general formula (I) below, (I)

in which $R_1$ represents a hydrogen atom, an alkyl group or a halogen atom, $Ar^1$ represents an aromatic ring, $R_2$ or the plurality of $R_2$s when x≥2 independently, represent a substituent, Z represents a single bond or a bivalent connecting group, x is an integer of 0 or greater, and y is an integer of 1 or greater.

4. An actinic-ray- or radiation-sensitive film formed from the composition according to claim 1.

5. A method of forming a pattern, comprising forming the composition according to claim 1 into a film, exposing the film to light, and developing the exposed film.

6. The method according to claim 5, wherein the exposure is performed through an immersion liquid.

7. A process for manufacturing an electronic device, comprising the pattern forming method according to claim 5.

8. The composition according to claim 1, characterized in that the hydrophobic resin (C) further contains any of repeating units of general formula (I-A) below,

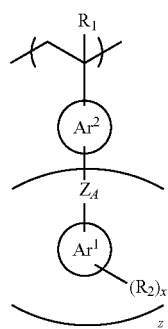

(I-A)

in which $R_1$ represents a hydrogen atom, an alkyl group or a halogen atom, $Ar^1$ represents an aromatic ring, $R_2$ or the plurality of $R_2$s when x≥2 independently represent a substituent, x is an integer of 0 or greater, $Ar^2$ represents an aromatic ring, $Z_A$ represents a single bond or a connecting group, and z is an integer of 1 or greater.

9. The composition according to claim 1, characterized in that the resin (B) contains any of repeating units of general formula (AI) below,

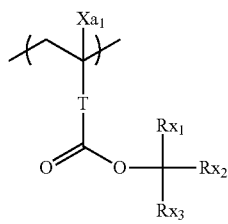

(A I)

in which $Xa_1$ represents a hydrogen atom, an optionally substituted methyl group, or a group represented by —$CH_2$—$R_9$, wherein $R_9$ represents a hydroxyl group or a monovalent organic group, T represents a single bond or a bivalent connecting group, and each of $Rx_1$, $Rx_2$ and $Rx_3$ independently represents a linear or branched alkyl group or a monocyclic or polycyclic cycloalkyl group, wherein at least two of $Rx_1$, $Rx_2$ and $Rx_3$ may be bonded to each other to thereby form a monocyclic or polycyclic cycloalkyl group.

10. The composition according to claim 9, characterized in that the resin (B) contains, as the repeating units of general formula (AI), any of the repeating units of general formula (I) below,

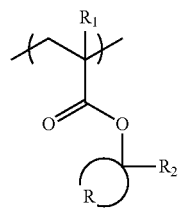

(I)

in which $R_1$ represents a hydrogen atom, an optionally substituted methyl group or a group represented by —$CH_2$—$R_9$, wherein $R_9$ represents a monovalent organic group, $R_2$ represents an alkyl group or a cycloalkyl group, and R represents an atomic group required for forming an alicyclic structure in cooperation with a carbon atom.

11. The composition according to claim 1, characterized in that the resin (B) contains any of repeating units having a lactone structure represented by general formula (III) below,

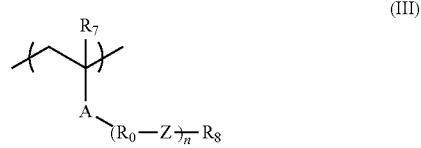

(III)

in which

A represents an ester bond (a group represented by —COO—) or an amido bond (a group represented by —CONH—), $R_0$, each independently in the presence of two or more groups, represents an alkylene group, a cycloalkylene group or a combination thereof, Z, each independently in the presence of two or more groups, represents an ether bond, an ester bond, an amido bond, a urethane bond (a group represented by

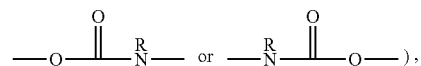

or a urea bond (a group represented by

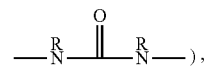

wherein each of Rs independently represents a hydrogen atom, an alkyl group, cycloalkyl group or an aryl group, $R_8$ represents a monovalent organic group having a lactone structure, n represents a number of repetitions of a structure represented by —$R_0$—Z—, and is an integer of 1 to 5, and $R_7$ represents a hydrogen atom, a halogen atom or an alkyl group.

12. The composition according to claim 1, characterized in that the compound (A) is represented by one of general formula (ZI) and (ZII) below,

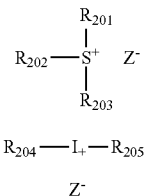
ZI $$R_{204}—L_+—R_{205}$$
$$Z^-$$
ZII in general formula (ZI), each of $R_{201}$, $R_{202}$ and $R_{203}$ independently represents an organic group, and $Z^-$ represents a nonnucleophilic anion represented by general formula (LD1) below, and in general formula (ZII), each of $R_{204}$ and $R_{205}$ independently represents an aryl group, an alkyl group or a cycloalkyl group, and $Z^-$ represents a nonnucleophilic anion represented by the general formula (LD1),

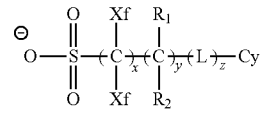
(LD1)

in which each of Xfs independently represents a fluorine atom or an alkyl group substituted with at least one fluorine atom, each of $R_1$ and $R_2$ independently represents a group selected from the group consisting of a hydrogen atom, a fluorine atom, an alkyl group and an alkyl group substituted with at least one fluorine atom, L represents a single bond or a bivalent connecting group, Cy represents a group having a cyclic structure, x is an integer of 1 to 20, y is an integer of 0 to 10, and z is an integer of 0 to 10.

13. The composition according to claim 1, characterized in that the hydrophobic resin (C) is contained in the composition in an amount of 0.01 to 10 mass % based on total solids of the composition.

* * * * *